(12) United States Patent
Kim et al.

(10) Patent No.: US 8,374,052 B2
(45) Date of Patent: Feb. 12, 2013

(54) INFORMATION STORAGE DEVICES USING MAGNETIC DOMAIN WALL MOVEMENT AND METHODS OF OPERATING THE SAME

(75) Inventors: Ho Jung Kim, Suwon-si (KR); Sang Beom Kang, Hwaseong-si (KR); Chul Woo Park, Yongin-si (KR); Hyun Ho Choi, Suwon-si (KR); Jong Wan Kim, Seongnam-si (KR); Young Pill Kim, Hwaseong-si (KR); Sung Chul Lee, Youngin-si (KR)

(73) Assignee: Samsung Electronics Co., Ltd. (KR)

( * ) Notice: Subject to any disclaimer, the term of this patent is extended or adjusted under 35 U.S.C. 154(b) by 350 days.

(21) Appl. No.: 12/775,160

(22) Filed: May 6, 2010

(65) Prior Publication Data

US 2010/0284216 A1    Nov. 11, 2010

(30) Foreign Application Priority Data

| May 8, 2009 | (KR) | 10-2009-0040292 |
| May 8, 2009 | (KR) | 10-2009-0040294 |
| Jun. 4, 2009 | (KR) | 10-2009-0049474 |

(51) Int. Cl.
G11C 8/00 (2006.01)
G11C 11/14 (2006.01)

(52) U.S. Cl. .......... 365/232; 365/171; 365/158
(58) Field of Classification Search .......... 365/158, 365/171
See application file for complete search history.

(56) References Cited

U.S. PATENT DOCUMENTS

| 6,191,989 | B1* | 2/2001 | Luk et al. .......... 365/207 |
| 6,920,062 | B2 | 7/2005 | Parkin |
| 7,843,719 | B2* | 11/2010 | Hung et al. .......... 365/158 |
| 2004/0252539 | A1* | 12/2004 | Parkin .......... 365/80 |
| 2008/0068881 | A1* | 3/2008 | Lim et al. .......... 365/173 |
| 2008/0235443 | A1* | 9/2008 | Chow et al. .......... 711/103 |
| 2009/0207718 | A1* | 8/2009 | Joe et al. .......... 369/126 |
| 2010/0080034 | A1* | 4/2010 | Hung .......... 365/80 |
| 2010/0232220 | A1* | 9/2010 | Meade et al. .......... 365/171 |

FOREIGN PATENT DOCUMENTS

| KR | 1020050087808 A | 8/2005 |
| KR | 100813270 B1 | 3/2008 |
| KR | 1020080063653 A | 7/2008 |

* cited by examiner

*Primary Examiner* — Huan Hoang
*Assistant Examiner* — Jay Radke
(74) *Attorney, Agent, or Firm* — Myers Bigel Sibley & Sajovec P.A.

(57) ABSTRACT

An information storage device includes a first portion comprising at first at least one magnetic track, each of the at least one magnetic track in the first portion including a first plurality of magnetic domains and being configured to store a first type of data therein and a second portion comprising a second at least one magnetic track, each of the at least one magnetic track in the second portion including a second plurality of magnetic domains and being configured to store a second type of data therein, the second type of data being related to the first type of data.

26 Claims, 36 Drawing Sheets

INFORMATION STORAGE DEVICES USING MAGNETIC DOMAIN WALL MOVEMENT AND METHODS OF OPERATING THE SAME

CROSS-REFERENCE TO RELATED APPLICATIONS

This application claims the benefit of Korean Patent Application No. 10-2009-0040292, filed on May 8, 2009, Korean Patent Application No. 10-2009-0040294, filed on May 8, 2009, and Korean Patent Application No. 10-2009-0049474, filed on Jun. 4, 2009, in the Korean Intellectual Property Office, the disclosures of which are incorporated herein in their entirety by reference.

BACKGROUND

The present inventive subject matter relates to information storage devices and methods of operating the same, and, more particularly, to information storage devices using magnetic domain wall movement and methods of operating the same.

In general, examples of conventional nonvolatile information storage devices in which recorded information is retained even when power is cut off include hard disk drives (HDDs) and nonvolatile random access memories (NVRAMs).

An HDD is an information storage device having a rotating part that may wear down over time. If the rotating part of an HDD wears down, an operational failure is likely to occur, thereby lowering the reliability of the HDD. A representative example of a non-volatile RAM is flash memory, which has come into widespread use. However, flash memory generally has relatively slow reading and writing speeds, a relatively short life span, and relatively small storage capacity when compared to an HDD. Flash memories may also have relatively high manufacturing costs.

To solve the problems of such conventional non-volatile information storage devices, new information storage devices that use the principle of magnetic domain wall movement of a magnetic material (hereinafter referred to as "magnetic track memory") have been developed. In these magnetic information storage devices, a minute magnetic region formed of a ferromagnetic substance is referred to as a magnetic domain and a boundary portion between magnetic domains having different magnetization directions is referred to as a magnetic domain wall. The magnetic domains and the magnetic domain walls may be moved by applying current to a magnetic layer.

An information storage device using magnetic domain wall movement detects a desired location by moving a domain of a magnetic track and writes data to or reads data from the detected location. For example, in an information storage device that uses a U-shaped magnetic track, a plurality of magnetic domains are consecutively arranged within the U-shaped magnetic track and magnetic domain walls are respectively disposed between adjacent magnetic domains. Writing or reading is performed using a write unit or a read unit while moving the magnetic domains and the magnetic domain walls.

However, in the case of such an information storage device using a U-shaped magnetic track, only half the U-shaped magnetic track is used as an effective storage region, and thus, it may be difficult to store a large amount of information therein. Also, it may take a lot of time to perform addressing on such an information storage device, because location information is received from the outside, the location information is decoded, and a domain of a magnetic track is moved according to the decoded location information. Also, it may be difficult to secure a sufficient sensing margin for reading data. That is, to obtain a high-quality memory device, the memory device is typically required to be capable of storing a large amount of data in a small region thereof and writing/reading speeds of the memory device may be required to be as high as those of dynamic random access memory (DRAM). However, conventional information storage devices using magnetic tracks typically do not satisfy all the above requirements.

SUMMARY

According to some embodiments of the present inventive subject matter, an information storage device includes a first portion comprising at first at least one magnetic track, each of the at least one magnetic track in the first portion including a first plurality of magnetic domains and being configured to store a first type of data therein and a second portion comprising a second at least one magnetic track, each of the at least one magnetic track in the second portion including a second plurality of magnetic domains and being configured to store a second type of data therein, the second type of data being related to the first type of data.

In other embodiments, the second type of data comprises address information associated with the first type of data.

In still other embodiments, the second type of data is complementary to the first type of data.

In still other embodiments, each of the first at least one magnetic track in the first portion comprises a first at least one write/read unit coupled thereto and each of the second at least one magnetic track in the second portion comprises a second at least one write/read unit coupled thereto, the information storage device further comprising a write/read controller that is operable to read data from the first and second pluralities of magnetic domains and to write data to the first and second pluralities of magnetic domains via the first at least one write/read unit coupled to the first portion and the first at least one write/read unit coupled to the second portion.

In still other embodiments, the information storage device further comprises a domain controller that is operable to move respective ones of the first plurality of magnetic domains and respective ones of the second plurality of magnetic domains.

In still other embodiments, the first at least one write/read unit coupled to the first portion is coupled to the write/read controller via at first at least one control transistor, respectively. The second at least one write/read unit coupled to the second portion is coupled to the write/read controller via a second at least one control transistor, respectively. The first at least one magnetic track is coupled to the domain controller via a first at least one selection transistor, respectively. The second at least one magnetic track is coupled to the domain controller via a second at least one selection transistor, respectively.

In still other embodiments, the write/read controller is operable to write and/or read data to and/or from ones of the first plurality of magnetic domains coupled to the first at least one magnetic track, respectively, responsive to determining that an address matches address data stored in ones of the second plurality of magnetic domains coupled to the second at least one magnetic track, respectively. The ones of the first plurality of magnetic domains and the ones of the second plurality of magnetic domains being associated with each other as a sector.

In still other embodiments, the information storage device further comprises a third portion comprising a third at least one magnetic track, each of the at least one magnetic track in the third portion comprising a third plurality of magnetic domains and being configured to store a third type of data therein, the third type of data corresponding to the first type of data such that at least one of the third plurality of magnetic domains is operable to substitute for at least one of the first plurality of magnetic domains responsive to a determination that the at least one of the first plurality of magnetic domains is defective.

In still other embodiments, the first and second types of data comprise at least one type of sink pattern. The information storage device further comprises a location detection unit that is operable to detect the at least one type of sink pattern.

In still other embodiments, the information storage device comprises a plurality of memory blocks and wherein the at least one magnetic track in the first portion and the at least one magnetic track in the second portion are associated with each other in one of the plurality of memory blocks, the information storage device further comprising a block selection controller that is operable to select the one of the plurality of memory blocks from the plurality of memory blocks.

In still other embodiments, the information storage device is embodied in a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, or a Universal Serial Bus (USB) flash drive device.

In further embodiments, an information storage device includes a memory unit comprising at least one pair of magnetic tracks, each of the magnetic tracks in the at least one pair of magnetic tracks comprising a plurality of magnetic domains and at least one write/read unit coupled to the at least one pair of magnetic tracks and configured to write data to and read data from the at least one pair of magnetic tracks, respectively.

In still further embodiments, the information storage device further comprises decoding circuitry coupled to the memory unit that is operable to select at least one magnetic domain pair associated with the at least one pair of magnetic tracks, respectively; a write/read controller that is operable to read data from the plurality of magnetic domains via the at least one write/read unit; and a domain controller that is coupled to the memory unit and is operable to move the plurality of magnetic domains on each of the magnetic tracks.

In still further embodiments, each of the at least one pair of magnetic tracks is coupled to the decoding circuitry via a pair of control transistors.

In still further embodiments, the pair of control transistors is coupled to each other at a reference node. The information storage device further comprises a switch controller that is operable to drive the reference node to a reference voltage level based on which of a write and a read operation is being performed.

In still further embodiments, each of the at least one pair of magnetic tracks are coupled to each other at a reference node. The information storage device further comprises a switch controller that is operable to drive the reference node to a reference voltage level based on which of a write and a read operation is being performed.

In still further embodiments, each of the at least one pair of magnetic tracks are coupled to the domain controller via a first pair of selection transistors disposed at a first end of the at least one pair of magnetic tracks and a second pair of selection transistors disposed at a second end of the at least one pair of magnetic tracks.

In still further embodiments, each of the at least one pair of magnetic tracks are coupled to the domain controller via a first selection transistor disposed at a first end of the at least one pair of magnetic tracks and a second selection transistor disposed at a second end of the at least one pair of magnetic tracks.

In other embodiments, an information storage device includes a memory unit including at least one magnetic track, each of the at least one magnetic track including a plurality of magnetic domains and n write/read units coupled thereto; decoding circuitry coupled to the memory unit that is operable to select at least one of the plurality of magnetic domains; a write/read controller coupled to the memory unit that is operable to read data from the plurality of magnetic domains and write data to the magnetic domains via the at least one write/read unit coupled thereto coupled to the at least one magnetic track, respectively; wherein each of the n write/read units is operable to perform a write and/or read operation on one of a subset m magnetic domains of the plurality of magnetic domains responsive to first and second address information; wherein the first address information comprises write/read unit identification information and the second address information comprises magnetic domain identification information; and wherein n and m are integers greater than one.

In still other embodiments, a first portion of the m magnetic domains store a first type of data therein and a second portion of the m magnetic domains store a second type of data therein.

In still other embodiments, the first portion of the m magnetic domains are closer to one of the n write/read units that is operable to write data to and read data from the m magnetic domains than the second portion of the m magnetic domains.

In still other embodiments, the first type of data comprises high processing speed data relative to the second type of data.

In still other embodiments, each of the n write/read units is coupled to the decoding circuitry via a single control transistor.

In still other embodiments, each of the n write/read units is coupled to the decoding circuitry via a pair of control transistors.

In further embodiments, an integrated circuit memory device including a memory unit comprising a magnetic track, the magnetic track comprising a plurality of magnetic domains and a plurality of write/read units coupled thereto is operated by selecting one of the plurality of write/read units responsive to first address information; selecting one of the plurality of magnetic domains responsive to second address information; moving the selected one of the plurality of magnetic domains so that it is accessible via the selected one of the plurality of write/read units; and performing one of a write and a read operation on the selected one of the magnetic domains using the selected one of the plurality of write/read units; determining whether a subsequent write and/or read operation is to one of the plurality of magnetic domains associated with a same page as the selected one of the plurality of magnetic domains; and moving a reference one of the plurality of magnetic domains so that it is accessible via the selected one of the plurality of write/read units when the subsequent write and/or read operation is not to one of the plurality of magnetic domains associated with the same page as the selected one of the plurality of magnetic domains.

In still further embodiments, determining whether the subsequent write and/or read operation is to one of the plurality of magnetic domains associated with the same page comprises determining that the subsequent write and/or read option is to another one of the plurality of magnetic domains associated with the same page as the selected one of the plurality of magnetic domains responsive to third address information and moving the another one of the plurality of magnetic domains so that it is accessible via the selected one of the plurality of write/read units.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
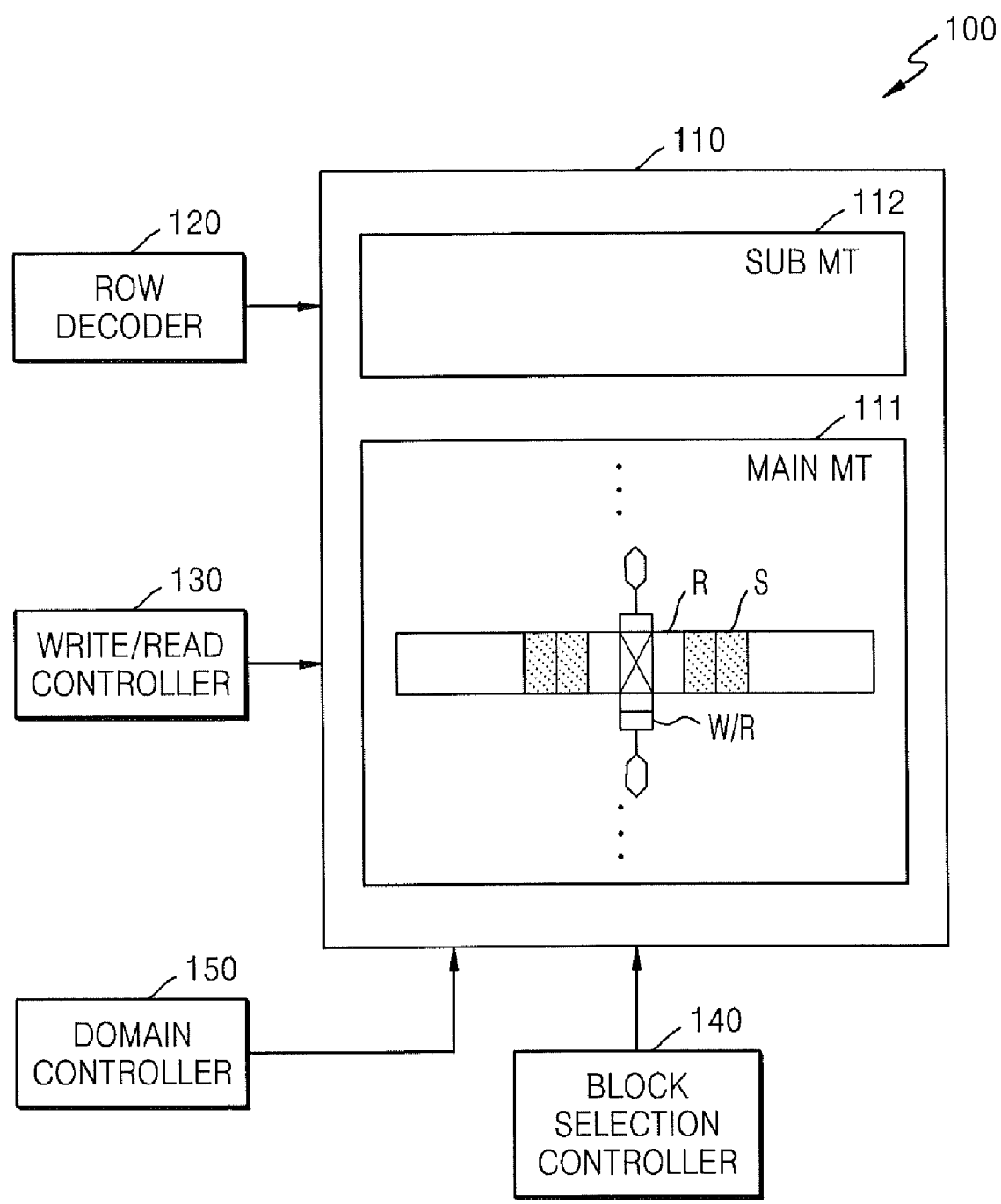
FIG. 1 is a block diagram of an information storage device using magnetic domain wall movement, according to some embodiment of the present inventive subject matter.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

For purposes of illustration, various embodiments of the present invention are described herein with reference to a memory system and/or data storage device comprising a magnetic track memory. The memory system and/or data storage device may comprise a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, and/or a Universal Serial Bus (USB) device.

Hereinafter, exemplary embodiments of the present inventive subject matter will be described in detail with reference to the accompanying drawings.

FIG. 1 is a block diagram of an information storage device 100 using magnetic domain wall movement, according to some embodiments of the present inventive concept. Referring to FIG. 1, the information storage device 100 according to the present inventive concept comprises a memory unit 110 having a plurality of magnetic tracks, a plurality of write/read units W/R disposed to respectively correspond to the magnetic tracks to write data to, or read data from magnetic domains of the magnetic tracks, and a write/read controller 130 that drives the write/read units W/R to control write/read operations performed on the magnetic domains. Although not shown, the memory unit 110 may include a plurality of memory blocks. The information storage device 100 may further comprise a row decoder 120 that receives and decodes a predetermined address to select either one of the magnetic tracks or one of the write/read units W/R, a block selection controller 140 that selects at least one memory block from the memory blocks of the memory unit 110, and a domain controller 150 that controls movement of magnetic domains of the magnetic tracks. The memory unit 110 may include a main magnetic track unit 111 that has magnetic tracks for storing main data, and a sub magnetic track unit 112 that has at least one magnetic track for storing information related to the main data. The type of the information related to the main data is not limited. For example, the information related to the main data may be either the address of the main data stored in the magnetic tracks or data complementary to the main data. Different types of data may be respectively stored in the magnetic tracks of the main magnetic track unit 111. For example, the magnetic tracks of the main magnetic track unit 111 may include a region R in which first type data is stored and a region S in which second type data is stored.

The write/read unit W/R that is disposed to write data to or read data from a magnetic domain of a magnetic track, may be a device that magnetizes the magnetic domain along a predetermined direction or measures electrical resistance of the magnetic domain magnetized in the predetermined direction.

Figure 2A:
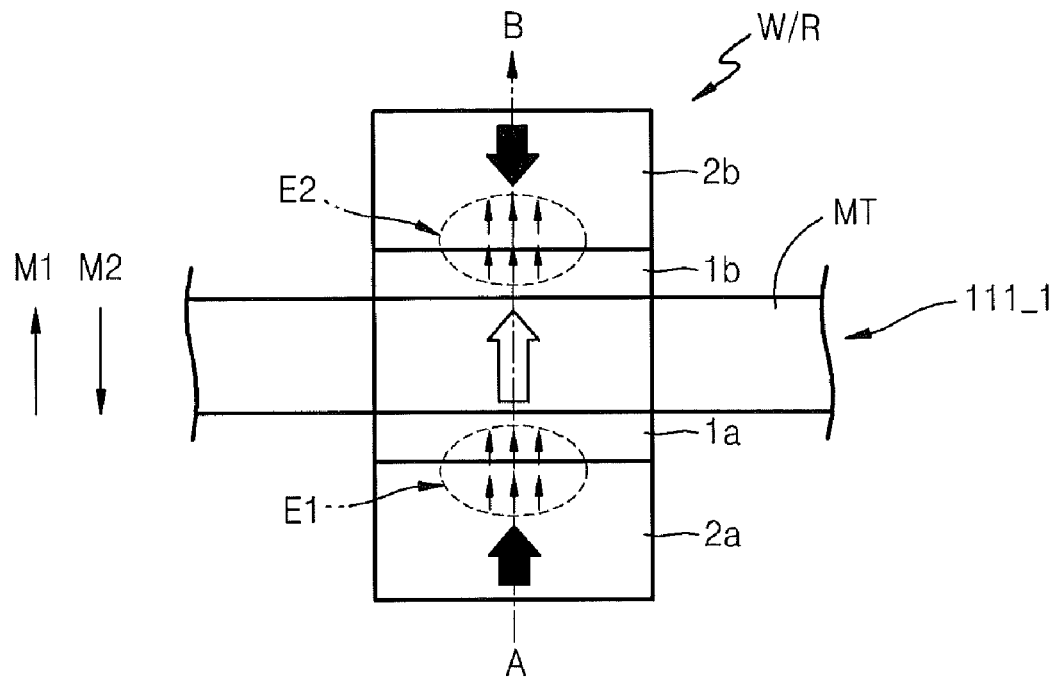
FIGS. 2A and 2B are diagrams illustrating a write/read unit included in the information storage device of FIG. 1, according to some embodiments of the present inventive subject matter.
Figure 2B:
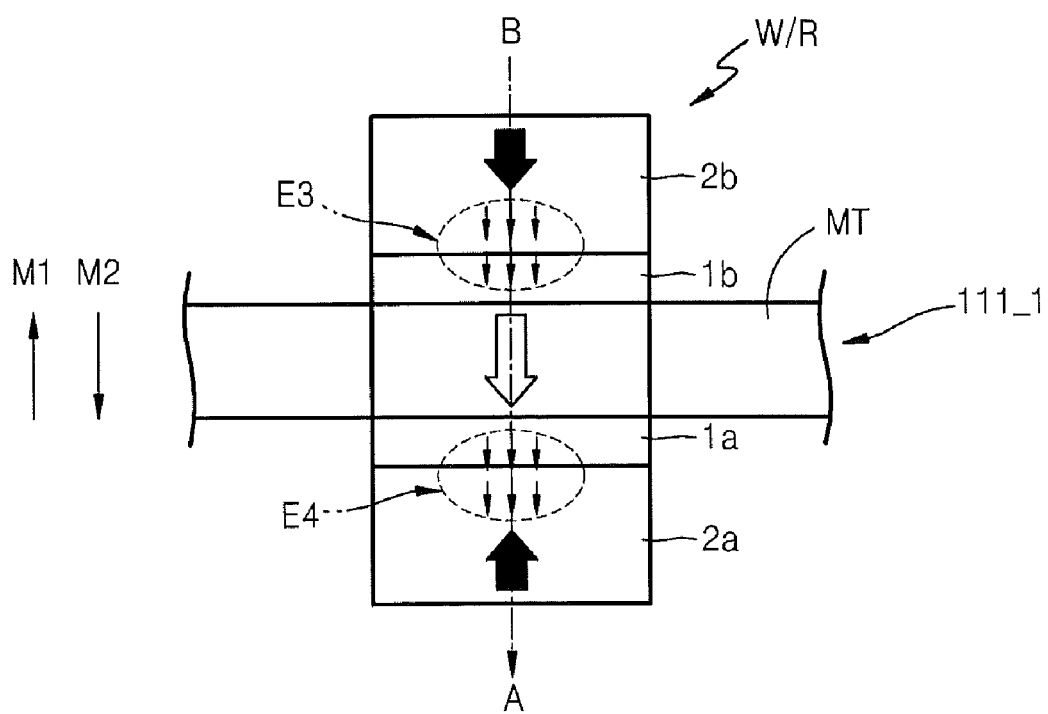

FIGS. 2A and 2B are diagrams illustrating the write/read unit W/R of FIG. 1, according to some embodiments of the present inventive subject matter. Referring to FIGS. 2A and 2B, the write/read unit W/R according to some embodiments may include a first ferromagnetic layer 2a located at a bottom surface of a magnetic track MT and a second ferromagnetic layer 2b located at a top surface of the magnetic track MT. The first ferromagnetic layer 2a and the second ferromagnetic layer 2b are pinned layers, the directions of magnetization of which are opposite to each other. Referring to FIGS. 2A and 2B, arrows in the first ferromagnetic layer 2a denote the direction of magnetization of the first ferromagnetic layer 2a, and arrows in the second ferromagnetic layer 2b denote the direction of magnetization of the second ferromagnetic layer 2b. Also, the first ferromagnetic layer 2a and the second ferromagnetic layer 2b may be isolated from a first magnetic track 111_1 by a first insulating layer 1a and a second insulating layer 1b, respectively.

A write operation using the write/read unit W/R will now be described.

FIG. 2A illustrates a case where electrons move from the first ferromagnetic layer 2a to the second ferromagnetic layer 2b (along a direction from A to B). In this case, electrons E1 magnetized along a direction M1 that is the same as the direction of magnetization of the first ferromagnetic layer 2a (hereinafter referred to as a "first direction"), move to the magnetic track MT. The moved electrons E1 magnetize the magnetic track MT along the first direction M1. This phenomenon may be referred to as the spin transfer torque effect.

In the second ferromagnetic layer 2b, electrons magnetized along a direction M2 that is the same as the direction of magnetization of the second ferromagnetic layer 2b (hereinafter referred to as a "second direction"), are discharged into the second ferromagnetic layer 2b but electrons E2 magnetized along a direction opposite to the direction of magnetization of the second ferromagnetic layer 2b are not discharged into the second ferromagnetic layer 2b and return to the magnetic track MT. The electrons E2 magnetize the magnetic track MT along the first direction M1. This phenomenon may be referred to as the spin accumulation effect.

FIG. 2B illustrates a case where electrons move from the second ferromagnetic layer 2b to the first ferromagnetic layer 2a (along a direction from B to A). In this case, electrons E3 magnetized along the second direction M2 move to the magnetic track MT. The electrons E3 magnetize the magnetic track MT along the second direction M2. In the first ferromagnetic layer 2a, electrons magnetized along the first direction M1 are discharged into the first ferromagnetic layer 2a but electrons E4 magnetized along the second direction M2 are not discharged into the first ferromagnetic layer 2a and return to the magnetic track MT. The electrons E4 magnetize the magnetic track MT along the second direction M2.

A read operation using the write/read unit W/R will now be described.

First, an electrical resistance between the first ferromagnetic layer 2a or the second ferromagnetic layer 2b of the write/read unit W/R and the magnetic track MT is measured. The electrical resistance varies according to a direction of magnetization of the write/read unit W/R. Data stored in the magnetic track MT is read by measuring the electrical resistance, and the measurement of the electrical resistance is repeatedly performed while moving magnetic domains and magnetic domain walls in units of bits.

The current supplied to the write/read unit W/R during the reading of the data is less than the current used to perform a write operation. Thus, the data stored in the magnetic track MT may be retained during a read operation.

Figure 3A:
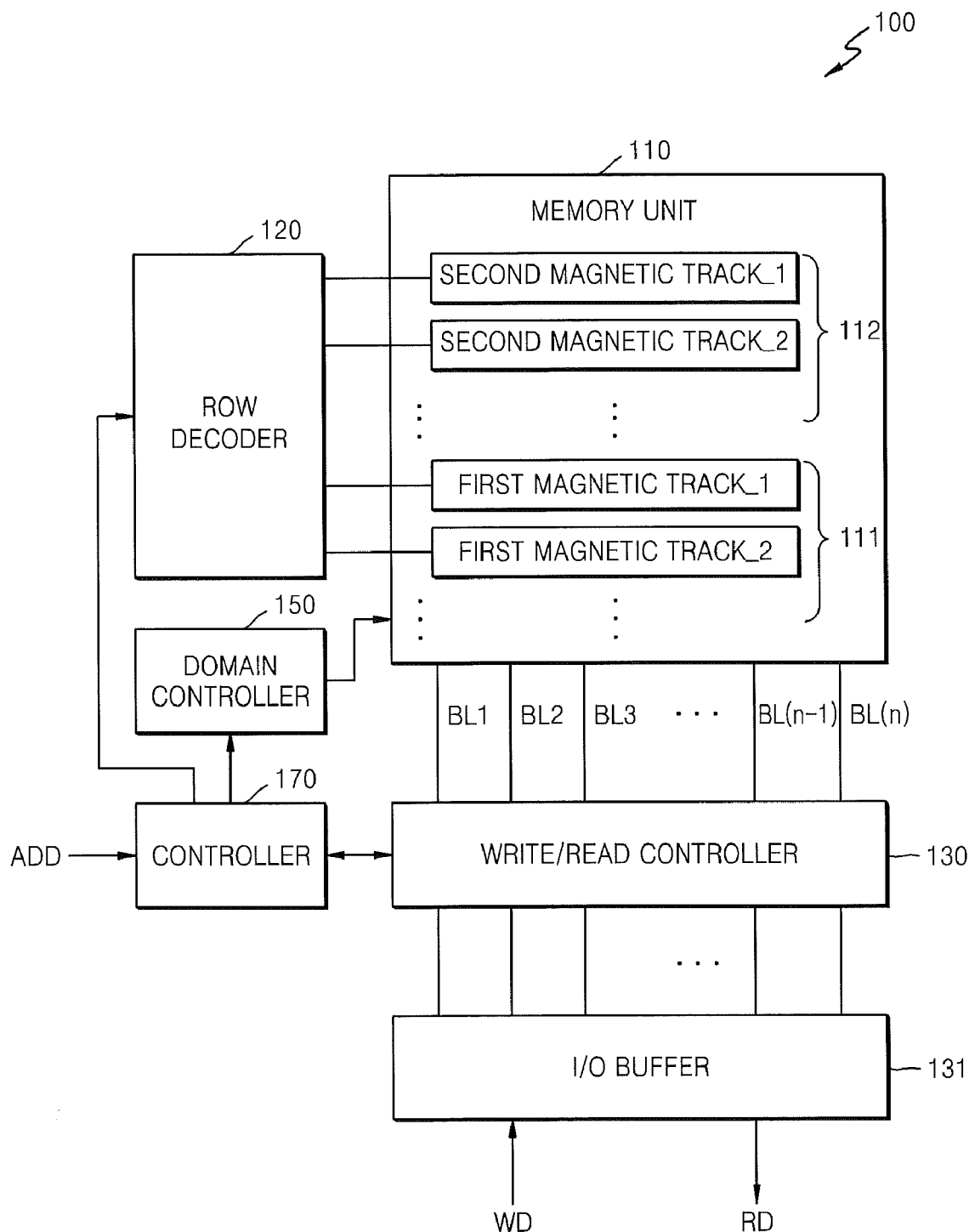
FIGS. 3A and 3B are block diagrams of an information storage device using magnetic domain wall movement, according to some embodiments of the present inventive subject matter.
Figure 3B:
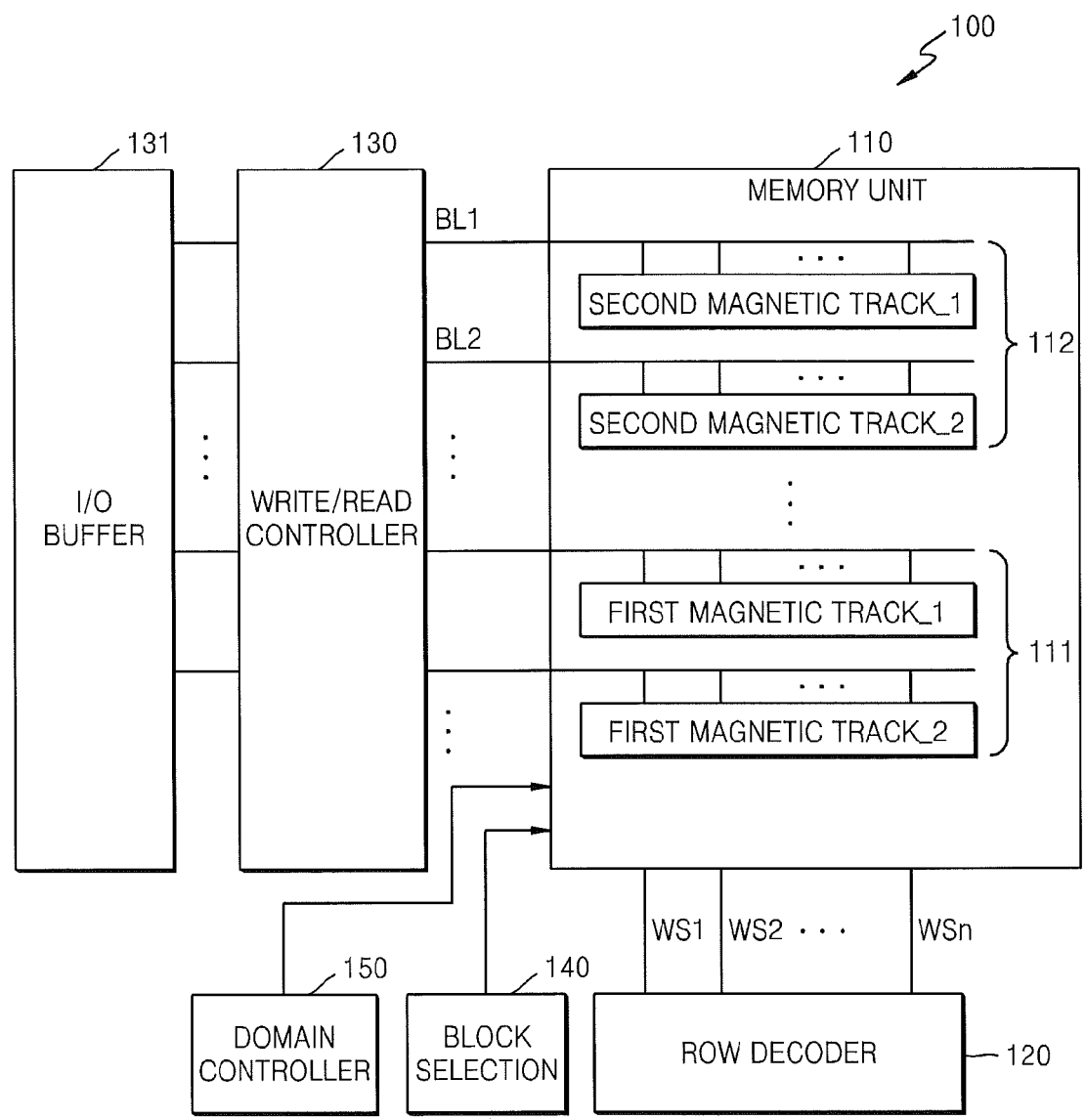

FIGS. 3A and 3B are block diagrams of an information storage device 100 using magnetic domain wall movement according to embodiments of the inventive concept. Specifically, FIG. 3A illustrates a case where a row decoder 120 performs a selection operation on magnetic tracks, and FIG. 3B illustrates a case where a row decoder 120 performs a selection operation on write/read units (not shown). In FIGS. 3A and 3B, elements denoted by the same reference numerals are the same in terms of constructions and operations thereof and will thus be described only once by referring to FIG. 3A or 3B.

Referring to FIG. 3A, the information storage device 100, according to some embodiments of the present inventive concept, may include a memory unit 110 that may have a plurality of magnetic tracks, the row decoder 120 that supplies word line signals in order to select one or more the magnetic tracks, and a write/read controller 130 that controls data to be written to or read from the magnetic tracks 111, 112. The information storage device 100 may further include an input/output (I/O) buffer 131 that temporarily stores write data and/or read data, a domain controller 150 that controls movement of magnetic domains and magnetic domain walls included in the magnetic tracks, and a controller 170 that controls various peripheral circuits (not shown) of the information storage device 100.

Although FIG. 3A illustrates one memory unit 110 for convenience of explanation, the information storage device 100 may include a plurality of memory units 110.

Each of the magnetic tracks included in the memory unit 110 comprises a plurality of magnetic domains for storing data. Magnetic domain walls may be disposed between adjacent magnetic domains. The magnetic tracks may be formed of a ferromagnetic material or a hard magnetic material. A magnetic track may be disposed to be parallel with a substrate (not shown) and may have perpendicularly magnetic anisotropic characteristics. For example, the magnetic tracks may be multi-level tracks in which a first layer comprises at least one material selected from the group of materials consisting of Co and a Co alloy and a second layer comprising at least one material selected from the group of materials consisting of Pt, Ni, and Pd are alternately formed. In other embodiments, the magnetic tracks may comprise FePt layers or CoPt layers having an L10 structure, or may be layers formed of an alloy of a rare-earth element and transition metal. The magnetic anisotropic energy density K of the magnetic tracks may be about $10^3 \leq K \leq 10^7$ J/m$^3$. The width of magnetic domain walls disposed within a track formed of a hard magnetic material (hereinafter referred to as a "hard magnetic track") may be about several to several tens of nanometers (nm). A current density of $10^{11}$ A/m$^2$ or less required to move magnetic domain walls in a hard magnetic track is typically less than a current density of about $10^{12}$ A/m$^2$ required to move magnetic domain walls within a soft magnetic track. Also, information written to a hard magnetic track can typically withstand heat better than information written to a soft magnetic track.

The memory unit 110 may include a main magnetic track unit 111 including a plurality of first magnetic tracks for storing main data, and a sub magnetic track unit 112 including a plurality of second magnetic tracks for storing the address of the main data in the magnetic tracks.

Although not shown in the drawings, the memory unit 110 may include a plurality of selection transistors for respectively selecting the magnetic tracks, and a plurality of write/read units (not shown) may be arranged to respectively correspond to the magnetic tracks to write information to or read information from the magnetic tracks. A write/read unit may be arranged to correspond to each of the magnetic tracks, and a plurality of write/read units may be arranged at regular intervals along each of the magnetic tracks. Also, a plurality of control transistors (not shown) may be included in the memory unit 110 in order to select the write/read units.

The row decoder 120 supplies a word line signal to the magnetic tracks in the memory unit 110. If the word line signal is activated, the corresponding selection transistor in the memory unit 110 is turned on to select the magnetic track corresponding to the turned-on selection transistor. If the word line signal is deactivated, the corresponding selection transistor in the memory unit 110 is turned off so that the magnetic track corresponding to the turned-off selection transistor is not selected.

The write/read controller 130 may supply write data to the memory unit 110 or may provide data read from the memory unit 110 to the outside via at least one bit line. At least one write/read unit may be arranged to correspond to each of the magnetic tracks, and a plurality of bit lines BL1 to BL(n) are connected to the at least one write/read unit. When a plurality of write/read units are arranged to correspond to one magnetic track, the write/read controller 130 may control the operation of only one write/read unit or may control the operation of two or more write/read units from among the write/read units. To this end, the write/read controller 130 may receive an additional address, e.g., a column address, or a column decoder (not shown) may further be included in the information storage device 100 to decode the column address.

The controller 170 controls the overall operations of the information storage device 100. According to an embodiment of the inventive concept, write data and an address corresponding to the write data are respectively stored in the first magnetic tracks 111 and the second magnetic tracks 112 in the memory unit 110 during a write operation. The controller 170 controls the domain controller 150 based on the address. The domain controller 160 supplies current or a voltage signal to the memory unit 110 to move magnetic domains of the first magnetic tracks 111 and the second magnetic tracks 112 under control of the controller 170. After the magnetic domains are moved, the address is stored in a corresponding location of the second magnetic tracks 112, and main data having the address is stored in a corresponding location of the first magnetic tracks 111.

When a read operation is performed on the information storage device 100, main data corresponding to an input address is detected from among a plurality of pieces of main data stored in the first magnetic tracks 111. During the read operation, an address is read from the second magnetic tracks 112 and is provided to the controller 170. The controller 170 compares the read address with an address provided from the outside. For example, if the comparison reveals that the read address is the same as the input address, the controller 170 controls main data corresponding to the read address to be read from the first magnetic tracks 111. If the comparison reveals that the read address is different from the input address, the controller 170 controls the magnetic domains of the second magnetic tracks 112 to move by one magnetic domain and then compares a subsequent address with the input address. The main data corresponding to the input address is detected and provided as read data to the outside as described above.

Referring to FIG. 3B, when the information storage device 100 drives the memory unit 110, the row decoder 120 may select at least one write/read unit from among the write/read units corresponding to the magnetic tracks. In this case, magnetic tracks included in one of a plurality of memory blocks of the memory unit 110 may be simultaneously selected. To this end, the information storage device 100 may further include a block selection controller 140. The magnetic tracks are connected to the write/read controller 130 via the bit lines bit lines BL1 to BL(n), and the write/read controller 130 may further be connected to the I/O buffer 131.

Figure 4:
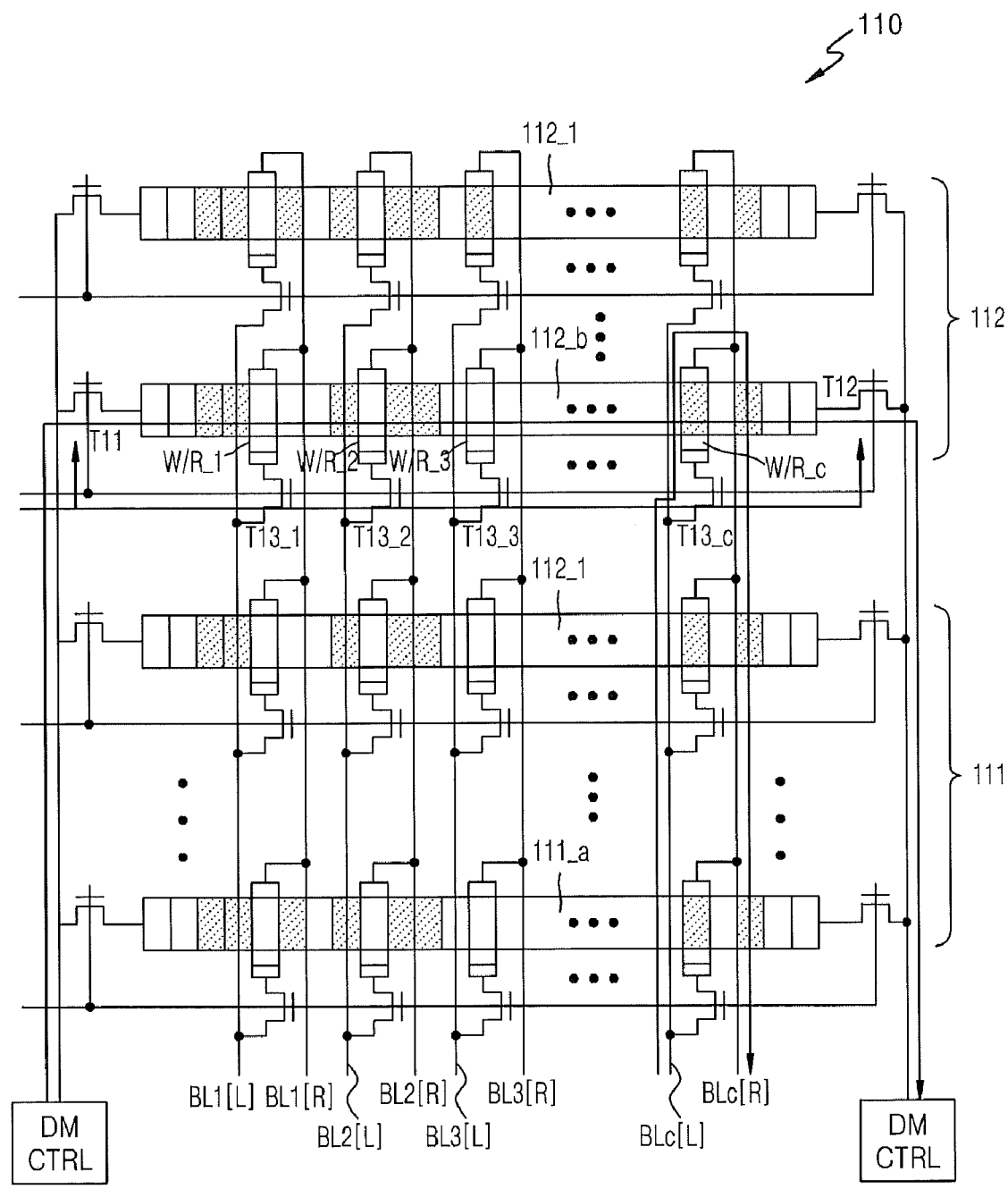
FIG. 4 is a circuit diagram of a memory unit included in the information storage device of FIG. 3A, according to some embodiments of the present inventive subject matter.

FIG. 4 is a circuit diagram of the memory unit 110 included in the information storage device 100 of FIG. 3A, according to some embodiments of the present inventive subject matter. The memory unit 110 included in the information storage device 100 of FIG. 3B may also be embodied by the circuit diagram illustrated in FIG. 4 and thus will not be described here.

Referring to FIG. 4, the memory unit 110, according to the present embodiment, may include a plurality of magnetic tracks including at least one first magnetic track 111 for storing main data and second magnetic tracks 112 for storing the addresses of the main data stored in the first magnetic tracks 111. As described above, a plurality of selection transistors T11 and T12 may be disposed to respectively correspond to the magnetic tracks to select a magnetic track in response to a word line signal. Also, a plurality of write/read units W/R_1 to W/R_c may be disposed to correspond to the magnetic tracks, and a plurality of control transistors T13_1 to T13_c may be disposed to select the write/read units W/R_1 to W/R_c. The selection transistors T11 and T12 and the control transistors T13_1 to T13_c may be controlled in response to different control signals but in some embodiments may be controlled in response to the same control signal. Referring to FIG. 4, the selection transistors T11 and T12 and the control transistors T13_1 to T13_c may be controlled in response to the same word line signal output from the row decoder 120 of FIG. 3A.

The write/read units W/R_1 to W/R_c are connected to the write/read controller 130 of FIG. 3A via a plurality of bit lines. For example, the bit lines include a plurality of pairs of an input bit line BL[L] and an output bit line BL[R]. The first write/read unit W/R_1 corresponding to one of the magnetic tracks receives write/read current via a first input bit line BL1 L. In a write operation, the write/read unit W/R_1 receives the write current and writes data to the corresponding magnetic domain by using the write current. In a read operation, the write/read unit W/R_1 receives the read current, reads data from the corresponding magnetic domain, and supplies the read data to the write/read controller 130 via the first output bit line BL1 [R].

Figure 5A:
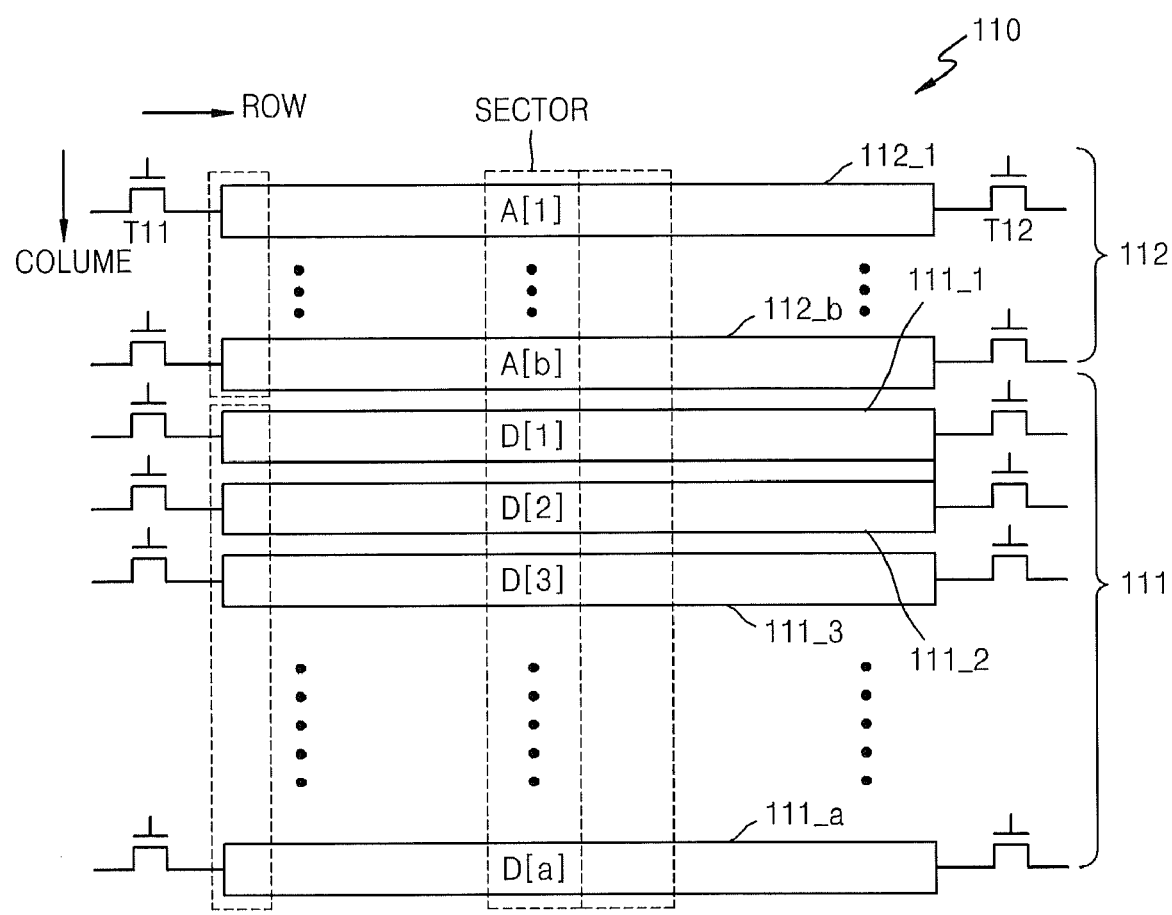
FIGS. 5A and 5B are circuit diagrams illustrating main data and an address stored in the memory unit of FIG. 3A or 3B and an operation of comparing the address with an input address, according to some embodiments of the present inventive subject matter.
Figure 5B:
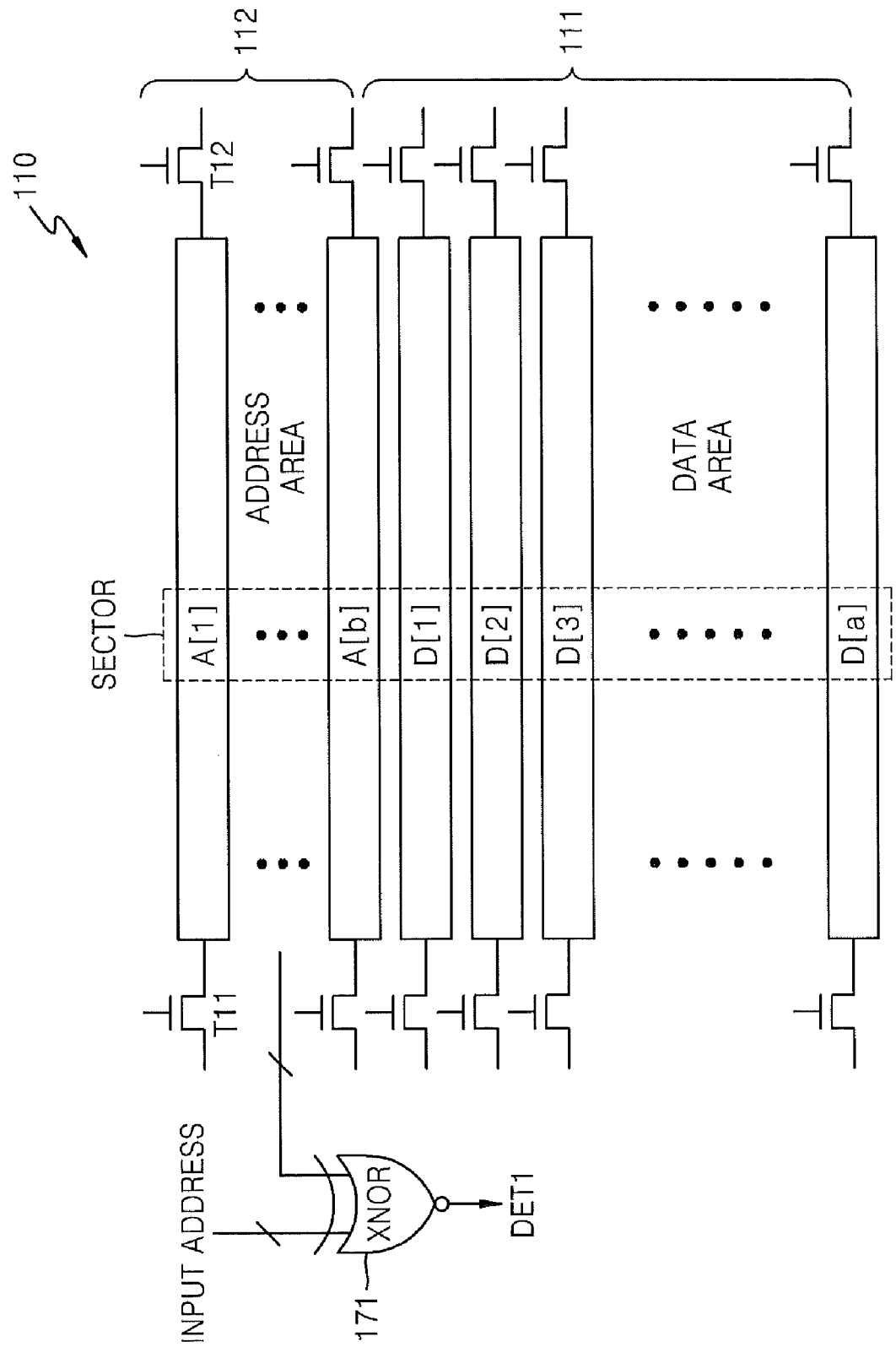

FIGS. 5A and 5B are circuit diagrams illustrating main data and an address stored in the memory unit 110 of FIG. 3A or 3B and an operation of comparing the address with an input address according to embodiments of the present inventive subject matter. For convenience of explanation, write/read units, control transistors, etc. which may be included in the memory unit 100 are not illustrated.

Referring to FIG. 5A, the memory unit 110 may include a first magnetic tracks 111_1 to 111_a, and b second magnetic tracks 112_1 to 112_b. Each of these magnetic tracks includes a plurality of magnetic domains in a row, and a magnetic domain wall is disposed between adjacent magnetic domains that are magnetized in different directions. Each of the magnetic domains may store bit information.

A plurality of magnetic tracks that include the a first magnetic tracks 111_1 to 111_a and the b second magnetic tracks 112_1 to 112_b, may be arranged in parallel in a column direction. Here, magnetic domains included in at least two magnetic tracks are defined to form a sector, which constitutes a unit of writing or reading performed on the information storage device 100. Each of the magnetic tracks includes at least one selection transistor, e.g., two selection transistors T11 and T12. The selection transistors T11 and T12 are turned on or off in response to a word line signal received from the row decoder 120 of FIG. 3.

Magnetic domains of the a first magnetic tracks 111_1 to 111_a and the b second magnetic tracks 112_1 to 112_b, which are arranged in the same column, may be defined to form a sector. For example, one magnetic domain of each of the magnetic tracks is included in one sector, and thus, one sector may include a+b magnetic domains as illustrated in FIG. 5A. From among the a+b magnetic domains included in one sector, the a magnetic domains store main data D[1] to D[a], and the b magnetic domains store the addresses A[1] to A[b] of the main data D[1] to D[a] stored in the magnetic tracks.

In a write operation, input data and an input address corresponding to the input data are provided to the information storage device 100 from the outside. The first magnetic tracks 111_1 to 111_a and the second magnetic tracks 112_1 to 112_b are selected by the row decoder 120, and an address stored in the second magnetic tracks 112_1 to 112_b is read. Then, a location corresponding to the input address is detected from among the first magnetic tracks based on the read address. Next, magnetic domains and magnetic domain walls in the first magnetic tracks 111_1 to 111_a and the second magnetic tracks 112_1 to 112_b are moved according to the detecting result so that a write/read unit (not shown) is located at the magnetic domain corresponding to the detected location. Next, the input data, e.g., a-bit main data, is written to the magnetic domains of the first magnetic tracks 111_1 to 111_a, and the input address, e.g., an b-bit address, is written to the magnetic domains of the second magnetic tracks 112_1 to 112_b.

The magnetic domains of the first magnetic tracks 111_1 to 111_a and the second magnetic tracks 112_1 to 112_b have been described above as being moved simultaneously but may be moved in other ways. For example, only the second magnetic tracks 112_1 to 112_b are first selected by the row decoder 120, the address stored in the second magnetic tracks 112_1 to 112_b is read, and a location corresponding to the input address is detected from among the magnetic tracks. For detecting the address corresponding to the input address, the magnetic domains of the second magnetic tracks 112_1 to 112_b are moved. After the detecting of the address corresponding to the input address is completed, the magnetic domains of the first magnetic tracks 111_1 to 111_a are further moved according to the detecting result. After the movement of the magnetic domains is completed, the input data is written to the magnetic domains of the first magnetic tracks 111_1 to 111_a and the input address is written to the magnetic domains of the second magnetic tracks 112_1 to 112_b.

In a read operation, a read command and an input address are provided to the information storage device 100. When the read command is provided to the information storage device 100, the first magnetic tracks 111_1 to 111_a and the second magnetic tracks 112_1 to 112_b are selected by the row decoder 120, and the address stored in the second magnetic tracks 112_1 to 112_b is read. The read address is compared with the address provided together with the read command.

When the comparison reveals that the read address is not the same as the input address, the magnetic domains of the first magnetic tracks 111_1 to 111_a and the second magnetic tracks 112_1 to 112_b are moved, and then such a comparison is performed again. When the comparison reveals that the read address is the same as the input address, data corresponding to the read address is read from the first magnetic tracks 111_1 to 111_a.

Here, the magnetic domains of the first magnetic tracks 111_1 to 111_a and the second magnetic tracks 112_1 to 112_b have been described above as being moved simultaneously but may be moved in other ways. That is, to compare the address stored in the second magnetic tracks 112_1 to 112_b with the input address, only the second magnetic tracks 112_1 to 112_b may first be selected by the row decoder 120, and only the magnetic domains of the second magnetic tracks 112_1 to 112_b may be moved. If the comparison reveals that the read address is the same as the input address, the magnetic domains of the first magnetic tracks 111_1 to 111_a are moved by the degree to which the magnetic domains of the second magnetic tracks 112_1 to 112_b are moved. After the magnetic domains of the first magnetic tracks 111_1 to 111_a are moved, data is read from the first magnetic tracks 111_1 to 111_a.

In the above description, the address stored in the second magnetic tracks 112_1 to 112__b_ is first read, the read address is compared with the input address, and then, data corresponding to the read address is read. However, the main data stored in the first magnetic tracks 111_1 to 111__a_ and the address stored in the second magnetic tracks 112_1 to 112__b_ may be simultaneously read. Then, the main data is stored in a predetermined buffer (not shown) and the read address is provided to a comparator which may be included in, for example, the controller 170 of FIG. 3A. If the read address is not the same as the input address, information is read from a sector following the magnetic tracks, and data and an address included in the read information are provided to the buffer and the comparator, respectively. If the read address is the same as the input address, the data stored in the buffer is provided as read data to the outside.

FIG. 5B is a circuit diagram illustrating an operation of comparing a read address with an input address according to some embodiment of the present inventive subject matter. Referring to FIG. 5B, an address is read from a plurality of second magnetic tracks 112 and is compared to an address provided from the outside. For example, a b-bit address A[1] to A[b] is read from a location on the second magnetic tracks 112, and is then provided to a comparator 171. The comparator 171 may be included in the controller 170 of FIG. 1, and may include an exclusive NOR gate that determines whether the input address is the same as the read address A[1] to A[b]. The comparator 171 generates a signal DET1 indicating the comparison result. For example, when b-bit information contained in the input address is entirely the same as b-bit information in the read address A[1] to A[b], the signal DET1 generated by the comparator 171 is a first logic level. When at least one bit of the b-bit information in the input address is different from the b-bit information in the read address A[1] to A[b], the signal DET1 generated by the comparator 171 is a second logic level.

Figure 6A:
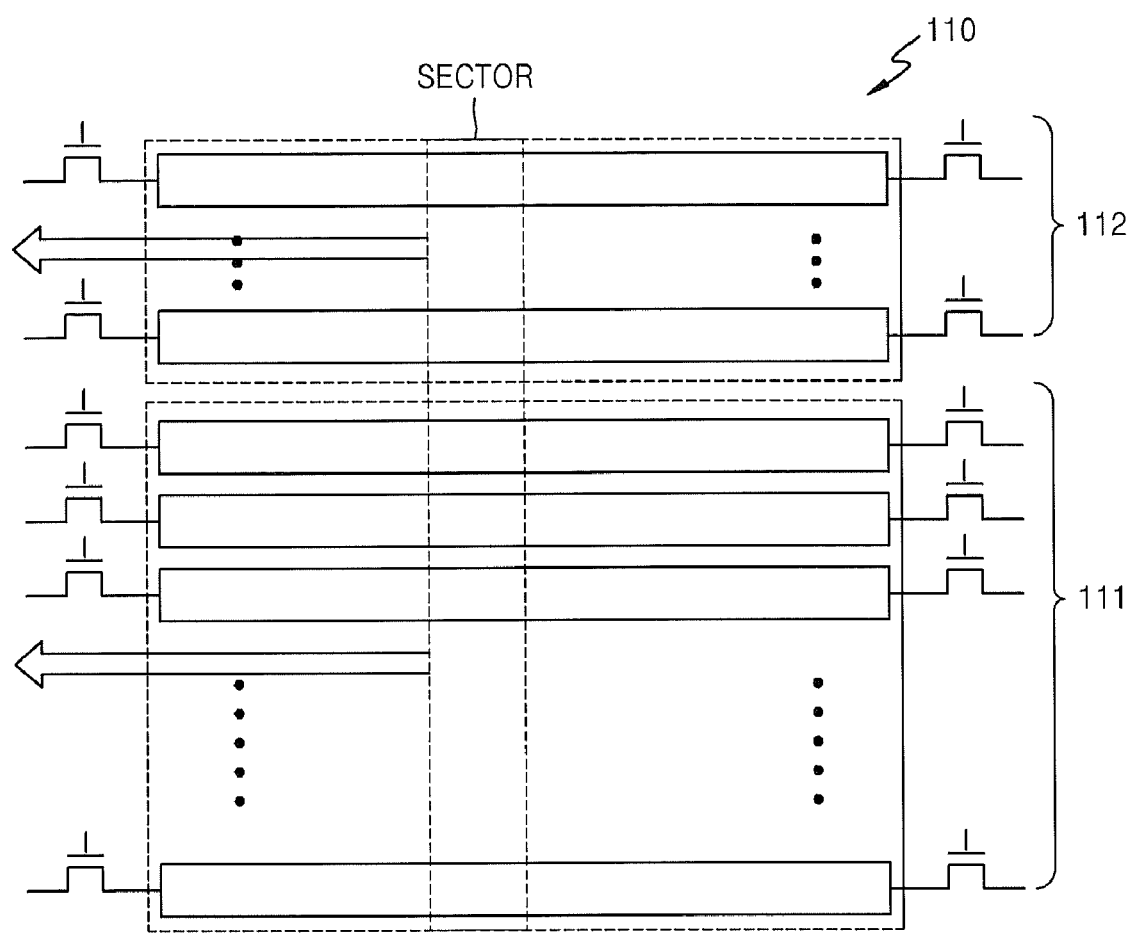
FIGS. 6A and 6B are circuit diagrams illustrating domain wall movement of first magnetic tracks and second magnetic tracks of the memory unit included in the information storage device of FIG. 3A or 3B, according to some embodiments of the present inventive subject matter.
Figure 6B:
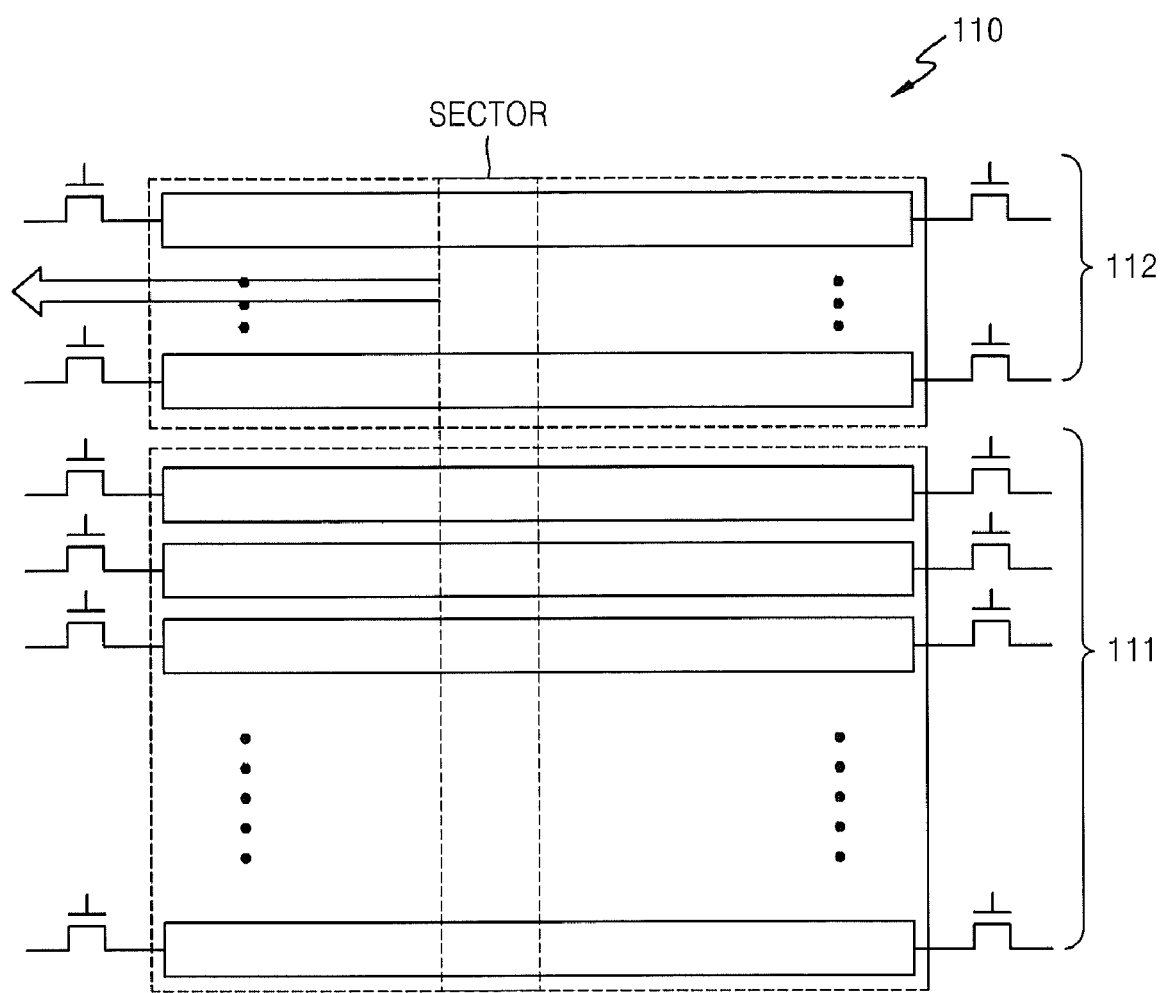

FIGS. 6A and 6B are circuit diagrams illustrating domain wall movement of the first magnetic tracks 111 and the second magnetic track 112 of the memory unit 110 of the information storage device 100 of FIG. 3A or 3B according to some embodiments of the present inventive subject matter.

In detail, FIG. 6A illustrates a case where all magnetic domains of the first magnetic tracks 111 and the second magnetic tracks 112 are simultaneously moved, according to an embodiment of the inventive concept. FIG. 6B illustrates a case where all magnetic domains of the first magnetic tracks 111 and the second magnetic tracks 112 are independently moved according to other embodiments of the present inventive subject matter.

The magnetic domains of the first magnetic tracks 111 and the second magnetic tracks 112 may be moved together or independently according to a mode of the information storage device 100. For example, the magnetic domains of the first magnetic tracks 111 and the second magnetic tracks 112 are controlled to be moved together in a user mode in which a general write/read operation is performed, and are controlled to be independently moved in a test mode. That is, since an address comparison is performed in units of sectors and data is read according to the comparison result in the user mode, the magnetic domains of the first magnetic tracks 111 and the second magnetic tracks 112 may be controlled to be moved together or in concert. However, since it is generally determined whether magnetic tracks are defective in the test mode, the magnetic domains of the first magnetic tracks 111 and the second magnetic tracks 112 do not need to be moved together.

If a large amount of data is stored in the first magnetic tracks 111, for example, if the size of each piece of the stored data exceeds the capacity of one memory unit, the magnetic domains of the second magnetic tracks 112 do not need to be moved when the data is read from the first magnetic tracks 111. That is, it is efficient to detect a starting location of the data by using an address corresponding to the data, and then to read the data from the first magnetic tracks 111 by moving only the magnetic domains of the first magnetic tracks 111.

Figure 7A:
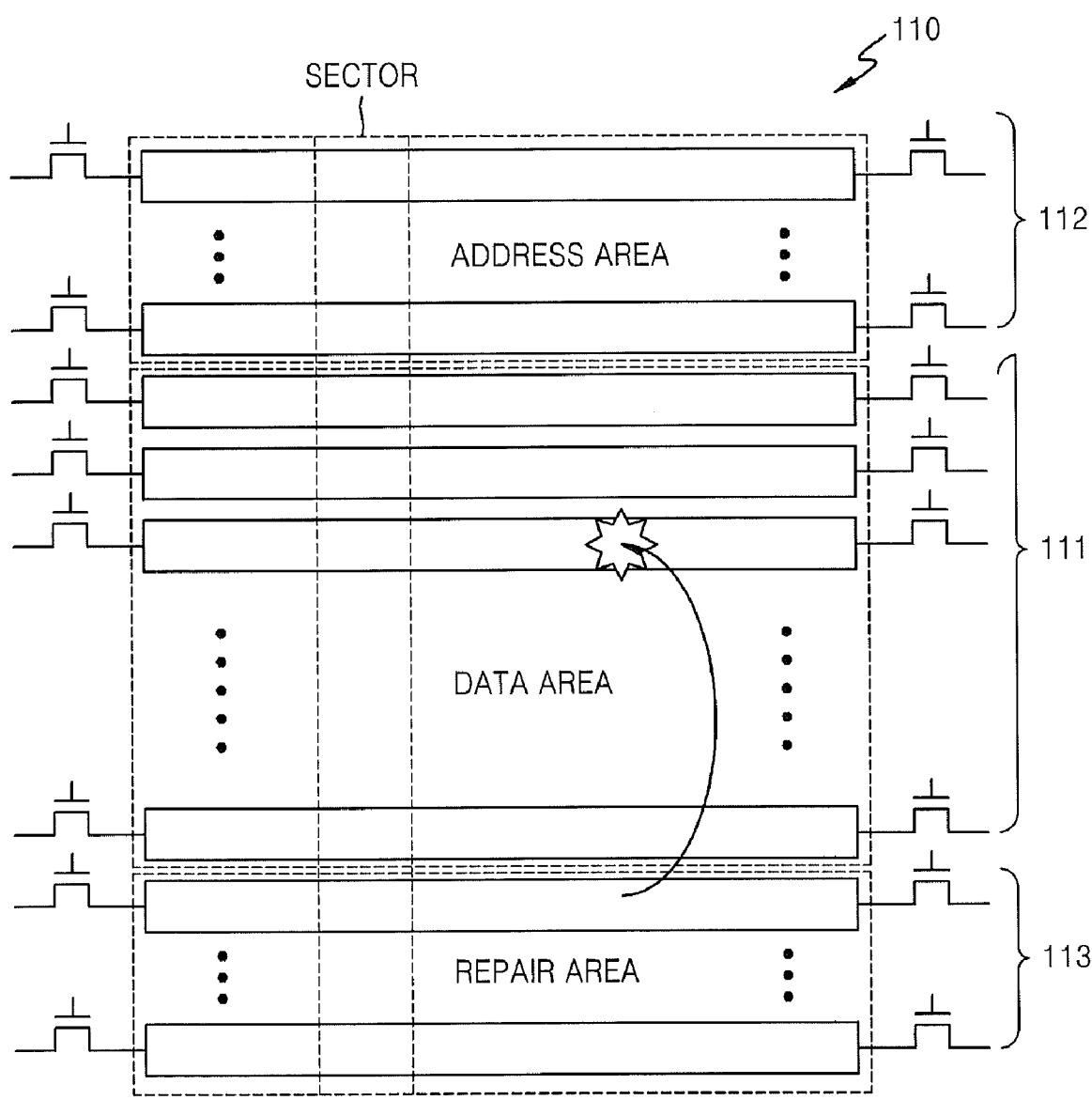
FIGS. 7A and 7B are circuit diagrams of the memory unit of the information storage device illustrated in FIG. 3A or 3B, according to other embodiments of the present inventive subject matter.
Figure 7B:
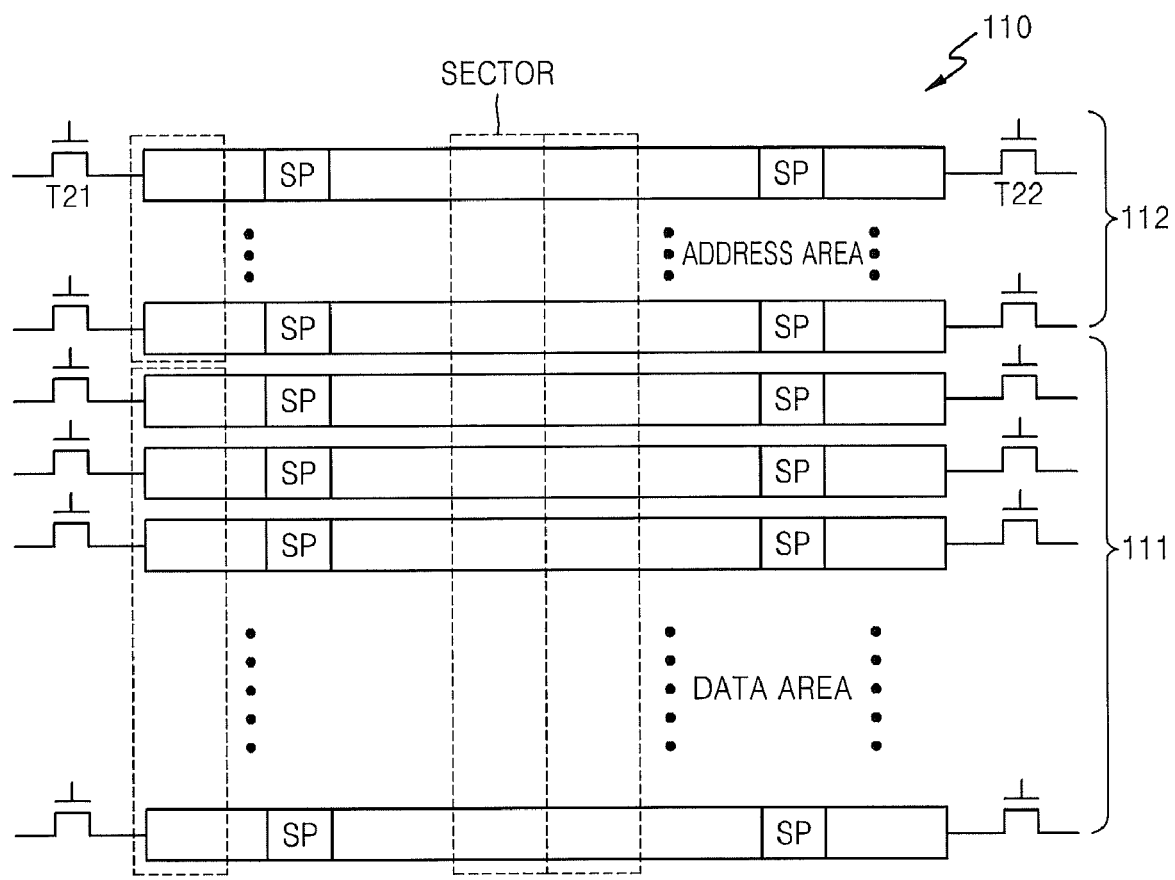

FIGS. 7A and 7B are circuit diagrams of the memory unit 110 of the information storage device 100 illustrated in FIG. 3A or 3B according to other embodiments of the present inventive subject matter. Referring to FIG. 7A, the memory unit 110 according to an embodiment of the inventive subject matter includes first magnetic tracks 111, second magnetic tracks 112, and repair magnetic tracks 113. The repair magnetic tracks 113 may be arranged in each of a plurality of the memory units 110. When the first magnetic tracks 111 for storing main data or the second magnetic tracks 112 for storing an address are defective, they may be replaced with the repair magnetic tracks 113. Although not shown in the drawings, the information storage device 100 may further include a device that transforms an address corresponding to a defective magnetic track into an address corresponding to a repair magnetic track in order to replace the defective magnetic track with the repair magnetic track.

To perform a write/read operation in units of sectors, magnetic tracks of the first magnetic tracks 111, the second magnetic tracks 112, and the repair magnetic tracks 113 may be defined to be one sector. Magnetic domains arranged in a column may be defined to be one sector from among magnetic domains arranged in rows and columns. If there are defects in magnetic domains of the sector, then data that is to be stored in the defective magnetic domains are stored in the magnetic domains of the repair magnetic tracks 113, which are also defined to belong to the sector.

Referring to FIG. 7B, the memory unit 110 may include a plurality of first magnetic tracks 111 for storing main data, and a plurality of second magnetic tracks 112 for storing the address of the main data stored in the first magnetic tracks 111.

Referring to FIG. 7B, the first magnetic tracks 111 of the memory unit 110 further store a sink pattern SP. For example, a plurality of sink patterns SP belonging to a group may be stored in the first magnetic tracks 111, respectively. Otherwise, a plurality of sink patterns SP belonging to two groups may be stored in the first magnetic tracks 111 to be adjacent to one another or at predetermined intervals. Also, the sink patterns SP may be stored at the same locations on the first magnetic tracks 111, respectively. The sink pattern SP may be information of at least one bit, and a bit value thereof is predetermined and stored in the magnetic tracks.

The second magnetic tracks 112 may also further include the sink pattern SP. The sink pattern SP may be stored at locations on the second magnetic tracks 112, which are the same as the locations of the sink patterns SP stored in the first magnetic tracks 111 in a column direction. That is, the sink pattern SP may be stored in at least one sector from among a plurality of sectors of the memory unit 110.

During operation of the information storage device 100, the magnetic domains of the first magnetic tracks 111 and the second magnetic tracks 112 are moved according to an input address. However, when supply of power to the information storage device 100 is suddenly stopped, location information of actual data may be lost. For example, when power is cut off during movement of the magnetic domains of the first magnetic tracks 111 and the second magnetic tracks 112, information contained in the same sector may not be positioned in a same column. In this case, it is possible to align addresses and data by using the sink patterns SP stored in the first magnetic tracks 111 and the second magnetic tracks 112, thereby increasing the reliability of a write/read operation performed on the information storage device 100.

A method of determining the location of data by using such a sink pattern SP will now be described with reference to FIGS. 8A and 8B.

Figure 8A:
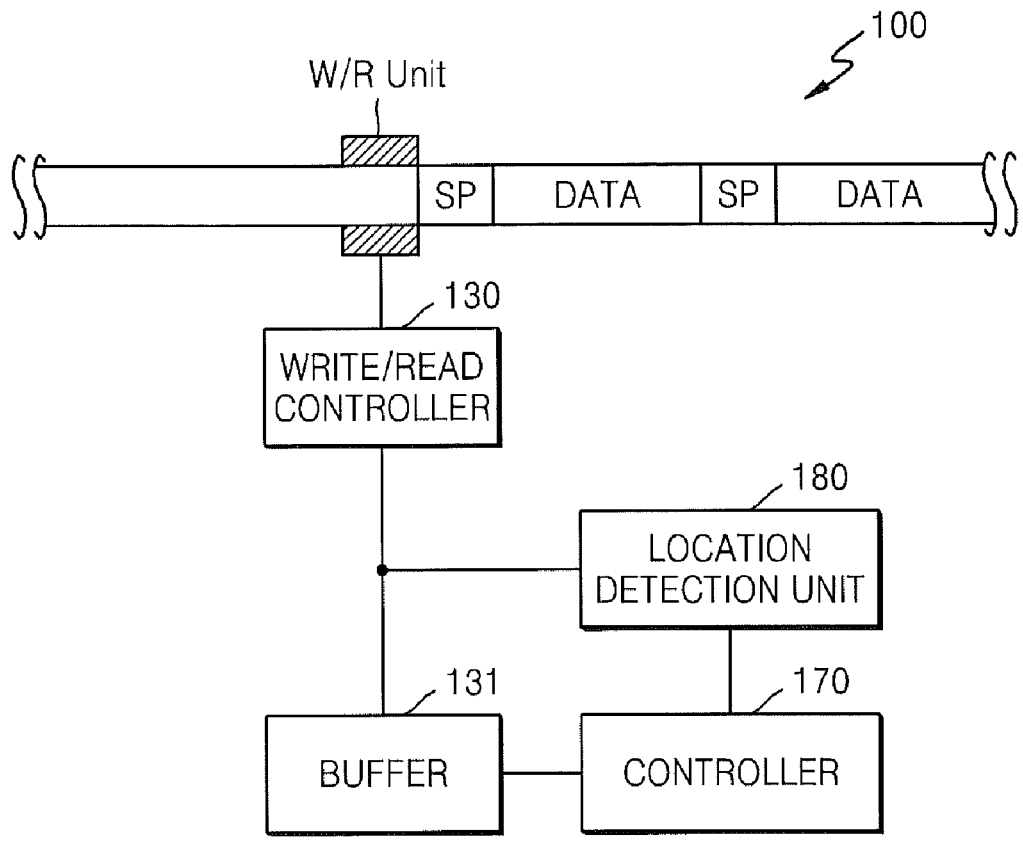
FIG. 8A is a block diagram of an information storage device that determines location of data by using a sink pattern, according to some embodiments of the present inventive subject matter.

FIG. 8A is a block diagram of an information storage device 100 that determines location of data by using a sink pattern SP according to some embodiments of the present inventive subject matter. For convenience of explanation, the information storage device 100 of FIG. 8A will be described using one magnetic track, e.g., a first magnetic track for storing data.

A plurality of sink patterns SP are stored in predetermined locations on the first magnetic track, and data DATA is stored adjacent to the sink patterns SP. If sink patterns SP belonging to at least two groups are stored in the first magnetic track, data DATA is stored between the sink patterns SP. The information storage device 100 determines the location of the data DATA based on the sink patterns SP stored in the first magnetic track. To this end, the information storage device 100 may include the magnetic tracks that store the sink patterns SP, a write/read controller 130, a buffer 131, a controller 170, and a location detection unit 180.

If supply of power to the information storage device 100 is suddenly stopped, information stored in magnetic domains of the magnetic track is sequentially read. The write/read controller 130 controls a write/read unit W/R to read the information from the magnetic domains of the magnetic track. The read information may be temporarily stored in the buffer 131. The location detection unit 180 stores a reference sink pattern that is a predetermined bitstream corresponding to the sink patterns SP, and compares the information read from the first magnetic track with the reference sink pattern. The controller 170 may control the buffer 131 to temporarily store information or control the location detection unit 180 to perform the comparison.

Figure 8B:
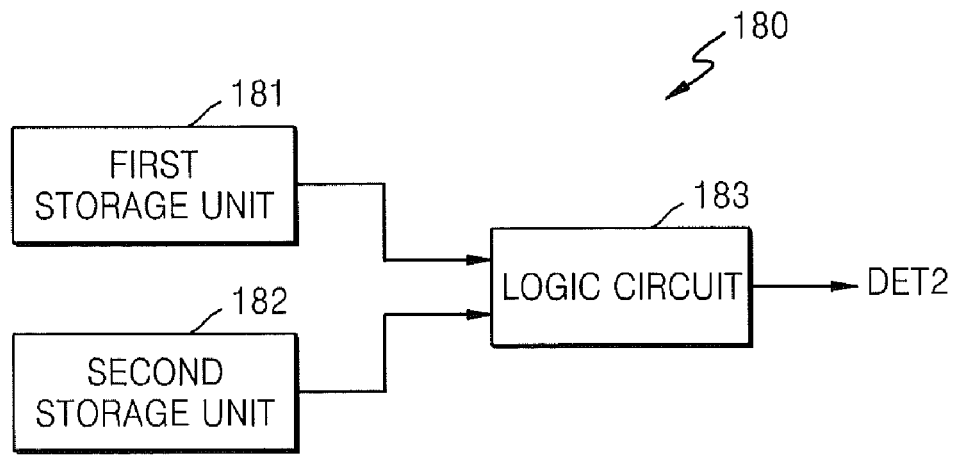
FIG. 8B is a block diagram of a location detection unit included in the information storage device of FIG. 8A, according to some embodiments of the present inventive subject matter.

FIG. 8B is a block diagram of the location detection unit 180 included in the information storage device of FIG. 8A according to some embodiments of the present inventive subject matter. The location detection unit 180 may include a first storage unit 181 that stores a reference sink pattern, a second storage unit 182 that temporarily stores information stored in the first magnetic track, and a logic circuit 183 that compares a value stored in the first storage unit 181 with a value stored in the second storage unit 182. The first storage unit 181 may store a reference sink pattern having the same value as a sink pattern SP stored in the first magnetic track.

When information is read from a magnetic domain of the first magnetic track and is stored in the second storage unit 182, the logic circuit 183 compares the reference sink pattern with the read information. If the comparison result reveals that the reference sink pattern is different from the read information, the read information is determined to be information other than the sink pattern SP. The logic circuit 183 generates a detection signal DET2 having a first or second logic level according to the comparison result. For example, if the reference sink pattern is different from the read information, the detection signal DET2 may be at the first logic level.

If the reference sink pattern is different from the read information, the magnetic domains of the first magnetic track are moved, and then, information is read from the first magnetic track and is stored in the second storage unit 182. Then, the read information is compared with the reference sink pattern. If the comparison result reveals that the read information is the same as the reference sink pattern, the detection signal DET2 generated by the logic circuit 183 is at the second logic level. The location of the sink pattern SP in the first magnetic track may be determined according to the detection signal DET2. If the location of the sink pattern SP is determined, data adjacent to the sink pattern SP may also be determined.

For example, it is assumed that sink patterns SP are stored in the same sectors of first magnetic tracks and second magnetic tracks, and first data and a first address corresponding to the first data are stored in sectors adjacent to the sink patterns SP. If the information storage device 100 of FIG. 8A operates to move magnetic domains of the first magnetic tracks and the second magnetic tracks and power is cut off, then the locations of the sink patterns SP are first detected when the information storage device 100 operates again. If the sink patterns SP are aligned by comparing read information with a reference sink pattern, the locations of the first data and the first address adjacent to the sink patterns SP may be determined. Accordingly, it is possible to increase the reliability of data by performing a write/read operation after the locations of the data and an address corresponding to the data are determined.

Figure 9:
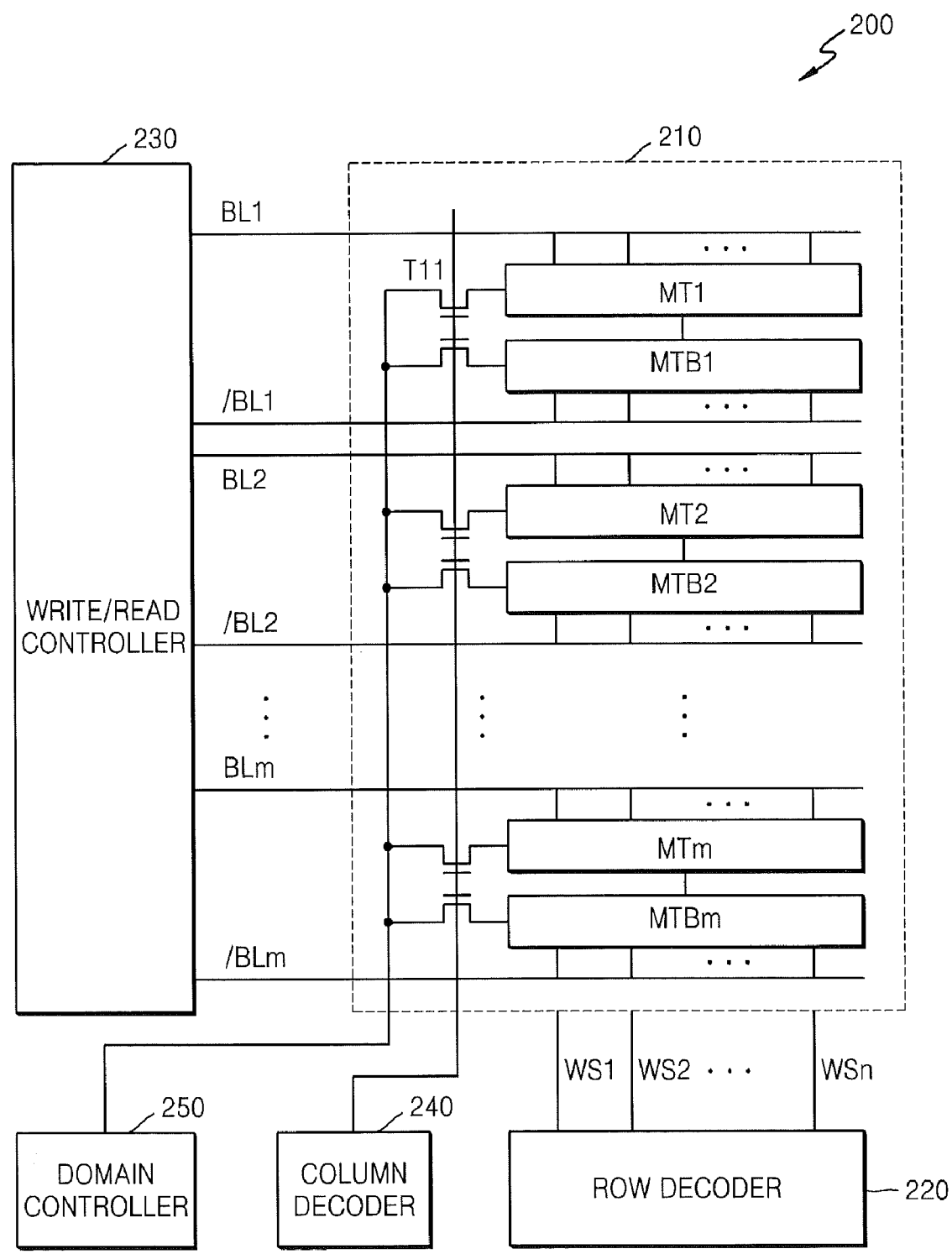
FIG. 9 is a block diagram of an information storage device using magnetic domain wall movement, according to another embodiment of the present inventive subject matter.

FIG. 9 is a block diagram of an information storage device 200 using magnetic domain wall movement according to another embodiment of the present inventive subject matter. In the current embodiment, a main magnetic track unit includes a plurality of first magnetic tracks for storing main data, and a sub magnetic track unit includes a plurality of second magnetic tracks for storing data complementary to the main data. To this end, the first magnetic tracks and the second magnetic tracks may be arranged to form a plurality of pairs thereof.

Referring to FIG. 9, the information storage device 200 according to the present embodiment may include a memory unit 210 that includes at least one pair of magnetic tracks, a row decoder 220 that provides word line signals WS1 to WSm in order to select magnetic domains on which a write/read operation is to be performed, and a write/read controller 230 that controls data to be written to or to be read from the selected magnetic domains. The information storage device 200 may further include a column decoder 240 that generates a column signal for selecting the at least one pair of magnetic tracks, and a domain controller 250 that controls movement of magnetic domains and magnetic domain walls of the selected at least one pair of magnetic tracks.

The memory unit 210 includes a plurality of first magnetic tracks and a plurality of second magnetic tracks, and one of the first magnetic tracks and one of the second magnetic tracks may be defined to be a pair of magnetic tracks. For example, as illustrated in FIG. 9, the memory unit 210 may include m pairs of magnetic tracks (m is an integer that is equal to or greater than 1). For example, a first pair of magnetic tracks includes a first magnetic track MT1 and a second magnetic track MTB1, a second pair of magnetic tracks includes a first magnetic track MT2 and a second magnetic track MTB2, and an $m^{th}$ pair of magnetic tracks includes a first magnetic track MTm and a second magnetic track MTBm. When a predetermined bit data, e.g., 1-bit data, is written to the first pair of magnetic tracks, the first magnetic track MT1 stores main data corresponding to the written data and the second magnetic track MTB1 stores data complementary to the main data.

Although FIG. 9 illustrates that the information storage device 200 includes one memory unit 210, the information storage device 200 may include a plurality of memory units 210. Also, although not shown, a plurality of write/read units may be respectively disposed to correspond to the above magnetic tracks in order to write actual data to or read actual data from a magnetic domain.

The magnetic tracks, i.e., a total of 2×m magnetic tracks, that are included in the m pairs of magnetic tracks may be arranged to be parallel to one another in a first direction. Also, each of the magnetic tracks may include a plurality of magnetic domains disposed in a second direction that is nearly perpendicular to the first direction. Thus, data domains of the memory unit 210, which store data, may be formed in a matrix. In order to perform a write/read operation on the magnetic domains, n write/read units, for example, may be arranged to correspond to one magnetic track (n is an integer that is equal to or greater than 1). That is, if the n write/read units are arranged to correspond to the 2×m magnetic tracks, respectively, 2×m×n write/read units may be aligned to correspond to the magnetic tracks of the memory unit 210.

The row decoder 220 activates at least one of the n write/read units to perform a write/read operation on a magnetic domain that is to be driven. To this end, the row decoder 220 generates n word line signals WS1 to WSn. One of the n word line signals WS1 to WSn is activated, and the other word line signals are deactivated. A predetermined control transistor (not shown) may be connected to the n write/read units to perform a selection operation on the n write/read units corresponding to the magnetic tracks. The n word line signals WS1 to WSn are respectively supplied to the gates of the n control transistors, thereby activating one of the n write/read units.

Thus, when write/read units corresponding to first to $m^{th}$ pairs of bit lines are activated, at least one of the m pairs of bit lines is selected. To this end, the column decoder 240 generates a selection signal in response to a column address (not shown) received from the outside. A plurality of selection transistors T11 may be disposed to correspond to magnetic tracks connected to the first to $m^{th}$ pairs of bit lines. The column decoder 240 selects at least one of the m pairs of bit lines by supplying the selection signal to the selection transistors T11. The selection signal may be commonly supplied to the selection transistors T11 that are respectively disposed to correspond to the magnetic tracks of the memory unit 210 so that the first to $m^{th}$ pairs of bit lines of the memory unit 210 may be simultaneously selected.

After at least one of the m pairs of bit lines is selected, magnetic domains of a pair of magnetic tracks connected to the selected at least one pair of bit lines are moved. That is, each of the write/read units performs a write/read operation on one of a plurality of magnetic domains and domain controller 250 moves the magnetic domain to position the write/read unit at a predetermined magnetic domain which is to be driven. To move the magnetic domains, the domain controller 250 of FIG. 1 supplies a control voltage or control current to the magnetic tracks.

When the magnetic domains are selected, the write/read operation is performed thereon. Each of the pairs of magnetic tracks is connected to a bit line and a complementary bit line. For example, in the first pair of magnetic tracks, the first magnetic track MT1 is electrically connected to a first bit line BL1 and the second magnetic track MTB1 is electrically connected to a first complementary bit line /BL1. Similarly, the second pair of magnetic tracks is electrically connected to a second bit line BL2 and a second complementary bit line /BL2, respectively. The $m^{th}$ pair of magnetic tracks is electrically connected to an $m^{th}$ bit line BLm and an $m^{th}$ complementary bit line /BLm. A word line for supplying the word line signals WS1 to WSn may be arranged to be nearly perpendicular to the magnetic tracks, and these bit lines and complementary bit lines may be arranged to be nearly parallel with the magnetic tracks.

Although not shown in FIG. 9, a first control transistor may be disposed between the bit lines and the first magnetic tracks to control the connection between the bit lines and the first magnetic tracks, and a second control transistor may be disposed between the complementary bit lines and the second magnetic tracks to control the connection between the complementary bit lines and the second magnetic tracks. In detail, the first control transistor may be disposed between the write/read units and bit lines disposed to correspond to the first magnetic tracks, and the second control transistor may be disposed between the write/read units and bit lines disposed to correspond to the second magnetic tracks.

The construction and operation of an information storage device according to embodiments of the inventive concept will now be described in detail with reference to FIGS. 10A to 10C.

Figure 10A:
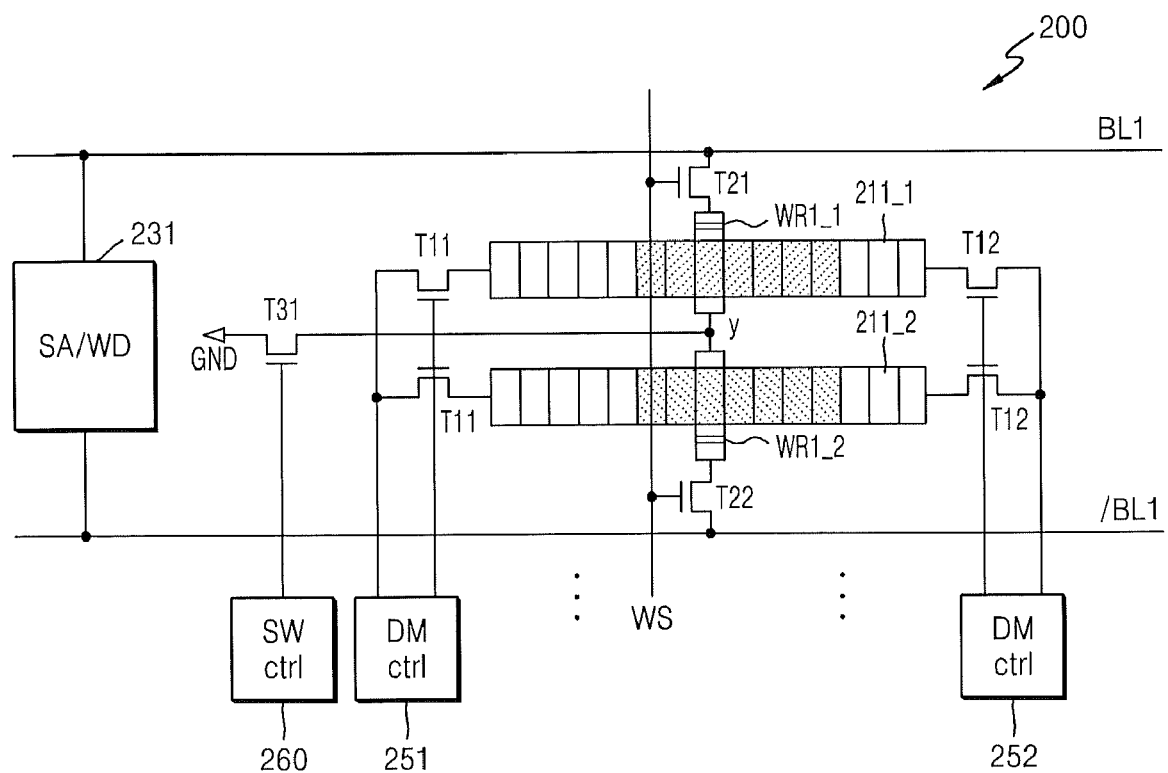
FIGS. 10A to 10C are circuit diagrams illustrating in detail the information storage device of FIG. 9, according to some embodiments of the present inventive subject matter.
Figure 10B:
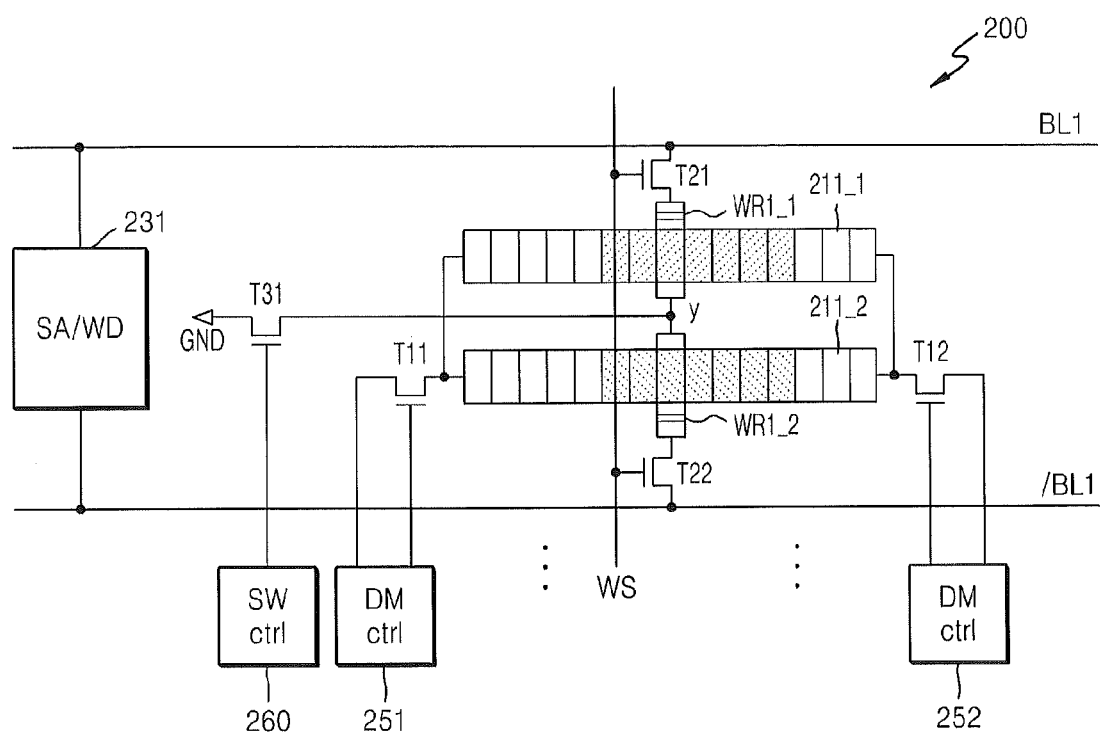
Figure 10C:
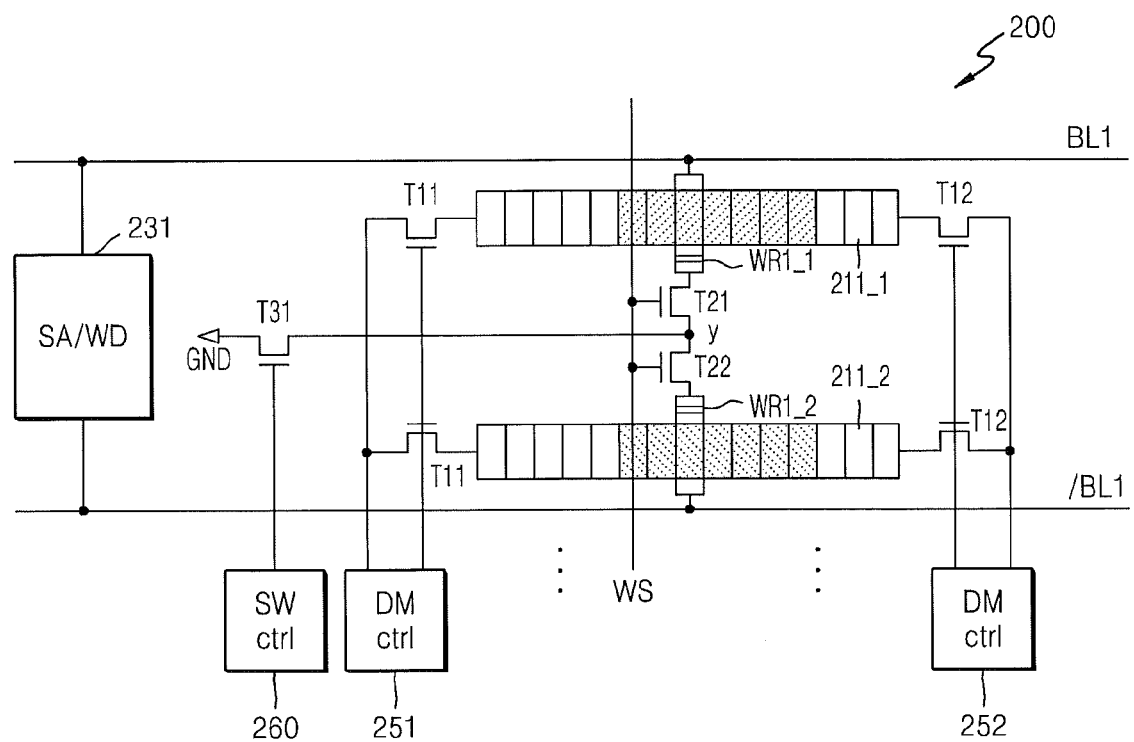

FIGS. 10A to 10C are circuit diagrams illustrating in detail the information storage device 200 of FIG. 9 according to some embodiments of the present inventive subject matter. Here, only a first pair of magnetic tracks included in the memory unit 210 of the information storage device 200 of FIG. 9 and a plurality of peripheral circuits needed to drive them are illustrated for convenience of explanation.

Referring to FIG. 10A, the first pair of magnetic tracks include a first magnetic track 211_1 and a second magnetic track 211_2, and least one write/read unit is disposed to correspond thereto. For example, n write/read units are disposed to correspond to the first magnetic track 211_1, and n write/read units are disposed to correspond to the second magnetic track 211_2. Referring to FIG. 10A, a first write/read unit WR1_1 is disposed to correspond to the first magnetic track 211_1 and a second write/read unit WR1_2 is disposed to correspond to the second magnetic track 211_2.

A first control transistor T21 is disposed between a first bit line BL1 and the first magnetic track 211_1, and a second control transistor T22 is disposed between a first complementary bit line /BL1 and the second magnetic track 211_2. The first control transistor T21 and the second control transistor T22 are controlled in response to a word line signal WS. When the word line signal WS is activated, both the first write/read unit WR1_1 corresponding to the first magnetic track 211_1 and the second write/read unit WR1_2 corresponding to the second magnetic track 211_2 are activated.

As described above with reference to FIG. 9, the column decoder 240 may select a pair of magnetic tracks in response to a given column address but the inventive concept is not limited thereto. As illustrated in FIG. 10A, first and second selection transistors T11 and T12 may be disposed to correspond to the first magnetic track 211_1, and first and second selection transistors T11 and T12 may be disposed to correspond to the second magnetic track 211_2, First and second domain controllers 251 and 252 may also be disposed to correspond to the first and second magnetic tracks 211_1 and 211_2, respectively. A control voltage or control current is generated to move magnetic domains of the first and second magnetic tracks 211_1 and 211_2. Also, the domain controllers 251 and 252 may generate a selection signal for selecting the first and second magnetic tracks 211_1 and 211_2 in response to a given column address.

To perform a write/read operation on the information storage device 200, the information storage device 200 may further include a switch T31 and a switch controller 260 to correspond to the first and second magnetic tracks 211_1 and 211_2. For example, one end of the switch T31 is connected to a node y between the first magnetic track 211_1 and the second magnetic track 211_2, and the other end of the switch T31 is connected to a ground voltage source GND. Also, the switch controller 260 generates a signal for controlling the switch T31 in response to a write/read command. For example, in a read operation, the switch controller 260 turns off the switch T31 to prevent a ground voltage GND from being applied to the node y. In a write operation, the switch controller 260 turns on the switch T31 to supply the ground voltage GND to the node y.

The write/read controller 231 writes data to or reads data from the first and second magnetic tracks 211_1 and 211_2 via a bit line BL1 and a complementary bit line /BL1. To this end, the write/read controller 231 may include a plurality of sense amplifier/write drivers to correspond to the first and second magnetic tracks 211_1 and 211_2, respectively. Referring to FIG. 10A, a first sense amplifier/write driver 231 is disposed to correspond to the first and second magnetic tracks 211_1 and 211_2.

The information storage device 200 illustrated in FIG. 10B according to another embodiment of the inventive concept is similar in structural terms to the information storage device 200 illustrated in FIG. 10A. However, referring to FIG. 10A, the first and second selection transistors T11 and T12 are disposed to correspond to the first magnetic track 211_1 and the first and second selection transistors T11 and T12 are disposed to correspond to the second magnetic track 211_2, i.e., each track corresponds to two respective transistors T11 and T12 in FIG. 10A. Whereas, referring to FIG. 10B, first and second selection transistors T11 and T12 may be shared by both a first magnetic track 211_1 and a second magnetic track 2112. That is, since both the first magnetic track 211_1 and the second magnetic track 211_2 are selected or are not selected simultaneously, they may share a single pair of the first and second selection transistors T11 and T12.

The information storage device 200 illustrated in FIG. 10C according to another embodiment of the inventive concept is also similar to the information storage device 200 illustrated in FIGS. 10A and 10B in terms of their constructions. However, referring to FIG. 10A, the first control transistor T21 is disposed between the first bit line BL1 and the first magnetic track 211_1 and the second control transistor T22 is disposed between the first complementary bit line /BL1 and the second magnetic track 211_2, whereas, referring to FIG. 10C, a first control transistor T21 and a second control transistor T22 may be disposed in series between a first write/read unit WR1_1 disposed to correspond to the first magnetic track 211_1 and a second write/read unit WR1_2 disposed to correspond to the second magnetic track 211_2.

Figure 11A:
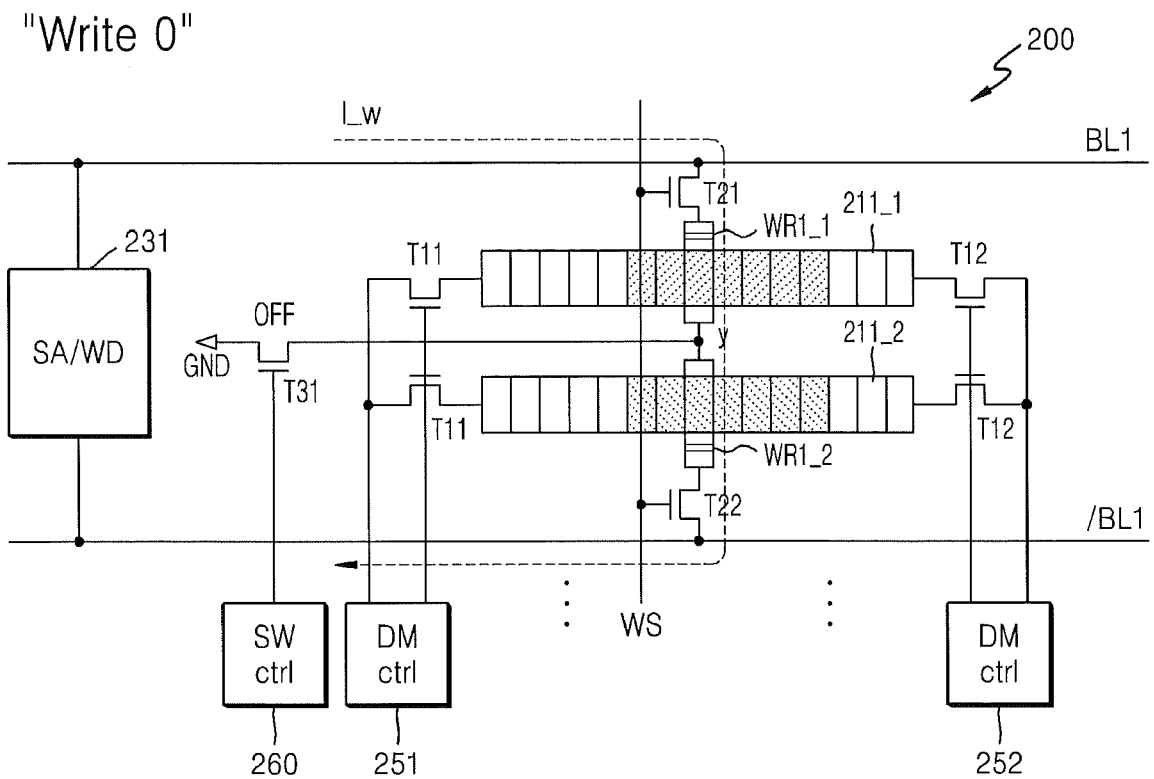
FIGS. 11A to 11C are circuit diagrams illustrating a write/read operation performed on the information storage device of FIG. 9, according to some embodiments of the present inventive subject matter.
Figure 11B:
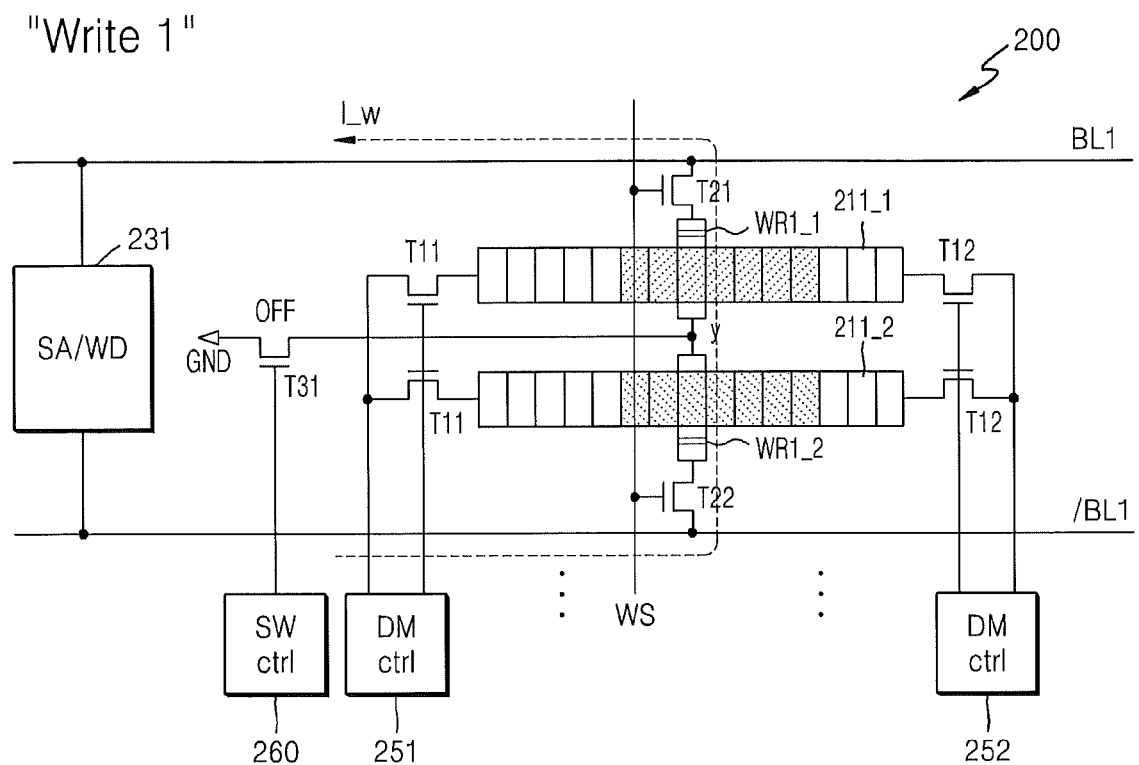
Figure 11C:
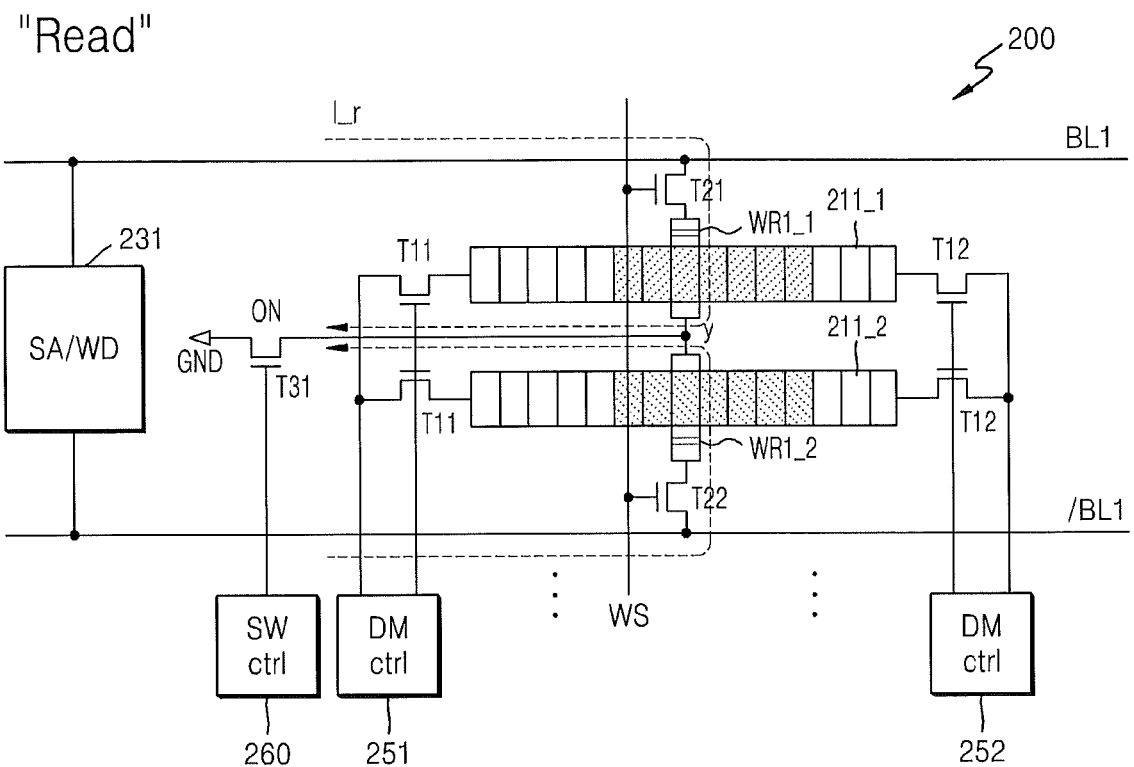

FIGS. 11A to 11C are circuit diagrams illustrating a write/read operation performed on the information storage device 200 of FIG. 9, according to some embodiments of the present inventive subject matter. In detail, FIG. 11A illustrates a write operation of writing logic low data, e.g., a data value "0", to the information storage device 200, according to an embodiment of the inventive concept.

Referring to FIG. 11A, when a write operation is performed on the information storage device 200, a sense amplifier/write driver 231 generates write current I_w and supplies it to a first magnetic track 211_1 and a second magnetic track 211_2 of a first pair of magnetic tracks. In the write operation, a switch T31 is turned off. Thus, the write current I_w flows from a bit line BL1 to a complementary bit line /BL1 or from the complementary bit line /BL1 to the bit line BL1.

If logic low data, e.g., the data value "0", is written, then the write current I_w generated by the sense amplifier/write driver 231 may be supplied along a current path from the bit line BL1 to the first and second magnetic tracks 211_1 and 211_2, and then, finally to, the complementary bit line /BL1. If a plurality of the write/read units W/R of FIG. 2 are disposed to correspond to the first and second magnetic tracks 211_1 and 211_2, respectively, then the write current I_w may allow main data to be written to the first magnetic track 211_1 and complementary data to be written to the second magnetic track 211_2. For example, referring to FIG. 11A, a first ferromagnetic layer and a second ferromagnetic layer (which are connected to the first bit line BL1 and a node y, respectively) of a write/read unit WR1_1 corresponding to the first magnetic track 211_1, may be magnetized along a first direction and a second direction, respectively. Also, a first ferromagnetic layer and a second ferromagnetic layer (which are connected to the node y and the complementary bit line /BL1, respectively) of a write/read unit WR1_2 corresponding to the second magnetic track 211_2, may be magnetized along the second direction and the first direction, respectively. Accordingly, when the write current I_w that flows along the same direction is supplied, magnetic domains of the first magnetic track 211_1 may be magnetized in a direction opposite to a direction in which magnetic domain of the second magnetic track 211_2 are magnetized.

FIG. 11B illustrates a write operation of writing logic high data, e.g., a data value "1", to the information storage device 200 according to some embodiments of the present inventive subject matter. FIG. 11B is different from FIG. 11A in terms of a direction in which write current I_w flows. For example, referring to FIG. 11B, when logic high data, e.g., the data value "1", is written, write current I_w generated by a sense amplifier/write driver 231 may be supplied along a current path from a complementary bit line /BL1 to a second magnetic track 211_2 and a first magnetic track 211_1, and then, finally to, a bit line BL1.

FIG. 11C illustrates a read operation of reading data from a pair of magnetic tracks in the information storage device 200 according to some embodiments of the present inventive subject matter. Referring to FIG. 11C, for the read operation, a sense amplifier/write driver 231 may generate read current I_r and supply it to the pair of magnetic tracks. The sense amplifier/write driver 231 may generate the read current I_r and supply it to a bit line BL1. The read current I_r may be supplied to the bit line BL1 and a complementary bit line /BL1 simultaneously. While the read operation is performed on the information storage device 200, a switch T31 is turned on. Thus, a node y between a first magnetic track 211_1 and a second magnetic track 211_2 may be connected to a ground voltage source GND. The read current I_r supplied to the bit line BL1 flows toward the ground voltage source GND via magnetic domains of the first magnetic track 211_1. The read current I_r supplied to the complementary bit line /BL1 flows toward the ground voltage source GND via magnetic domains of the second magnetic track 211_2. The read current I_r supplied to the bit line BL1 may have the same value as the read current I_r supplied to the complementary bit line /BL1.

The magnetic domains of the first magnetic track 211_1 for storing main data are magnetized in a direction that is opposite to a direction of magnetization of the magnetic domains of the second magnetic track 211_2 for storing data complementary to the main data. Thus, a resistance value of the magnetic domains of the first magnetic track 211_1 is different from that of the magnetic domains of the second magnetic track 211_2. Accordingly, when the read current I_r is supplied to the magnetic domains of the first magnetic track 211_1 and the second magnetic track 211_2, a voltage of the bit line BL1 becomes different from that of the complementary bit line /BL1. The sense amplifier/write driver 231 senses and amplifies the difference between the voltages of the bit line BL1 and the complementary bit line /BL1. Data read by performing the read operation may be stored in a latch (not shown) that may be included in the sense amplifier/write driver 231, and may be provided to the outside in response to a predetermined output control signal.

According to the read operation of the current embodiment, it is possible to improve a sensing margin when data is sensed, thereby increasing the speed of reading data. That is, a sensing margin when data is sensed using main data and complementary data is greater than when a change in a voltage applied to a main bit line is sensed according to a resistance of magnetic domains storing the main data and is compared with a predetermined reference voltage.

Figure 12A:
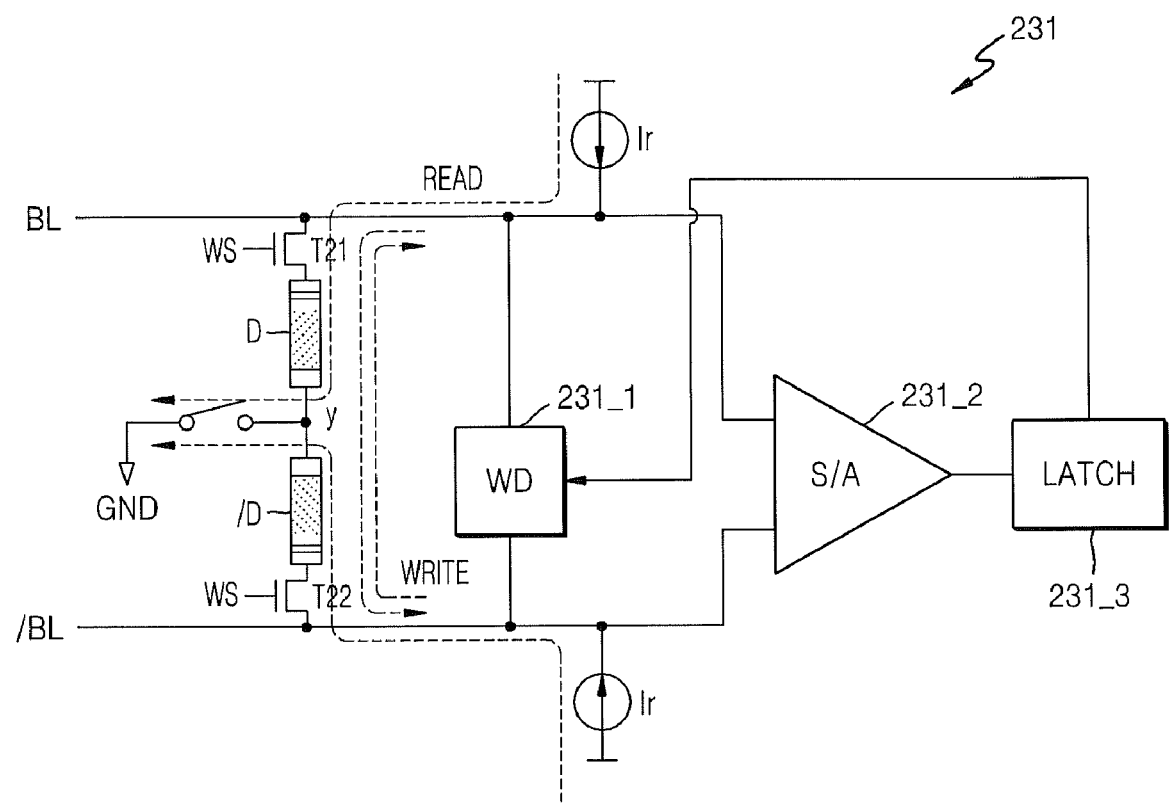
FIGS. 12A to 12C are circuit diagrams of a sense amplifier/write driver, which is included in a write/read controller of the information storage device of FIG. 9, and a waveform diagram of the operating characteristics thereof, according to some embodiments of the present inventive subject matter.
Figure 12B:
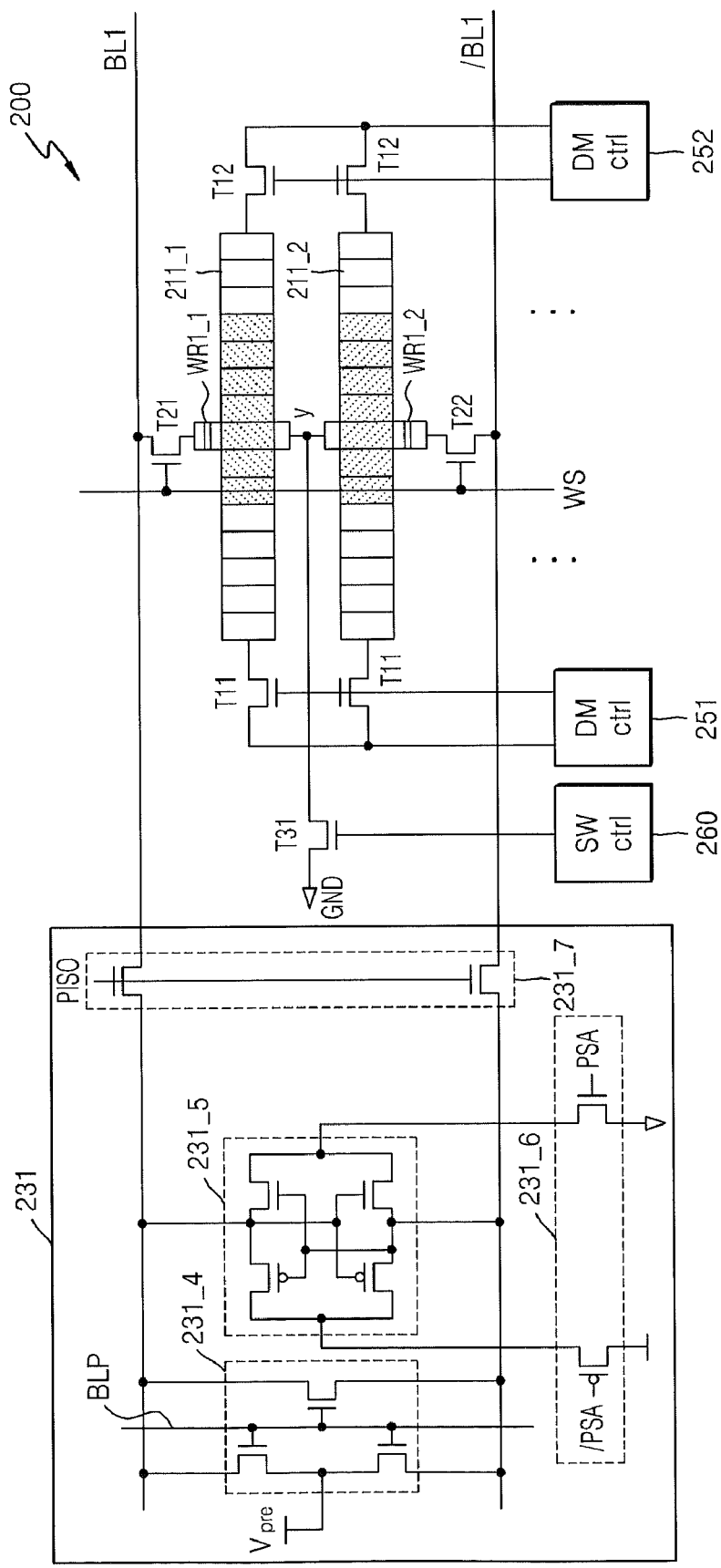
Figure 12C:
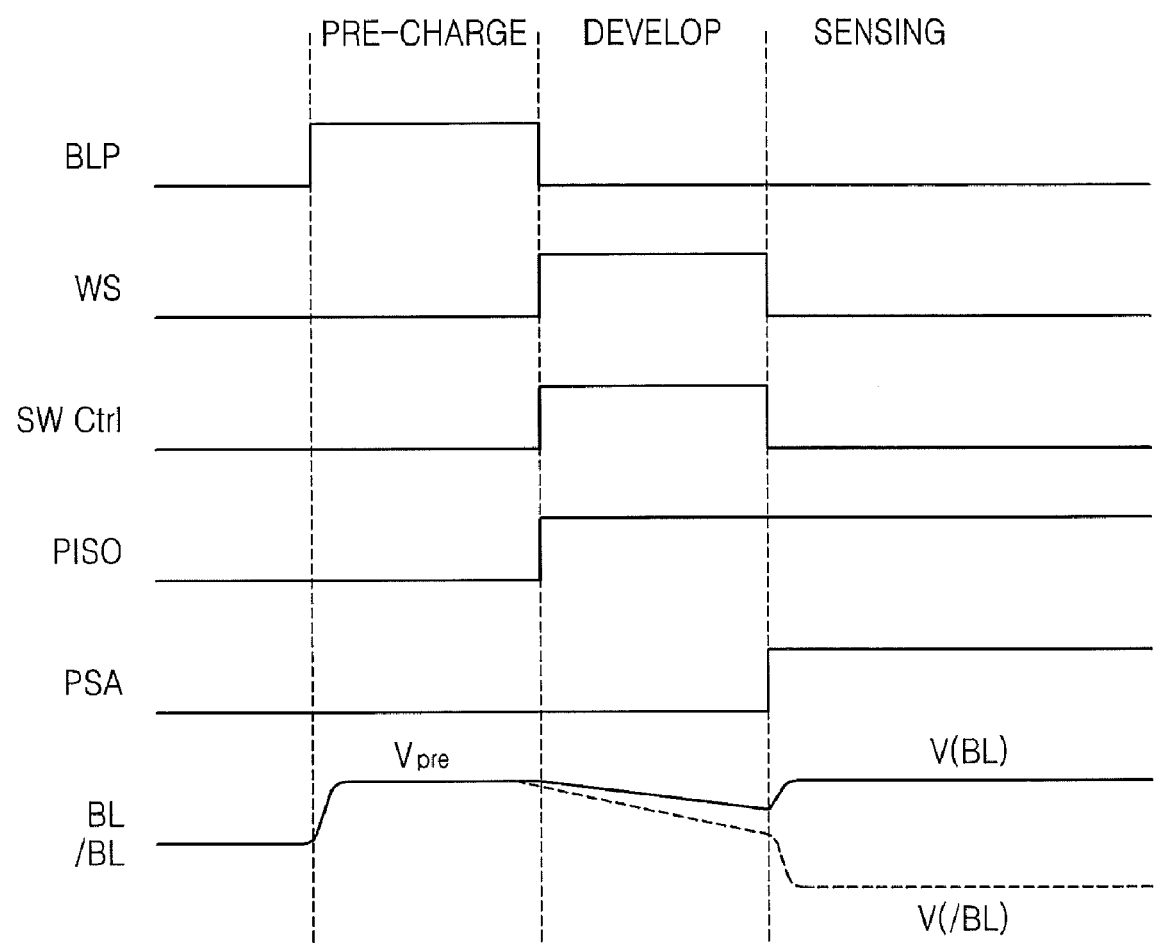

FIGS. 12A to 12C are circuit diagrams of a sense amplifier/write driver 231 included in the write/read controller 230 of FIG. 9, and a waveform diagram illustrating the operating characteristics thereof, according to embodiments of the inventive concept. For convenience of explanation, magnetic domains of a pair of magnetic tracks, a write/read unit corresponding to the magnetic domains, and a control transistor are further illustrated here.

FIG. 12A is a circuit diagram of the sense amplifier/write driver 231 according to some embodiments of the present inventive subject matter. Referring to FIG. 12A, the sense amplifier/driver 231 according to the present embodiment may include a write driver 231_1, a sense amplifier 231_2, and a latch 231_3. The sense amplifier/write driver 231 is connected to a bit line BL and a complementary bit line /BL that are disposed to correspond to a pair of magnetic domains. The sense amplifier/write driver 231 may further include a current source that generates read current Ir for reading data. In a read operation, the read current Ir may be simultaneously supplied to both the bit line BL and the complementary bit line /BL.

In a write operation, write data, e.g., 1-bit data, which is stored in the latch 231_3 is supplied to the write driver 231_1. The write driver 231_1 generates write current in response to the write data. For example, the write driver 231_1 generates write current that flows from the bit line BL to the complementary bit line /BL or from the complementary bit line /BL to the bit line BL, according to the state of the write data.

In the read operation, when read current Ir is supplied to the bit line BL, the read current Ir flows sequentially to a first control transistor T21 and a magnetic domain D of a first magnetic track, and finally, to a ground voltage source GND. Also, when the read current Ir is supplied to the complementary bit line /BL, the read current Ir flows sequentially to a second control transistor T22 and a magnetic domain /D of a second magnetic track, and finally, to the ground voltage source GND. Thus, a voltage of the bit line BL is determined by the read current Ir and a resistance of the magnetic domain D, and a voltage of the complementary bit line /BL is determined by the read current Ir and a resistance of the magnetic domain /D. The sense amplifier 231_2 senses and amplifies the voltages of the bit line BL and the complementary bit line /BL. The sensing result is temporarily stored in the latch 231_3 and is provided as read data to the outside.

FIG. 12B is a circuit diagram of the sense amplifier/write driver 231 according to another embodiment of the present inventive subject matter. FIG. 12C illustrates the waveforms of various signals related to the sense amplifier/write driver 231 according to an embodiment of the present inventive subject matter. For convenience of explanation, FIG. 12B further illustrates a pair of magnetic tracks (a first magnetic track 211_1 and second magnetic track 211_2), first and second domain controller 251 and 252, and a switch controller 260.

Referring to FIG. 12B, the sense amplifier/write driver 231 according to the present embodiment reads data from the pair of magnetic tracks in the same way in which data is read from, for example, dynamic random access memory (DRAM). To this end, the sense amplifier/write driver 231 includes a write driver (not shown) and various circuits related to data reading. The sense amplifier/write driver 231 may include various circuits, such as, a precharge unit 231_4 that precharges a pair of bit lines (a bit line BL1 and a complementary bit line /BL1) to a predetermined precharge voltage Vpre, a sense amplifier unit 231_5 that senses and amplifies the difference between a voltage of the bit line BL1 and a voltage of the complementary bit line /BL1, and a sense amplifier driving unit 231_6 that drives the sense amplifier unit 231_5. The sense amplifier/write driver 231 may further include an isolation controller 231_7 having at least one transistor in order to control an electrical connection between the sense amplifier/write driver 231 and the pair of bit lines BL1 and /BL1. Switching of the at least one transistor included in the isolation controller 231_7 is controlled in response to a predetermined isolation control signal PISO.

The sense amplifier/write driver 231 of FIG. 12A supplies read current Ir to read data, whereas the sense amplifier/write driver 231 of FIG. 12B precharges the bit line BL1 and the complementary bit line /BL1 to read data. A read operation of the sense amplifier/write driver 231 will now be described with reference to FIGS. 12B and 12C.

First, in a precharge period, before a main read operation is performed, a precharge control signal BLP is activated, and thus, the precharge unit 231_4 precharges the bit line BL1 and the complementary bit line /BL1 to a precharge voltage Vpre.

Then, in a develop period, a word line signal WS is activated to select the write/read units WR1_1 and WR2_2 located to correspond to the first and second magnetic tracks 211_1 and 211_2, respectively. When the word line signal WS activates first and second control transistors T21 and T22, the write/read units WR1_1 and WR1_2 that are respectively connected to the first and second control transistors T21 and T22 are selected. Also, the switch controller 260 controls a switch T31 to be turned on, and then, the isolation control signal PISO is activated to turn on the at least one transistor of the isolation controller 231_7.

Because the bit line BL1 is precharged to the precharge voltage Vpre, the bit line BL1, a selected magnetic domain of the first magnetic track 211_1, and a ground voltage source GND form a first discharge path together. Also, because the complementary bit line /BL1 is also precharged to the precharge voltage Vpre, the complementary bit line /BL1, a selected magnetic domain of the second magnetic track 211_2, and the ground voltage source GND form a second discharge path together. The magnetic domain of the first magnetic track 211_1 is magnetized in a direction opposite to the direction of magnetization of the magnetic domain of the second magnetic track 211_2, and, thus, resistances of these magnetic domains are different from each other. Accordingly, an amount of decrease in the voltage of the bit line BL1 in the first discharge path is different from that of decrease in the voltage of the complementary bit line /BL1 in the second discharge path, and thus, the voltages of the bit line BL1 and the complementary bit line /BL1 are different from each other. As illustrated in FIG. 12C, a voltage difference occurs between the bit line BL1 and the complementary bit line /BL1 in the develop period.

Next, in a sensing period, the sense amplifier driving unit 231_6 activates the sense amplifier unit 231_5 in response to predetermined sense amplifier driving signals PSA and /PSA. In the sensing period, the sense amplifier unit 231_5 amplifies the difference between a voltage V(BL) of the bit line BL1 and a voltage V(/BL) of the complementary bit line /BL1. Then, data read is temporarily stored in a latch (not shown) of the sense amplifier/write driver 231.

Figure 13:
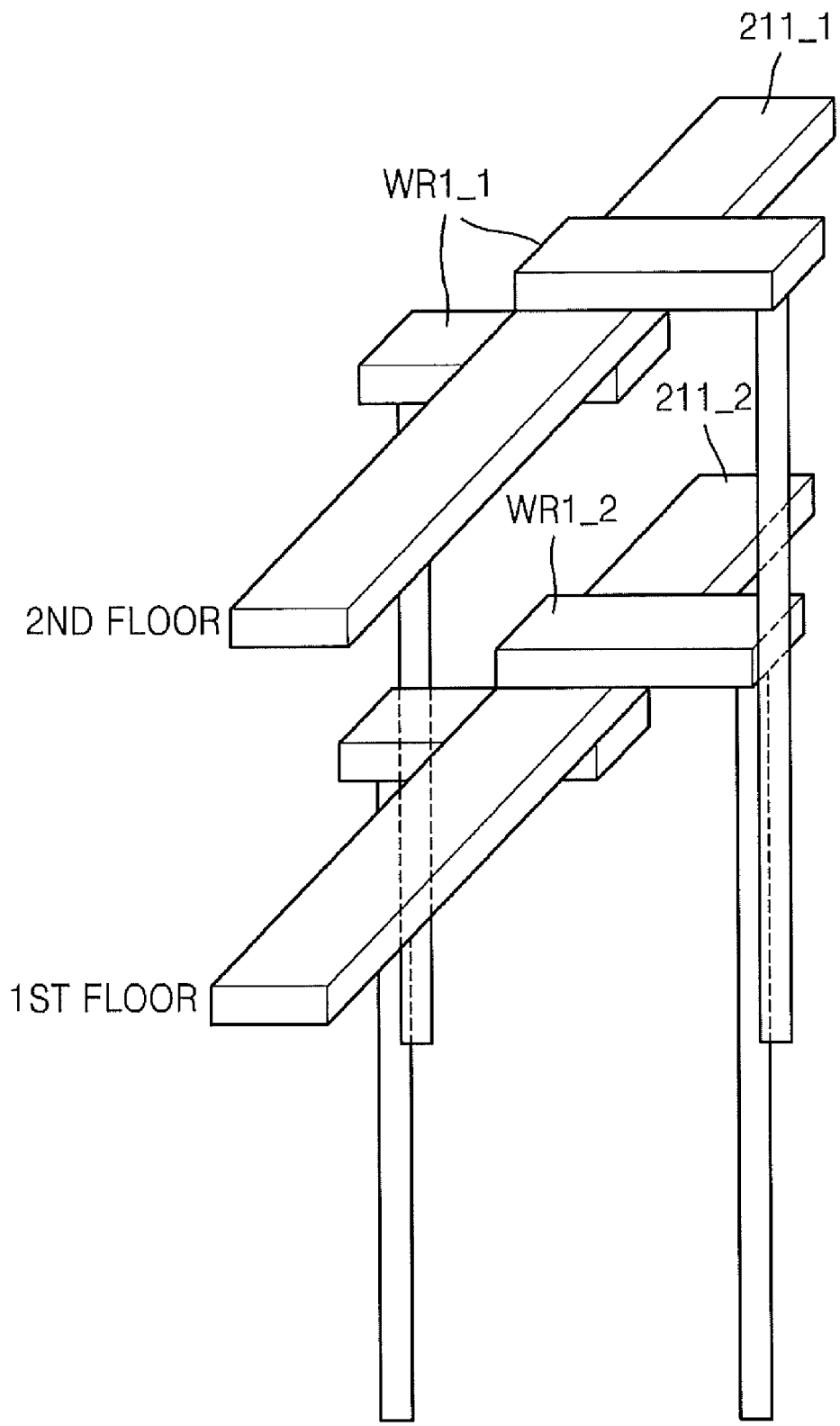
FIG. 13 is a diagram illustrating the construction of a pair of magnetic tracks included in the information storage device of FIG. 9, according to some embodiments of the present inventive subject matter.

FIG. 13 is a diagram illustrating the constructions of a pair of magnetic tracks included in the information storage device 200 of FIG. 9 according to some embodiments of the present inventive subject matter. Referring to FIG. 13, a pair of magnetic tracks includes a first magnetic track 211_1 and a second magnetic track 211_2. A first write/read unit WR1_1 is disposed to correspond to the first magnetic track 211_1, and a second write/read unit WR1_2 is disposed to correspond to the second magnetic track 211_2.

The first magnetic track 211_1 for storing main data and the second magnetic track 211_2 for storing complementary data corresponding to the main data, may be stacked perpendicularly to each other. That is, the first magnetic track 211_1 and the second magnetic track 211_2 are electrically connected to each other and may share a selection transistor (not shown). Thus, pairs of two magnetic tracks may be stacked perpendicular to each other.

Figure 14:
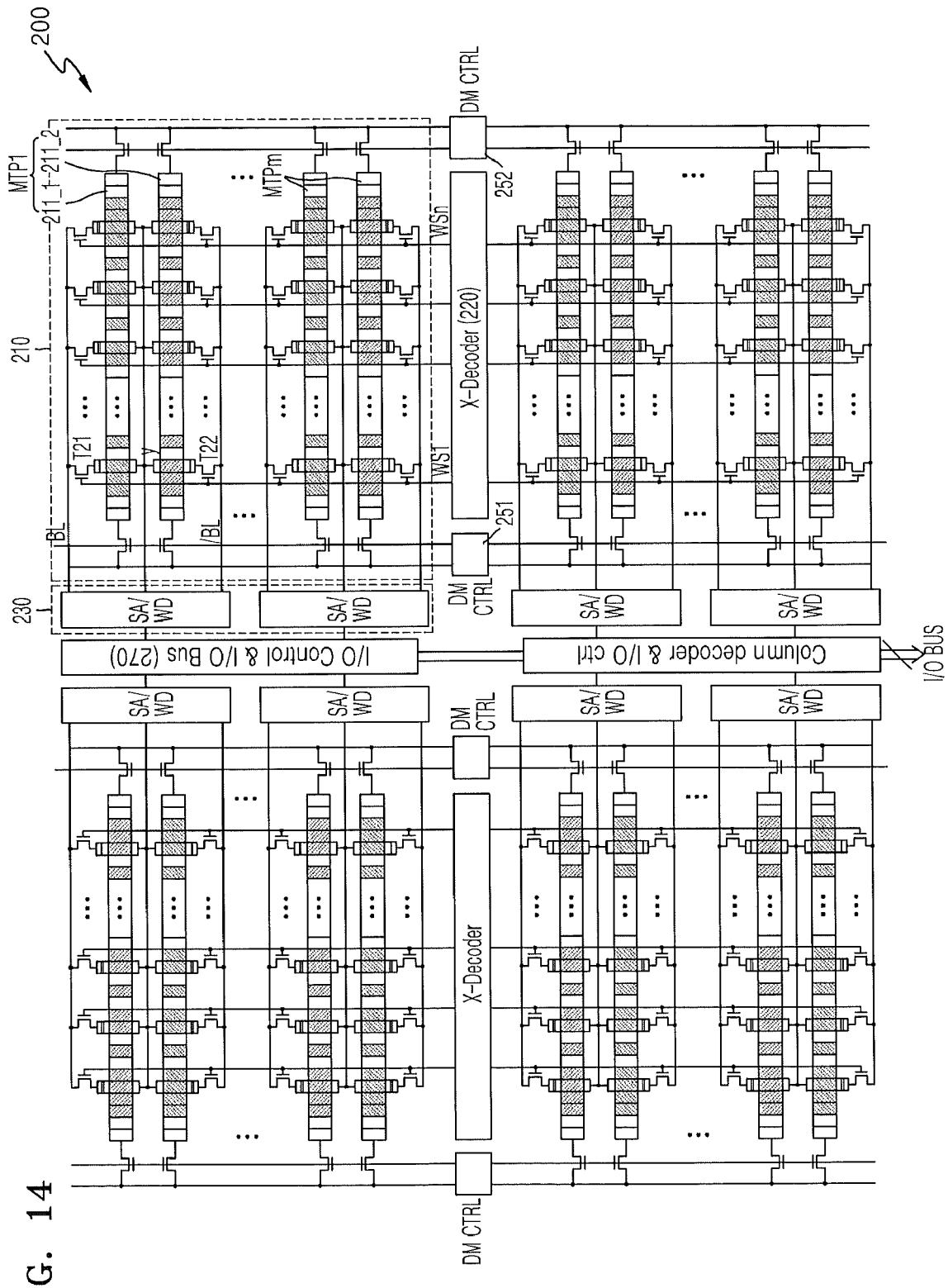
FIG. 14 is a circuit diagram illustrating the overall construction of the information storage device of FIG. 9, according to some embodiments of the present inventive subject matter.

FIG. 14 is a circuit diagram illustrating the overall construction of an information storage device 200 according to some embodiments of the present inventive subject matter. Referring to FIG. 14, the information storage device 200 according to some embodiments of the present inventive subject matter comprises a plurality of memory units 210, and may comprise a plurality of row decoders (X-Decoder) 220, a plurality of sense amplifier write/read controllers (SA/WD) 230, a plurality of first and second domain controllers 251 and 252, and a plurality of input/output (I/O) controllers 270 to drive the memory units.

Also, as described above, each of the memory units may comprise a plurality of pairs of magnetic tracks. For example, a first memory unit 210 includes m pairs of magnetic tracks MTP1 to MTPm.

n write/read units W/R_1 to W/R_n (as shown in FIG. 12B) may be arranged in each of a plurality of memory tracks included in the first memory unit 210. The n write/read units W/R_1 to W/R_n may be arranged at equal intervals in each of the magnetic tracks. To select the n write/read units W/R1 to W/R_n, the corresponding row decoder 220 generates first to $n^{th}$ word line signals WS1 to WSn and supplies them to gates of the n write/read units W/R_1 to W/R_n, respectively.

In the first memory unit 210 according to some embodiments of the present inventive subject matter, a first control transistor T21 is disposed between a bit line BL and a first magnetic track 211_1 and a second control transistor T22 is disposed between a complementary bit line /BL and a second magnetic track 211_2. However, an additional control transistor may be further disposed to correspond to the pair of magnetic tracks MTP1. For example, an additional control transistor may be further disposed between the first magnetic track 211_1 and a node y, and an additional control transistor may be further disposed between the second magnetic track 211_2 and the node y. The additional control transistors may be controlled in response to the word line signal WS1 that also is used to control the first and second control transistors T21 and T22.

To select the pairs of magnetic tracks MTP1 to MTPm, a plurality of selection signals are supplied thereto, respectively. Referring to FIG. 14, the first and second domain controllers 251 and 252 generate selection signals to select the pairs of magnetic tracks MTP1 to MTPm, in response to an external address. However, as described above, the information storage device 200 may further include a column decoder (not shown) to receive the external address and to generate the selection signal.

When a peripheral circuit is used to drive the memory units, the peripheral circuit may be arranged to be shared by at least two memory units from among the memory units. Referring to FIG. 14, one of the row decoders (X-Decoder) 220 may not only drive the first memory unit 210 but also supply word line signals to other memory units. For example, the row decoder (X-Decoder) 220 may also be used to drive a memory unit that is perpendicularly adjacent to the first memory unit 210. Similarly, the write/read controllers (SA/WD) 230 and the first and second domain controllers 251 and 252 may also be commonly used by at least two memory units.

Referring to FIG. 14, each of the I/O controllers 270 is connected to at least one of the write/read units W/R_1 to W/R_n. Operations of the I/O controller 270 will now be described with respect to the write/read controller 230.

The I/O controller 270 receives write data from the outside and supplies it to the write/read controller 230, or receives read data from the write/read controller 230 and supplies it to the outside. The I/O controller 270 may include an I/O bus to supply predetermined bit data, and may include a controller, e.g., a switch unit (not shown), to control the supply of data via the I/O bus. For example, if the I/O bus is capable of transmitting a plurality of pieces of 16-bit data in parallel, the I/O controller 270 divides m-bit data read from the first memory unit 210 into several pieces of 16-bit data and delivers them to the outside sequentially. In a write operation, the I/O bus divides write data, which is received from the outside, into several pieces of 16-bit data and delivers them to the write/read controller 230 sequentially.

Figure 15:
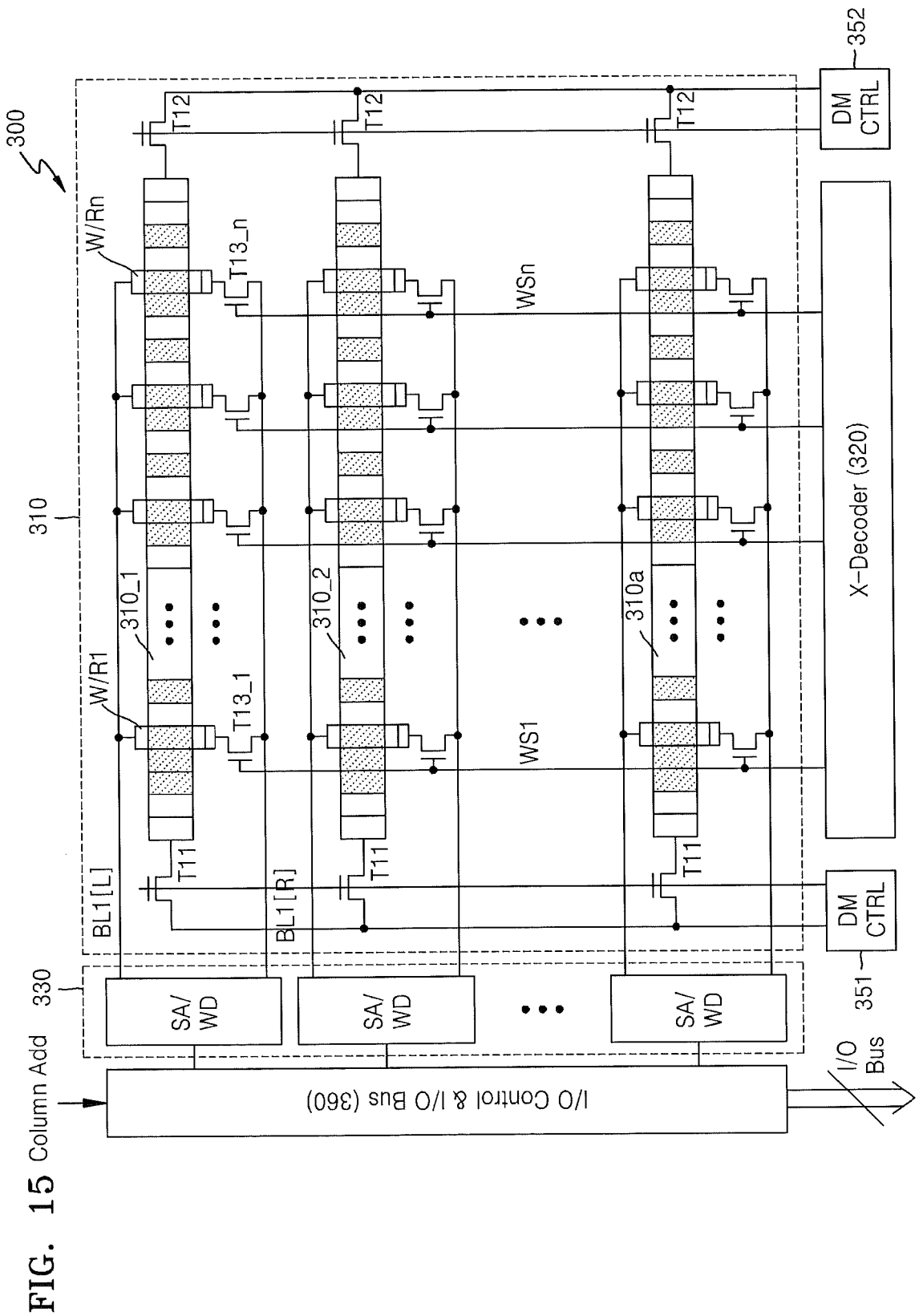
FIG. 15 is a circuit diagram of an information storage device using magnetic domain wall movement, according to another embodiment of the present inventive subject matter.

FIG. 15 is a circuit diagram of an information storage device 300 using magnetic domain wall movement according to another embodiment of the present inventive subject matter. In the current embodiment, each of a plurality of magnetic tracks included in a main magnetic track unit is divided into a region storing first type data and a region storing second type data. For example, to perform a write/read operation, a plurality of magnetic domains is allocated to one of first to $n^{th}$ write/read units W/R1 to W/Rn. A first type data is stored in some of the magnetic domains and second type data is stored in the remaining magnetic domains. The first type data may be program data that needs to be read at high speeds and the second type data may be storage data that may be read at relatively low speeds.

Referring to FIG. 15, the information storage device 300 according to the present embodiment may include a memory unit 310, a row decoder 320 and a write/read controller 330. The write/read controller 330 may include at least one sense amplifier/write driver SA/WD that is disposed to correspond to a plurality of magnetic tracks, respectively. As illustrated in FIG. 15, the first to $n^{th}$ write/read units W/R1 to W/Rn may be arranged to correspond to each of the magnetic tracks, respectively, and first to $n^{th}$ control transistors T13_1 to T13_n may be respectively arranged to correspond to the first to $n^{th}$ write/read units W/R1 to W/Rn to selectively activate the first to $n^{th}$ write/read units W/R1 to W/Rn.

First and second domain controllers 351 and 352 may be disposed to correspond to the memory unit 310. FIG. 15 illustrates that the first and second domain controllers 351 and 352 control first and second selection transistors T11 and T12 to select the magnetic tracks, but the information storage device 300 may further include an additional block selection control unit to control the first and second selection transistors T11 and T12. The information storage device 300 may further include an I/O controller 360 to control input or output of read/write data.

To increase the speed of data processing, the concept of pages is generally applied in the case of DRAM. That is, in a DRAM, data is sensed in units of pages each having a plurality of bits from a memory core, and is then transmitted to a sense amplifier that is embodied similar to a static random access memory (SRAM) cell. Then, the DRAM randomly accesses the data transmitted to the sense amplifier. That is, the data, which is transmitted in units of pages, is randomly accessed by using a column address.

The concept of pages may also be applied to the information storage device 300 of FIG. 15 according to the present embodiment. That is, a plurality of magnetic tracks, e.g., a magnetic tracks, are selected by a common word line, and thus, a-bit data that may be processed in a parallel manner may be defined to be one page. Data is sensed in units of pages and is transmitted to the write/read controller 330, and the transmitted a-bit data is randomly accessed. For the random access, the I/O controller 360 may receive a column address.

Figure 16A:
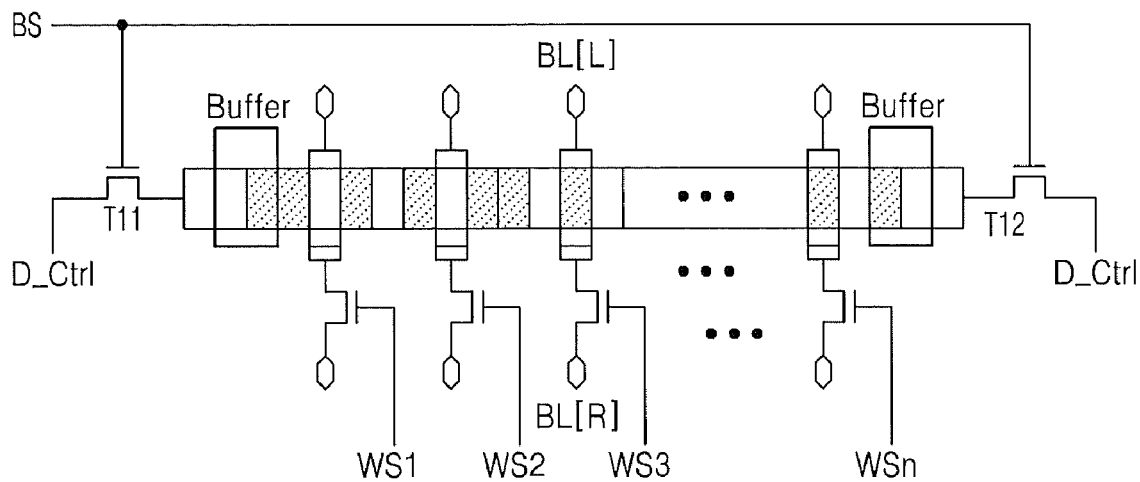
FIGS. 16A and 16B are circuit diagrams of a magnetic track and control transistors that are included in a memory unit included in the information storage device of FIG. 15, according to some embodiments of the present inventive subject matter.

FIG. 16A is a circuit diagram of a magnetic track and control transistors T11 and T12 that are included in the memory unit 310 included in the information storage device 300 of FIG. 15, according to some embodiments of the present inventive subject matter. Referring to FIG. 16A, one control transistor may be disposed to correspond to one write/read unit. For example, when n write/read units are disposed to correspond to one magnetic track, first to $n^{th}$ word line signals WS1 to WSn are supplied to gates of n control transistors, respectively. First and second transistors T11 and T12 may be disposed as selection transistors at both ends of the magnetic track. A block selection signal BS may be supplied to gates of the first and second transistors T11 and T12 to control selection of magnetic tracks, and a domain control signal D_Ctrl may be supplied to drain electrodes of the first and second transistors T11 and T12.

Because an information storage device according to some embodiments of the present inventive subject matter stores data by using magnetic domain movement, a buffer may be included in each of a plurality of magnetic tracks to temporarily store data. For example, a buffer may be disposed at one end of each of the magnetic tracks, at both ends of each of the magnetic tracks, or between both ends of each of the magnetic tracks. When one write/read unit performs a write/read operation on a magnetic domains, the buffer may have a or more magnetic domains. FIG. 16A illustrates that two buffers are disposed at both ends of the magnetic track, respectively, and in this case, the buffers may include a/2 or more magnetic domains.

Figure 16B:
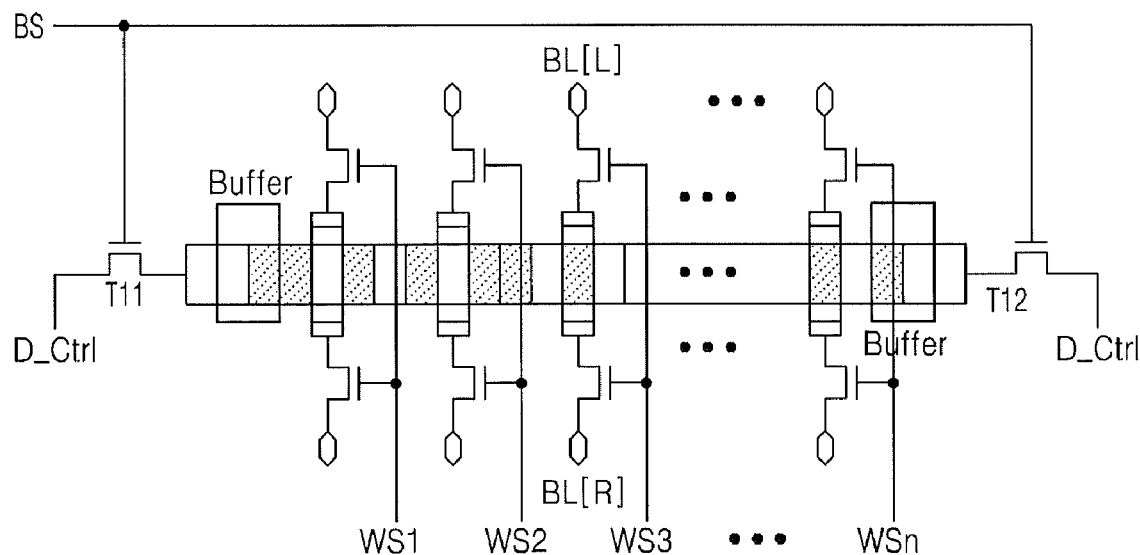

FIG. 16B is a circuit diagram of a magnetic track and control transistors T11 and T12 that are included in the memory unit 310 included in the information storage device 300 of FIG. 15, according to another embodiment of the present inventive subject matter. FIG. 16B illustrates that two control transistors are disposed to correspond to each of a plurality of write/read units, respectively. The each control transistor pair is controlled in response to the same word line signal. For example, when first control transistors are respectively disposed at both ends of a first write/read unit, a first word line signal WS1 is commonly supplied to gates of the first control transistors. First and second transistors T11 and T12 may be disposed as selection transistors at both ends of the magnetic track. A block selection signal BS may be supplied to gates of the first and second transistors T11 and T12 to control selection of magnetic tracks, and a domain control signal D_Ctrl may be supplied to drain electrodes of the first and second transistors T11 and T12.

According to the current embodiment, it may be possible to reduce noise effects when a write/read operation is performed. For example, in a write operation, write current is supplied from one of a pair of bit lines to a magnetic track, and then to the other bit line. As illustrated in FIG. 16B, when each of a plurality of write/read units has two control transistors associated therewith, it may be possible to prevent a part of the write current from being supplied to another write/read unit (a write/read unit that is not selected) via the magnetic track.

When the concept of pages is applied to the information storage device 300, the following may be considered:

First, in the case of DRAM which is generally randomly accessed, latency may be defined by parameters, such as a period of time tRCD taken to open a page, constituting a unit of reading, a period of time tAA taken to read data from the opened page, and a period of time tRP taken to close the opened page.

A latency of the information storage device 300 of FIG. 15 according to some embodiments of the present inventive subject matter may also be defined by the parameters used to define a latency of a DRAM. That is, when data is read from the memory unit 310 of the information storage device 300, a latency may be defined by a period of time tRCD taken to open a page by using magnetic domain movement, a period of time tAA taken to read data from the opened page, and a period of time tRP taken to close the opened. As described above with reference to FIGS. 15 and 16, data stored in a magnetic domains (one piece of data, for example, is stored in each of magnetic tracks) that is selected in response to the same word line signal, may be defined to be a page. Because data is read in units of pages, data is sensed in the units of pages from a memory core (a plurality of magnetic tracks in the case of the inventive concept), and then, subsequent operations may be performed similar to those performed in DRAM. Thus, the information storage device 300 may include peripheral circuits similar to those of DRAM in order to drive a memory core.

Figure 17A:
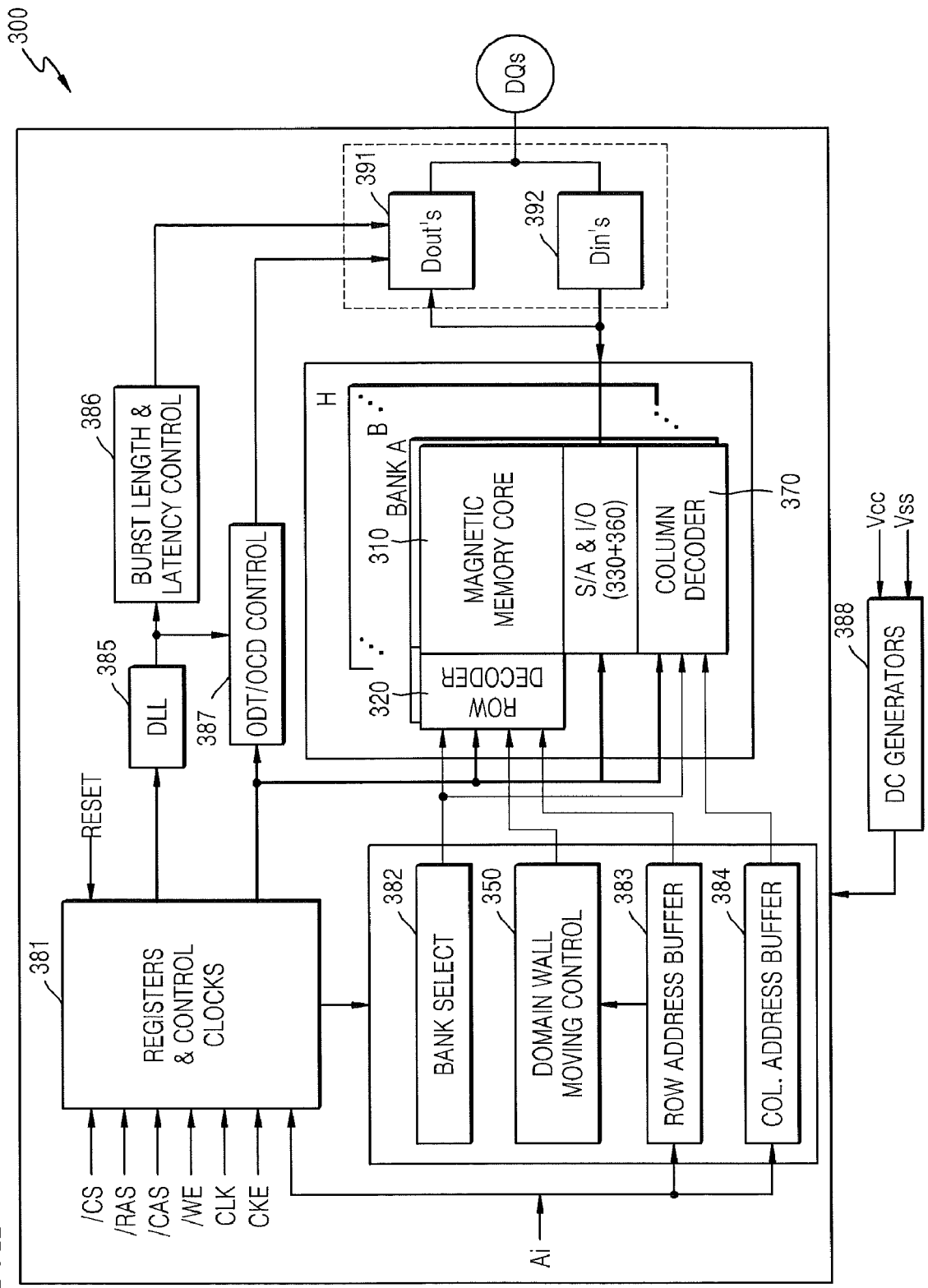
FIGS. 17A to 17c are a block diagram of the information storage device of FIG. 15 and waveform diagrams for explaining the operating characteristics thereof, according to some embodiments of the present inventive subject matter.
Figure 17B:
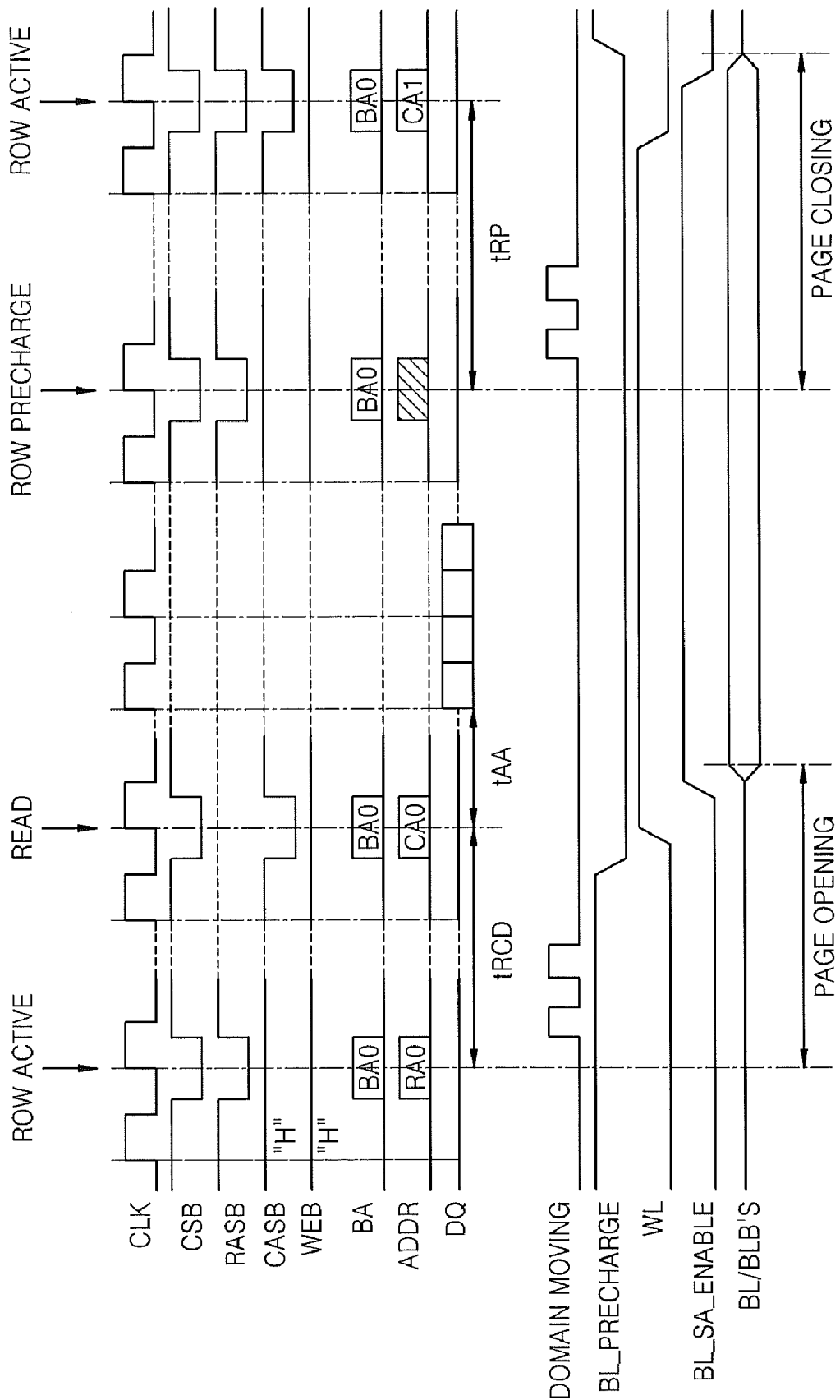
Figure 17C:
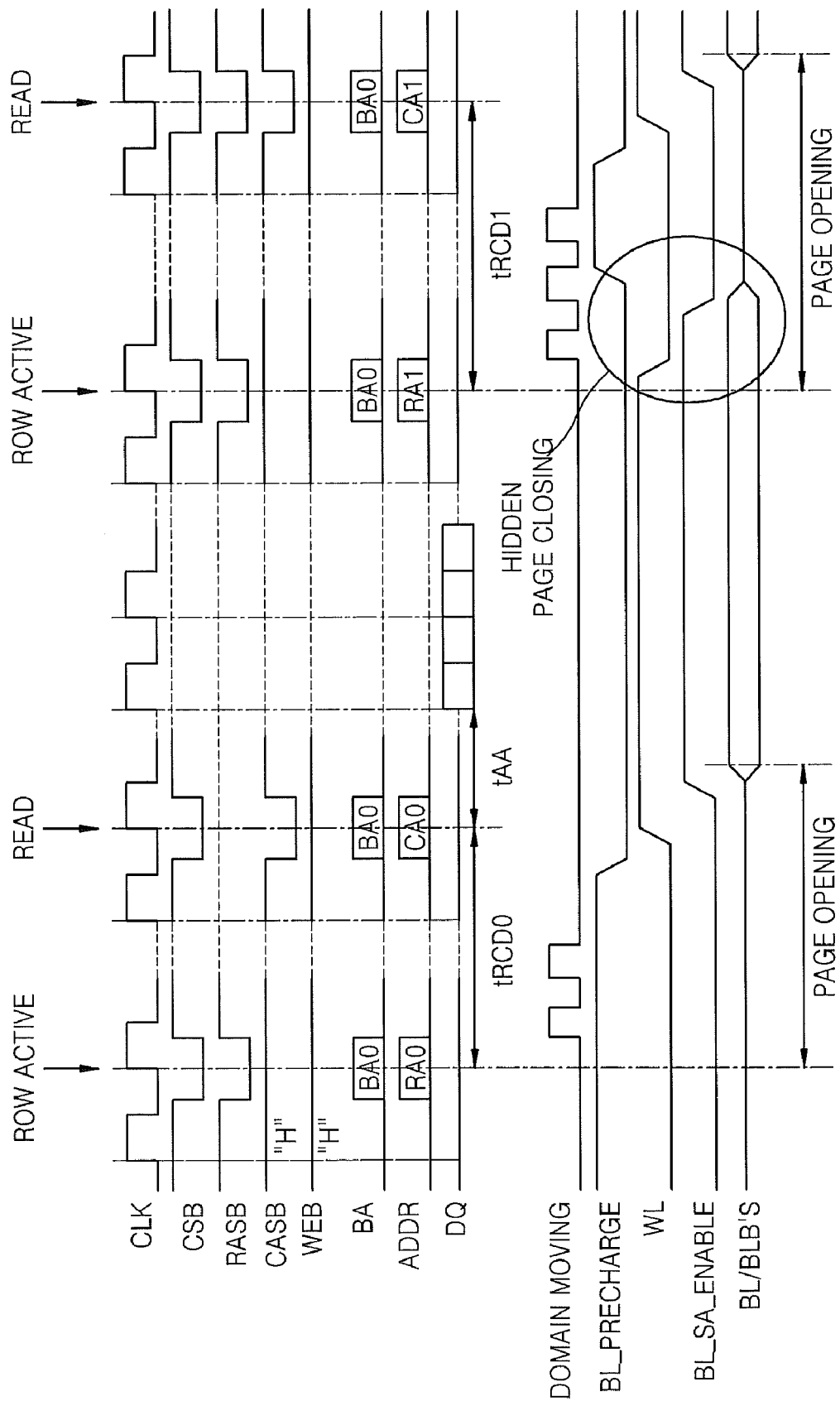

FIGS. 17A to 17C are a block diagram of the information storage device 300 of FIG. 15 and waveform diagrams for explaining the operating characteristics thereof according to some embodiments of the present inventive subject matter. FIG. 17A illustrates the information storage device 300 of FIG. 15 and peripheral circuits therefor.

Referring to FIG. 17A, the information storage device 300 according to some embodiments of the present inventive subject matter includes a memory unit 310 having a plurality of memory tracks, a row decoder 320 disposed according to the core characteristics of the memory unit 310, a write/read controller and I/O controller 330 and 360, and a column decoder 370. The information storage device 300 may further include a bank selection unit 382 that selects a bank of the memory unit 310, a domain controller 350 that controls magnetic domains of selected magnetic tracks, a row address buffer 383 that temporarily stores an external row address, and a column address buffer 384. The information storage device 300 may further include peripheral circuits included in DRAM, e.g., a control clock generation unit 381 that receives various commands and clock signals CS, /RAS, /CAS, /WE, CLK, and CKE and generates various control clock signals, a delay-locked loop (DLL) unit 385, a burst length and latency controller 386, an on-die termination/off chip drive (ODT/OCD) controller 387, a data output unit 391, a data input unit 392, etc. The information storage device 300 may further include a power supply voltage generation unit 388 that generates a power supply voltage to be applied to these peripheral circuits.

FIG. 17B is a waveform diagram for explaining an operation of the information storage device 300 according to some embodiments of the present inventive subject matter. Referring to FIG. 17B, a time required to perform an operation, e.g., a read operation, of the information storage device 300 may be defined by the above-described parameters, i.e., the periods of time tRCD, tAA, and tRP.

In the period of time tRCD, domain control is performed on a plurality of magnetic tracks so that those magnetic domains from which data is to be read are moved to be located at a write/read unit, and read current is supplied to the magnetic domains to sense the data stored in the magnetic domains. The period of time tRCD varies according to the distance between a selected page and the write/read unit. For example, the farther the distance between the write/read unit and the selected page, the more time is required to perform the domain control so that magnetic domains storing the selected page are moved to be positioned at the write/read unit, but the shorter the distance between the write/read unit and the selected page, the less time is required to perform the domain control. Since each write/read unit performs a write/read operation on a plurality of magnetic domains, some of the magnetic domains may have a relatively short period of time tRCD and some of the magnetic domains may have a relatively long period of time tRCD.

When the sensing of the data changes a voltage of a bit line, in the period of time tAA, actual data is read by developing the voltage of the bit line. In the information storage device 300, an operation performed in the period of time tAA is overall the same as that performed in the period of time tAA in the case of DRAM. Thus, according to an embodiment of the inventive concept, an operation performed in the period of time tAA may be similar to that performed in conventional memory devices, e.g., DRAM.

In the period of time tRP, an open page is closed to prepare for a subsequent read operation. In the case of DRAM, a bit line is precharged in the period of time tRP. However, in the period of time tRP according to an embodiment of the inventive concept, the magnetic domains moved in the preceding period of time tRCD are returned back to the original position. For example, if a magnetic domain positioned at the write/read unit is moved from a reference magnetic domain to a selected magnetic domain, magnetic domain movement is performed again to position the reference magnetic domain again at the write/read unit in the period of time tRP.

In the current embodiment, the period of time tRP may be omitted. That is, if a first magnetic domain is located on the write/read unit in a previous page read operation, locating of the reference magnetic domain again on the write/read unit before a subsequent page read operation may be omitted. In this case, if a second magnetic domain is selected during the subsequent page read operation, a magnetic domain located on the write/read unit is moved from the first magnetic domain to the second magnetic domain in order to perform a write/read operation on the second magnetic domain. FIG. 17C is a waveform diagram for explaining an operation of the information storage device 300 of FIG. 15, in which the period of time tRP is omitted, according to another embodiment of the present inventive subject matter.

FIGS. 18A to 18D are circuit diagrams for explaining an operation of the information storage device 300 of FIG. 15 according to some embodiments of the present inventive subject matter. For convenience of explanation, a method of performing a write/read operation on one magnetic track will be described.

Figure 18A:
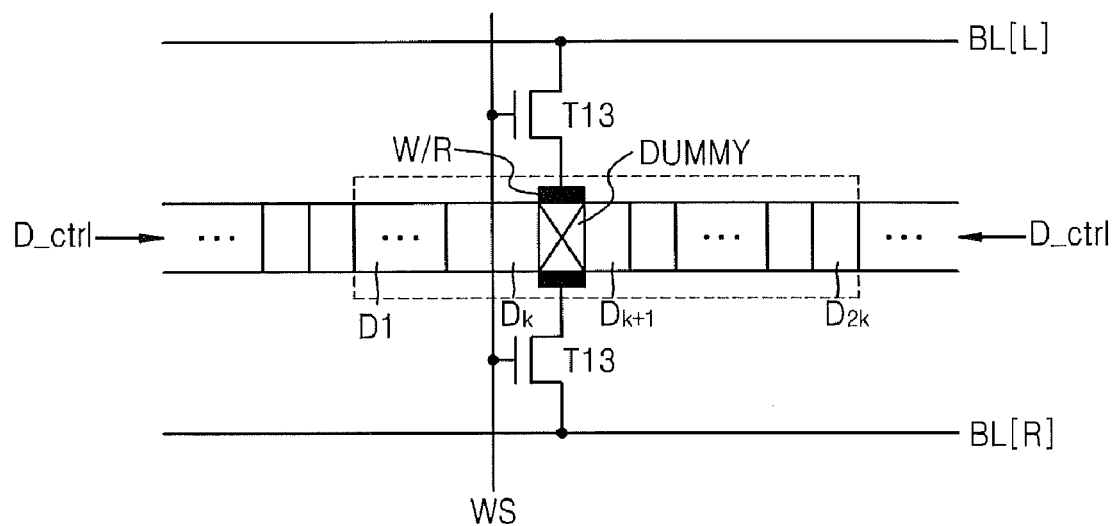
FIGS. 18A to 18D are circuit diagrams for explaining an operation of the information storage device of FIG. 15, according to some embodiments of the present inventive subject matter.

Referring to FIG. 18A, a pair of bit lines BL[L] and BL[R] is disposed to correspond to one magnetic domain and a write/read unit W/R is disposed between the pair of bit lines BL[L] and BL[R] and the magnetic track. Also, at least one control transistor T13 is disposed between the pair of bit lines BL[L] and BL[R] and the write/read unit W/R. Switching of the at least one control transistor T13 is controlled in response to a word line signal WS.

One of m magnetic domains is located on the write/read unit W/R in response to a domain control signal D_Ctrl. For example, the m magnetic domains may include 2 k+1 magnetic domains (k is an integer that is equal to or greater than 1). A magnetic domain that is located halfway between the 2 k+1 magnetic domains, is a dummy magnetic domain that is not actually used to store data. The dummy magnetic domain is determined to be a reference magnetic domain.

The m magnetic domains include the reference magnetic domain, k magnetic domains located to the left side of the reference magnetic domain, and k magnetic domains located to the right side of the reference magnetic domain. The reference magnetic domain is located on the write/read unit W/R before a read operation is performed. If a page including a $k^{th}$ magnetic domain Dk is selected according to a row address (or a first group address included in the row address), the $k^{th}$ magnetic domain Dk is moved to be positioned at the write/read unit W/R in response to the domain control signal D_Ctrl in a period of time tRCD. Because the $k^{th}$ magnetic domain Dk is located adjacent to the reference magnetic domain, only one magnetic domain is moved in response to the domain control signal D_Ctrl consisting of one current pulse. Thus, the period of time tRCD is relatively short.

If a page including a first magnetic domain D1 is selected according to a row address, the first magnetic domain D1 is moved to be positioned at the write/read unit W/R in response to the domain control signal D_Ctrl in the period of time tRCD. In this case, because k magnetic domains are moved in response to the domain control signal D_Ctrl having k current pulses, the period of time tRCD is relatively long.

The characteristics of the period of time tRCD are similar to those of a period of time tRP. That is, when data is read from the $k^{th}$ magnetic domain Dk in the period of time tRCD, the reference magnetic domain is moved to be positioned again at the write/read unit W/R by moving only one magnetic domain. However, when data is read from the first magnetic domain D1 in the period of time tRCD, the $k^{th}$ magnetic domain Dk is moved again to position the reference magnetic domain again at the write/read unit W/R, and in this case, the period of time tRP is relatively long.

In consideration of the above-described operation of the information storage device 300, some of the m magnetic domains for which data is written to or read from by using one write/read unit are used to store first type data, and some of the m magnetic domains are used to store second type data. Specifically, from among the m magnetic domains, magnetic domains near the reference magnetic domain are used to store data that may be desirable to process at high speeds, e.g., program data, and the remaining magnetic domains distant from the reference magnetic domain are used to store data that may be processed at low speeds, e.g., storage data.

Figure 18B:
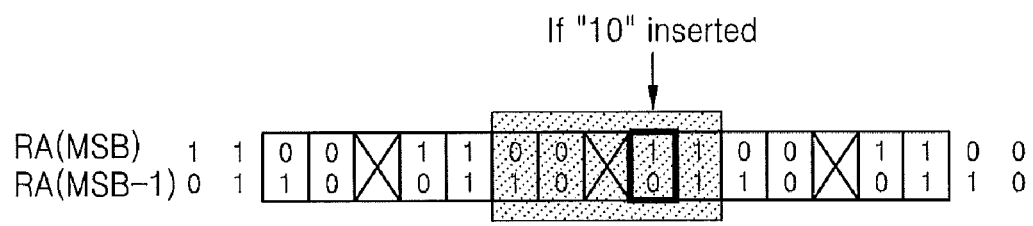
Figure 18B:
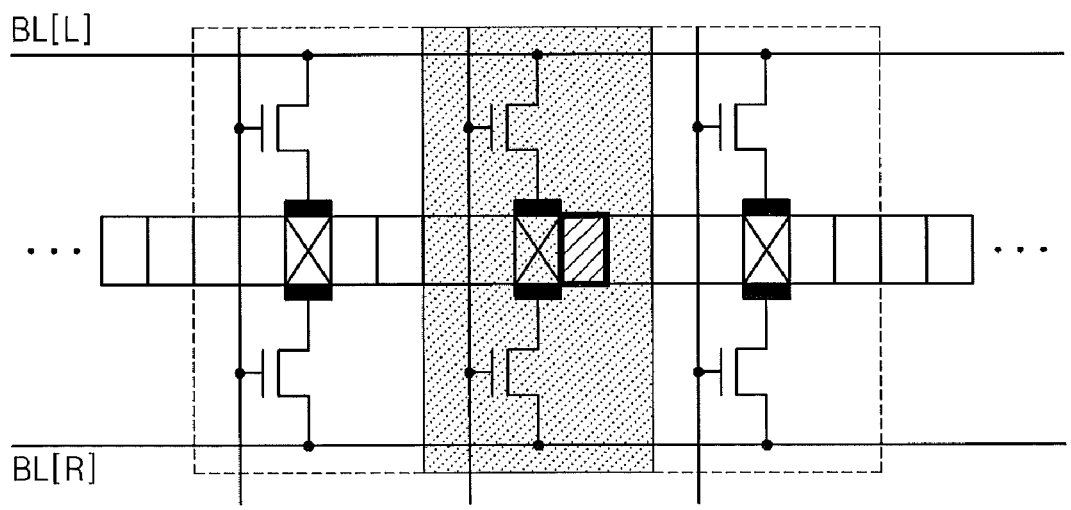

FIG. 18B is a circuit diagram for explaining an operation of the information storage device 300 of FIG. 15 when k is '2' in FIG. 18A according to another embodiment of the present inventive subject matter. If k is '2', information is stored in four magnetic domains by one write/read unit, and thus, a second group address may be two bits long. A row address having a plurality of bits may be provided for addressing from the outside, and the second group address may consist of most significant two bits of the row address.

As illustrated in FIG. 18B, the selection of the m magnetic domains may be determined by decoding the second group address. For example, two magnetic domains adjacent to a reference magnetic domain are addressed as "00" and "10" and two magnetic domains adjacent to the respective two adjacent magnetic domains may be addressed as "01" and "11", respectively. In this case, if a most significant bit MSB of the row address is "1", then the magnetic domain located to the right side of the reference magnetic domain is selected. If the most significant bit MSB of the row address is "0", then the magnetic domain located to the left side of the reference magnetic domain is selected. If a second most significant bit MSB-1 of the row address is "1", then the two magnetic domains adjacent to the respective two adjacent magnetic domains are selected. If the second most significant bit MSB-1 of the row address is "0", the magnetic domains adjacent to the reference magnetic domain are selected.

Figure 18C:
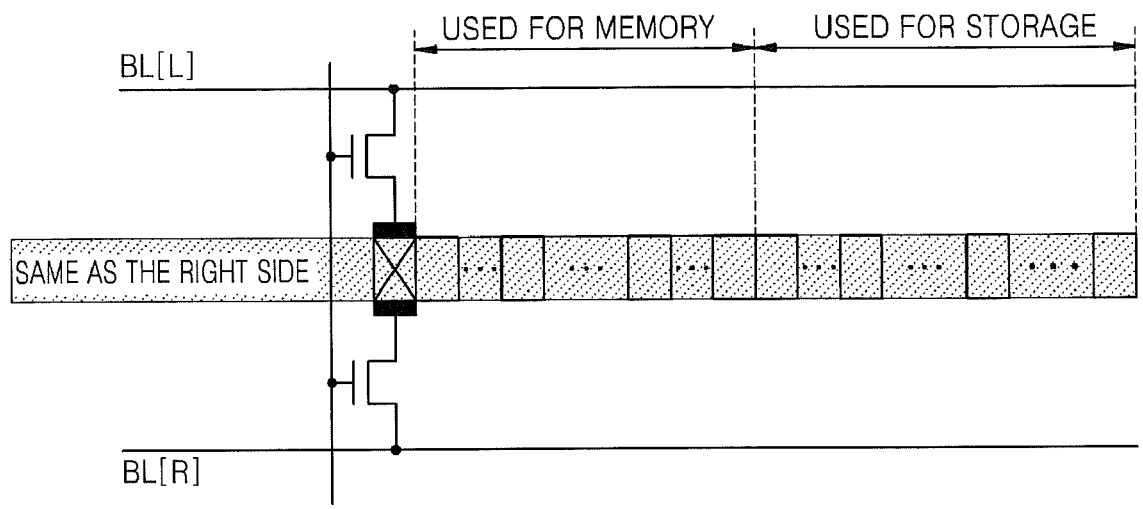

FIG. 18C is a circuit diagram for explaining an operation of the information storage device 300 of FIG. 15 when k is a value that is greater than 2 in FIG. 18B according to another embodiment of the present inventive subject matter. Referring to FIG. 18C, a plurality of magnetic domains that are driven by one write/read unit may include a reference magnetic domain and a plurality of magnetic domains located to the right and left side of the reference magnetic domain. The magnetic domains located to the right side of the reference magnetic domain may include, for example, a plurality of first magnetic domains that are relatively close to the reference magnetic domain and a plurality of second magnetic domains that are relatively far from the reference magnetic domain. The first magnetic domains are used to store first type data that needs to be processed at high speeds, and the second magnetic domains are used to store second type data that may be processed at low speeds. The first magnetic domains that are relatively close to the reference magnetic domain are used to store the first type data within a range of satisfying predetermined specifications, as the magnetic domains are processed at different speeds, respectively.

Figure 18D:
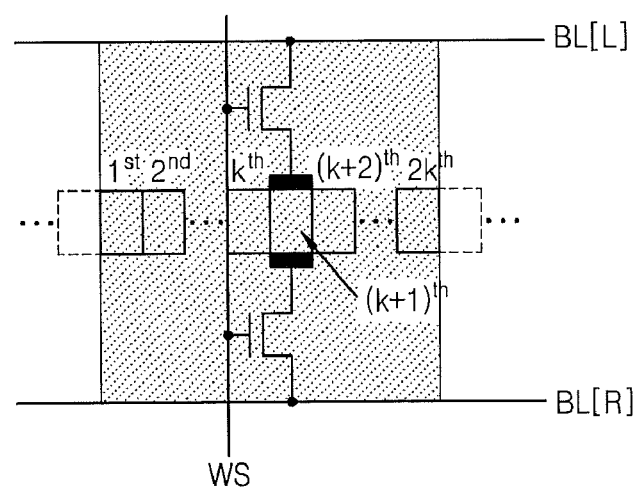

FIG. 18D is a circuit diagram for explaining an operation of the information storage device 300 of FIG. 15 when no dummy magnetic domain is used according to another embodiment of the present inventive subject matter. Referring to FIG. 18D, magnetic domains corresponding to one write/read unit may include 2 k magnetic domains (k is an integer that is equal to or greater than 1). In this case, a magnetic domain that is located nearly halfway between the 2 k magnetic domains is determined to be a reference magnetic domain. The magnetic domains that are relatively close to the reference magnetic domain are used to store first type data, and the magnetic domains that are relatively far from the reference magnetic domain are used to store second type data.

Figure 19A:
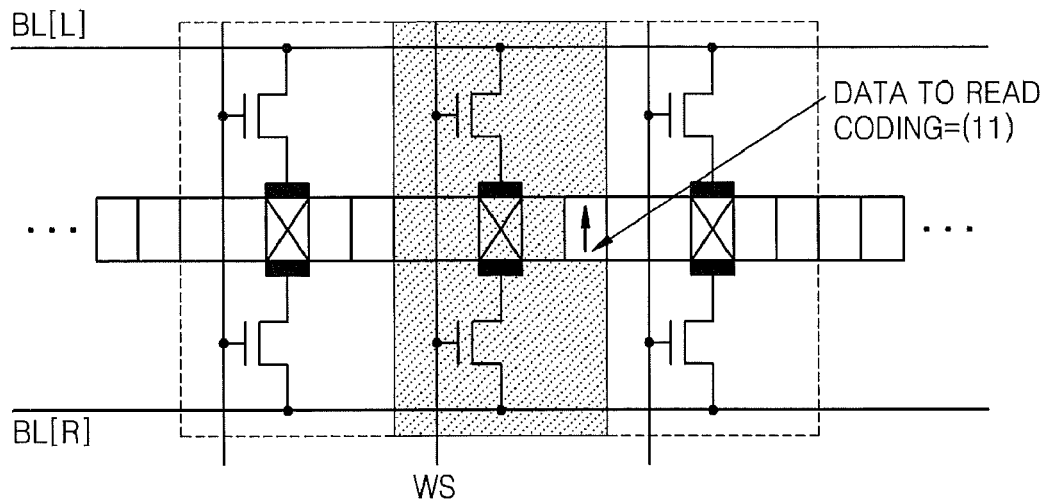
FIGS. 19A to 19C are circuit diagrams for explaining a period of time in which an open page is closed, according to some embodiments of the present inventive subject matter.
Figure 19B:
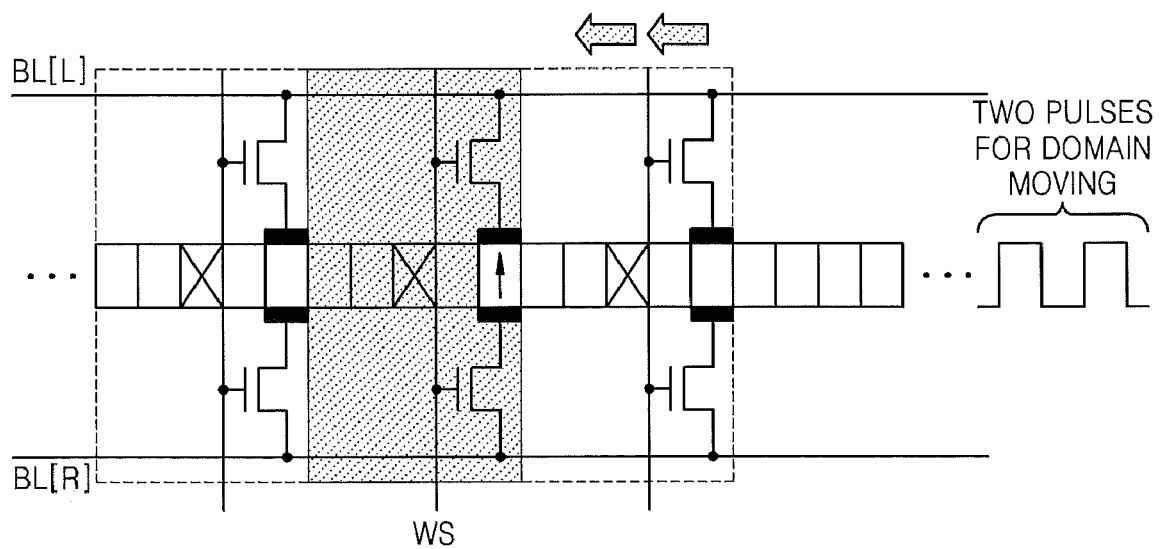
Figure 19C:
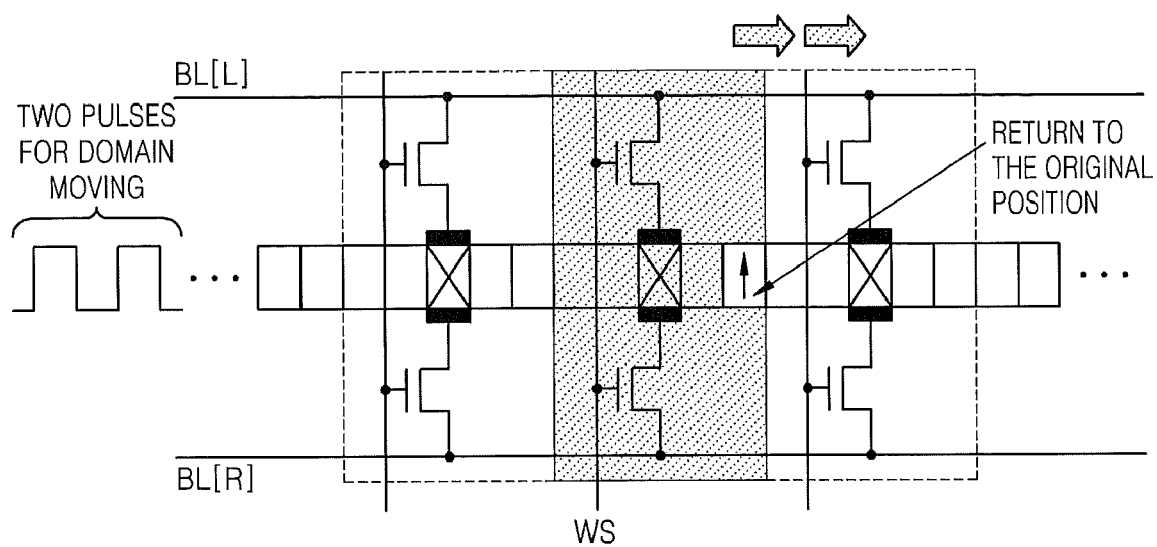

FIGS. 19A to 19C are circuit diagrams for explaining a period of time tRP in which an open page is closed according to some embodiments of the present inventive subject matter. Particularly, referring to FIGS. 19A to 19C, a reference magnetic domain is moved back to a write/read unit in the period of time tRP.

Referring to FIG. 19A, when a second group address corresponding to "11" is received, a magnetic domain that is two magnetic domains away from a reference magnetic domain to the right, is selected from a magnetic track. Thus, as illustrated in FIG. 19B, magnetic domains of the magnetic track are moved by two magnetic domains in the left direction, in response to a domain control signal having two current pulses. When the selected magnetic domain is located on the write/read unit, a write/read operation is performed on the selected magnetic domain.

Next, an operation is performed in the period of time tRP as illustrated in FIG. 19C. In this case, that the magnetic domains are moved by two magnetic domains in the left direction is determined based on the received second group address, and thus, the magnetic domains on the magnetic track are moved by two magnetic domains in the right direction in the period of time tRP, in response to a domain control signal having two current pulses. Accordingly, the reference magnetic domain is located again on the write/read unit in the period of time tRP.

FIGS. 20A to 20D are diagrams for explaining a period of time tRP in which an open page is closed, according to other embodiments of the present inventive subject matter. Particularly, referring to FIGS. 20A to 20D, a reference magnetic domain is moved back to or is not moved back to a write/read unit according to the result of address comparison in the period of time tRP.

To this end, a second group address, e.g., "11", which corresponds to a desired page is compared with another second group address corresponding to a page that is to be written or read, and the reference magnetic domain is moved back to or is not moved back to the write/read unit according to the result of comparison.

Figure 20A:
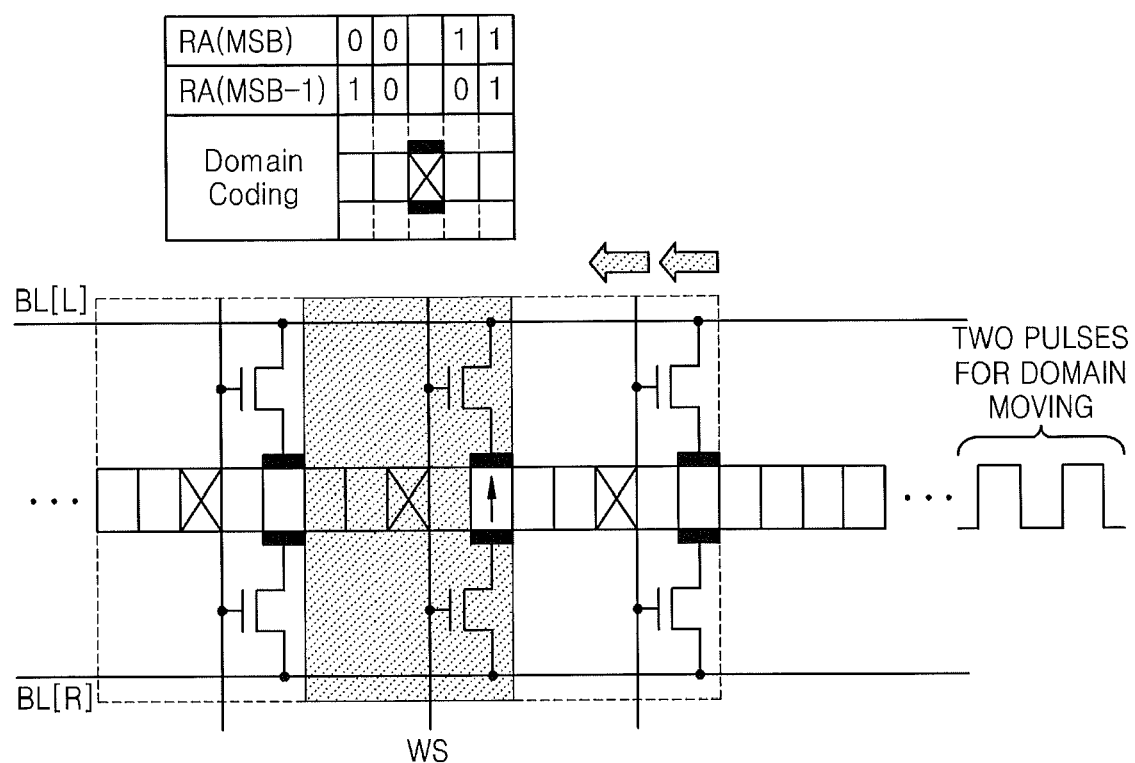
FIGS. 20A to 20D are diagrams for explaining a period of time in which an open page is closed, according to other embodiments of the present inventive subject matter.
Figure 20B:
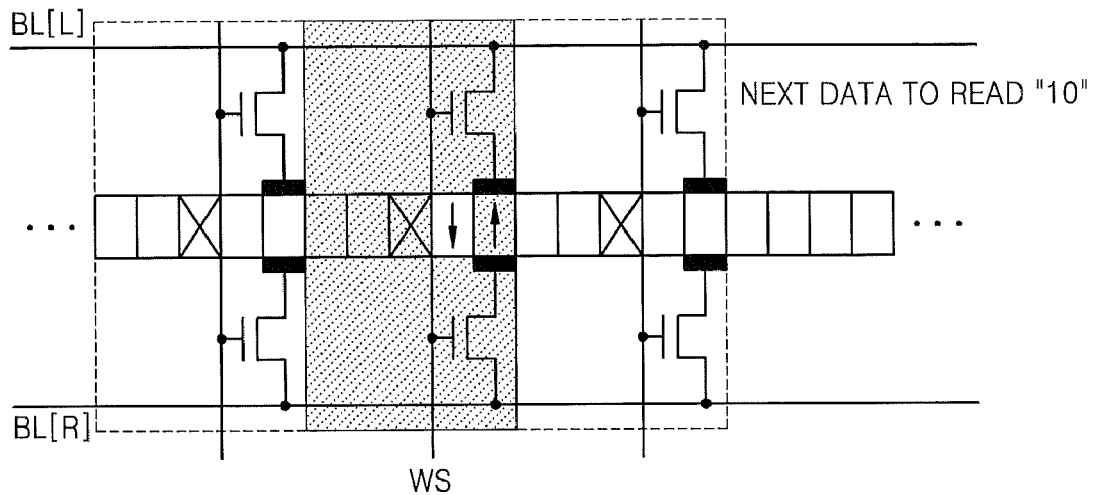
Figure 20C:
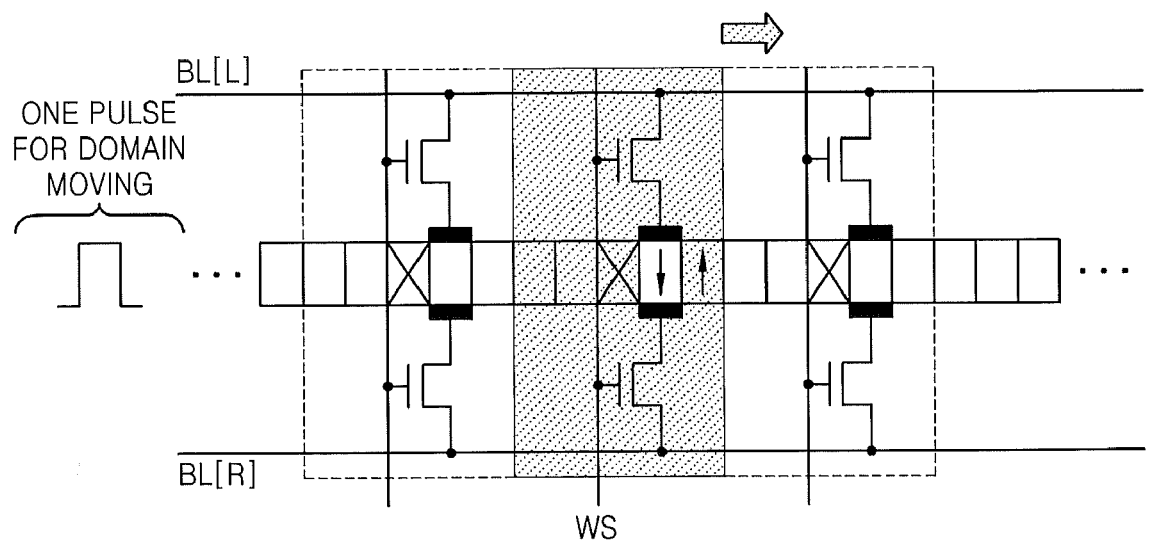

Referring to FIG. 20A, if the second group address corresponding to the page that is to be written or read is "11", then magnetic domains of a magnetic track are moved by two magnetic domains in the left direction. Then, a magnetic domain is selected and is located on the write/read unit, and a write/read operation is performed on the selected magnetic domain. Next, referring to FIG. 20B, another second group address corresponding to a subsequent page is received and compared with the second group address corresponding to the current page. If the second group address corresponding to the subsequent page is "10", then the current page is adjacent to the subsequent page. In this case, the period of time tRP in which the reference magnetic domain is moved back to the write/read unit, is omitted. If the second group address corresponding to the subsequent page is "01" or "00", the magnetic domain that is currently selected is relatively far from a magnetic domain that is to be selected. In this case, the reference magnetic domain is moved back to the write/read unit in the period of time tRP. FIG. 20C is a circuit diagram for explaining a method of performing a write/read operation on the subsequent page without moving the reference magnetic domain back to the write/read unit, according to an embodiment of the inventive concept.

Figure 20D:
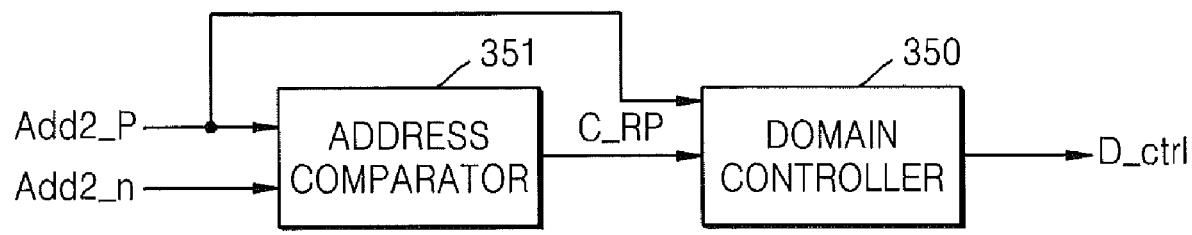

Whether the reference magnetic domain is to be moved back to the write/read unit may be determined by simply comparing second group addresses with each other. Referring to FIG. 20D, the information storage device 300 of FIG. 15 may further include a domain controller 350 for moving magnetic domains of a magnetic track, and an address comparator 351 that compares at least one bit of a second group address Add2_$p$ corresponding to a current page with at least one bit of a second group address Add2_$n$ corresponding to a subsequent page. The address comparator 351 generates a comparison signal C_RP indicating the result of comparison and provides it to the domain controller 350. For example, a most significant bit of a second group address corresponding to magnetic domains located in the right direction of a reference location may be "1", but a most significant bit of a second group address corresponding to magnetic domains located in the left direction of the reference location may be "0". If both the most significant bits of the second group address Add2_p corresponding to the current page and the second group address Add2_n corresponding to the subsequent page are "1", then it means that magnetic domains located to the right side of the reference magnetic domain are selected when a current or subsequent write/read operation is performed. In this case, the domain controller 350 does not move the reference magnetic domain back to the write/read unit, in response to the comparison signal C_RP.

If the most significant bits of the second group address Add2_p corresponding to the current page and the second group address Add2_n corresponding to the subsequent page are not equal to each other, then it means that magnetic domains located in the opposite directions from the reference magnetic domain are selected when a current or subsequent write/read operation is performed. In this case, the domain controller 350 moves the reference magnetic domain back to the write/read unit, in response to the comparison signal C_RP.

While embodiments of the inventive subject matter have been particularly shown and described with reference to exemplary embodiments thereof, it will be understood that various changes in form and details may be made therein without departing from the spirit and scope of the following claims.

That which is claimed:

1. An information storage device, comprising:
a first portion comprising a first at least one magnetic track, each of the at least one magnetic track in the first portion comprising a first plurality of magnetic domains and being configured to store a first type of data therein; and
a second portion comprising a second at least one magnetic track, each of the at least one magnetic track in the second portion comprising a second plurality of magnetic domains and being configured to store a second type of data therein, the second type of data being related to the first type of data;
wherein the second type of data comprises memory address information of the first type of data.

2. The information storage device of claim 1, wherein each of the first at least one magnetic track in the first portion comprises a first at least one write/read unit coupled thereto and each of the second at least one magnetic track in the second portion comprises a second at least one write/read unit coupled thereto, the information storage device further comprising a write/read controller that is operable to read data from the first and second pluralities of magnetic domains and to write data to the first and second pluralities of magnetic domains via the first at least one write/read unit coupled to the first portion and the first second at least one write/read unit coupled to the second portion.

3. The information storage device of claim 1, further comprising:
a domain controller that is operable to move respective ones of the first plurality of magnetic domains and respective ones of the second plurality of magnetic domains.

4. The information storage device of claim 3, wherein the first at least one write/read unit coupled to the first portion is coupled to the write/read controller via at first at least one control transistor, respectively;
wherein the second at least one write/read unit coupled to the second portion is coupled to the write/read controller via a second at least one control transistor, respectively;
wherein the first at least one magnetic track is coupled to the domain controller via a first at least one selection transistor, respectively; and
wherein the second at least one magnetic track is coupled to the domain controller via a second at least one selection transistor, respectively.

5. The information storage device of claim 3, wherein the write/read controller is operable to write and/or read data to and/or from ones of the first plurality of magnetic domains coupled to the first at least one magnetic track, respectively, responsive to determining that an address matches address data stored in ones of the second plurality of magnetic domains coupled to the second at least one magnetic track, respectively;
the ones of the first plurality of magnetic domains and the ones of the second plurality of magnetic domains being associated with each other as a sector.

6. The information storage device of claim 3, further comprising:
a third portion comprising a third at least one magnetic track, each of the at least one magnetic track in the third portion comprising a third plurality of magnetic domains and being configured to store a third type of data therein, the third type of data corresponding to the first type of data such that at least one of the third plurality of magnetic domains is operable to substitute for at least one of the first plurality of magnetic domains responsive to a determination that the at least one of the first plurality of magnetic domains is defective.

7. The information storage device of claim 3, wherein the first and second types of data comprise at least one type of sink pattern, the information storage device further comprising:
a location detection unit that is operable to detect the at least one type of sink pattern.

8. The information storage device of claim 1, wherein the information storage device comprises a plurality of memory blocks and wherein the at least one magnetic track in the first portion and the at least one magnetic track in the second portion are associated with each other in one of the plurality of memory blocks, the information storage device further comprising:
a block selection controller that is operable to select the one of the plurality of memory blocks from the plurality of memory blocks.

9. The information storage device of claim 1, wherein the memory system is embodied in a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, or a Universal Serial Bus (USB) flash drive device.

10. An information storage device, comprising:
a memory unit comprising at least one pair of magnetic tracks, each of the magnetic tracks in the at least one pair of magnetic tracks comprising a plurality of magnetic domains; and
a plurality of write/read units coupled to the magnetic tracks and configured to write data to and read data from the magnetic tracks, respectively, responsive to first and second address information;
wherein the first address information comprises write/read unit identification information and the second address information comprises magnetic domain identification information.

11. The information storage device of claim 10, further comprising:
decoding circuitry coupled to the memory unit that is operable to select at least one magnetic domain pair associated with the at least one pair of magnetic tracks, respectively;

a write/read controller that is operable to read data from the plurality of magnetic domains via the write/read unit units; and a domain controller that is coupled to the memory unit and is operable to move the plurality of magnetic domains on each of the magnetic tracks.

12. The information storage device of claim 11, wherein each of the at least one pair of magnetic tracks is coupled to the decoding circuitry via a pair of control transistors.

13. The information storage device of claim 12, wherein the pair of control transistors are coupled to each other at a reference node; and wherein the information storage device further comprises:
a switch controller that is operable to drive the reference node to a reference voltage level based on which of a write and a read operation is being performed.

14. The information storage device of claim 12, wherein each of the at least one pair of magnetic tracks are coupled to each other at a reference node; and wherein the information storage device further comprises:
a switch controller that is operable to drive the reference node to a reference voltage level based on which of a write and a read operation is being performed.

15. The information storage device of claim 12, wherein each of the at least one pair of magnetic tracks are coupled to the domain controller via a first pair of selection transistors disposed at a first end of the at least one pair of magnetic tracks and a second pair of selection transistors disposed at a second end of the at least one pair of magnetic tracks.

16. The information storage device of claim 12, wherein each of the at least one pair of magnetic tracks are coupled to the domain controller via a first selection transistor disposed at a first end of the at least one pair of magnetic tracks and a second selection transistor disposed at a second end of the at least one pair of magnetic tracks.

17. The information storage device of claim 10, wherein the memory system is embodied in a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, or a Universal Serial Bus (USB) flash drive device.

18. An integrated circuit memory device, comprising:
a memory unit comprising at least one magnetic track, each of the at least one magnetic track comprising a plurality of magnetic domains and n write/read units coupled thereto;
decoding circuitry coupled to the memory unit that is operable to select at least one of the plurality of magnetic domains;
a write/read controller coupled to the memory unit that is operable to read data from the plurality of magnetic domains and write data to the magnetic domains via the at least one write/read unit coupled thereto coupled to the at least one magnetic track, respectively;
wherein each of the n write/read units is operable to perform a write and/or read operation on one of a subset m magnetic domains of the plurality of magnetic domains responsive to first and second address information;
wherein the first address information comprises write/read unit identification information and the second address information comprises magnetic domain identification information; and
wherein n and m are integers greater than one.

19. The integrated circuit memory device of claim 18, wherein a first portion of the m magnetic domains store a first type of data therein and a second portion of the m magnetic domains store a second type of data therein.

20. The integrated circuit memory device of claim 19, wherein the first portion of the m magnetic domains are closer to one of the n write/read units that is operable to write data to and read data from the m magnetic domains than the second portion of the m magnetic domains.

21. The integrated circuit memory device of claim 20, wherein the first type of data comprises high processing speed data relative to the second type of data.

22. The integrated circuit memory device of claim 18, wherein each of the n write/read units is coupled to the decoding circuitry via a single control transistor.

23. The integrated circuit memory device of claim 18, wherein each of the n write/read units is coupled to the decoding circuitry via a pair of control transistors.

24. The information storage device of claim 18, wherein the memory system is embodied in a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device; Secure Digital (SD) device, memory stick device, Hard Disk Drive (HDD) device, Hybrid Hard Drive (HHD) device, or a Universal Serial Bus (USB) flash drive device.

25. A method of operating an integrated circuit memory device, the integrated circuit memory device comprising a memory unit comprising a magnetic track, the magnetic track comprising a plurality of magnetic domains and a plurality of write/read units coupled thereto, the method comprising:
selecting one of the plurality of write/read units responsive to first address information;
selecting one of the plurality of magnetic domains responsive to second address information;
moving the selected one of the plurality of magnetic domains so that it is accessible via the selected one of the plurality of write/read units; and
performing one of a write and a read operation on the selected one of the magnetic domains using the selected one of the plurality of write/read units;
determining whether a subsequent write and/or read operation is to one of the plurality of magnetic domains associated with a same page as the selected one of the plurality of magnetic domains; and
moving a reference one of the plurality of magnetic domains so that it is accessible via the selected one of the plurality of write/read units when the subsequent write and/or read operation is not to one of the plurality of magnetic domains associated with the same page as the selected one of the plurality of magnetic domains.

26. The method of claim 25, wherein determining whether the subsequent write and/or read operation is to one of the plurality of magnetic domains associated with the same page comprises:
determining that the subsequent write and/or read option is to another one of the plurality of magnetic domains associated with the same page as the selected one of the plurality of magnetic domains responsive to third address information; and
moving the another one of the plurality of magnetic domains so that it is accessible via the selected one of the plurality of write/read units.

* * * * *